US009134532B2

(12) United States Patent
Brosnihan et al.

(10) Patent No.: US 9,134,532 B2
(45) Date of Patent: Sep. 15, 2015

(54) MEMS SHUTTER ASSEMBLIES FOR HIGH-RESOLUTION DISPLAYS

(71) Applicant: Pixtronix, Inc., San Diego, CA (US)

(72) Inventors: Timothy Brosnihan, Natick, MA (US); Javier Villarreal, Somerville, MA (US); Mark B. Andersson, Northborough, MA (US); Eugene Fike, Amesbury, MA (US)

(73) Assignee: Pixtronix, Inc., San Diego, CA (US)

( * ) Notice: Subject to any disclaimer, the term of this patent is extended or adjusted under 35 U.S.C. 154(b) by 112 days.

(21) Appl. No.: 13/800,491

(22) Filed: Mar. 13, 2013

(65) Prior Publication Data

US 2014/0268294 A1 Sep. 18, 2014

(51) Int. Cl.
*G02B 26/02* (2006.01)
*G03B 9/08* (2006.01)
*G03B 9/02* (2006.01)
*B81B 7/00* (2006.01)
(Continued)

(52) U.S. Cl.
CPC .............. *G02B 26/023* (2013.01); *B81B 7/008* (2013.01); *G02B 5/005* (2013.01); *G02B 26/001* (2013.01); *G02B 26/007* (2013.01); *G02B 26/02* (2013.01); *G02B 26/08* (2013.01); *G02B 26/085* (2013.01); *G02B 26/0833* (2013.01); *G02F 1/01* (2013.01); *G02F 1/29* (2013.01); *G09G 3/3466* (2013.01); *G09G 2300/04* (2013.01)

(58) Field of Classification Search
CPC .. G02B 26/02; G02B 26/0833; G02B 26/023; G02B 26/001; G02B 26/007; G02B 5/005; G02B 26/08; G02B 26/085; G09G 3/3466; G09G 2300/04; G02F 1/01; G02F 1/29
USPC ......... 359/227, 230, 231, 233–236, 290, 292, 359/295, 298; 396/452, 457, 458, 463, 469, 396/471, 502, 505, 506, 508
See application file for complete search history.

(56) References Cited

U.S. PATENT DOCUMENTS 5,062,689 A 11/1991 Koehler
6,288,824 B1 9/2001 Kastalsky
(Continued)

FOREIGN PATENT DOCUMENTS

JP H09218360 A 8/1997
JP 2002040337 A 2/2002
(Continued)

OTHER PUBLICATIONS

Partial International Search Report—PCT/US2014/020803—International Search Authority European Patent Office May 22, 2014.
(Continued)

*Primary Examiner* — Evelyn A Lester
(74) *Attorney, Agent, or Firm* — Edward A. Gordon; Foley & Lardner LLP

(57) ABSTRACT

This disclosure provides systems, methods and apparatus for generating images using dual-shutter shutter assemblies. Such shutter assemblies include two shutters that move over a common aperture to selectively obstruct the passage of light there through. In the closed position, portions of one of the shutters overlaps a portion of the other shutter to provide such light obstruction without the two shutters needing to come into contact.

10 Claims, 73 Drawing Sheets

(51) Int. Cl.
  *G02B 5/00* (2006.01)
  *G02F 1/29* (2006.01)
  *G09G 3/34* (2006.01)
  *G02B 26/00* (2006.01)
  *G02B 26/08* (2006.01)
  *G02F 1/01* (2006.01)

(56) References Cited

U.S. PATENT DOCUMENTS

| | | |
|---|---|---|
| 2006/0250676 A1 | 11/2006 | Hagood et al. |
| 2006/0256039 A1 | 11/2006 | Hagood et al. |
| 2007/0110433 A1 | 5/2007 | Masahiko |
| 2008/0158635 A1 | 7/2008 | Hagood et al. |
| 2009/0195855 A1 | 8/2009 | Steyn et al. |
| 2009/0244678 A1 | 10/2009 | Hagood, IV et al. |
| 2010/0110518 A1 | 5/2010 | Wu et al. |
| 2011/0298902 A1 | 12/2011 | Kim et al. |
| 2012/0229966 A1 | 9/2012 | Kim et al. |
| 2012/0250132 A1 | 10/2012 | Yoon et al. |
| 2012/0293852 A1 | 11/2012 | Cho et al. |
| 2012/0300279 A1 | 11/2012 | Muneyoshi et al. |
| 2012/0300283 A1 | 11/2012 | Fujiyoshi et al. |
| 2012/0307332 A1 | 12/2012 | Ando et al. |
| 2013/0050290 A1 | 2/2013 | Andersson et al. |
| 2013/0050794 A1 | 2/2013 | Yun et al. |
| 2013/0163063 A1 | 6/2013 | Cho et al. |
| 2014/0029077 A1 | 1/2014 | Mao et al. |
| 2014/0210864 A1* | 7/2014 | Villarreal et al. ............ 359/230 |
| 2014/0225904 A1 | 8/2014 | Andersson et al. |
| 2014/0266999 A1* | 9/2014 | Wu et al. ...................... 359/230 |
| 2014/0267196 A1* | 9/2014 | Villarreal et al. ............ 359/227 |
| 2014/0267331 A1* | 9/2014 | Villarreal et al. ............ 359/233 |
| 2014/0268272 A1 | 9/2014 | Brosnihan et al. |
| 2014/0268293 A1 | 9/2014 | Chleirigh et al. |
| 2014/0327948 A1* | 11/2014 | Shi et al. ..................... 359/230 |

FOREIGN PATENT DOCUMENTS

| | | |
|---|---|---|
| JP | 2005221917 A | 8/2005 |
| JP | 2010181495 A | 8/2010 |
| JP | 2010210813 A | 9/2010 |
| WO | 9910775 A1 | 3/1999 |
| WO | 2012142849 A1 | 10/2012 |

OTHER PUBLICATIONS

International Search Report and Written Opinion—PCT/US2014/020803—ISA/EPO—Aug. 13, 2014.

* cited by examiner

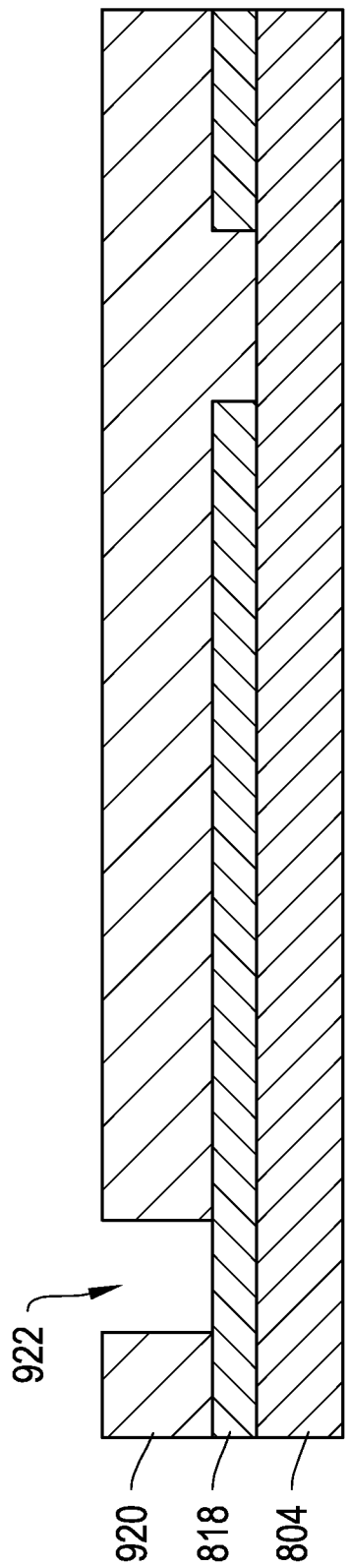
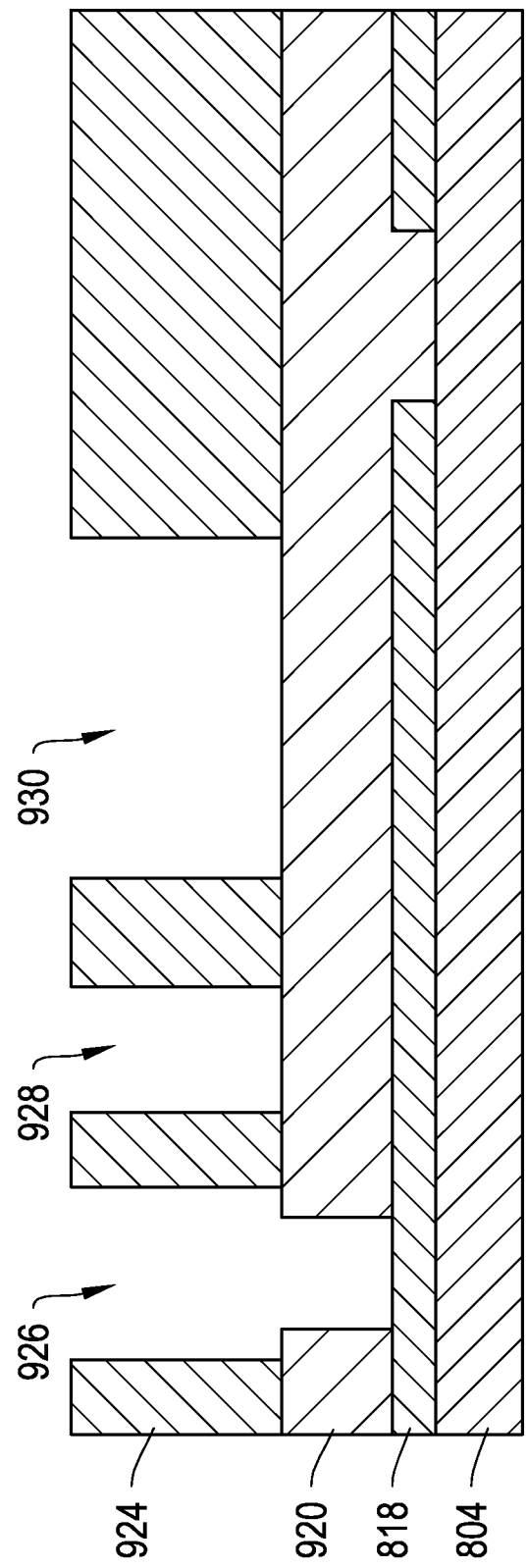

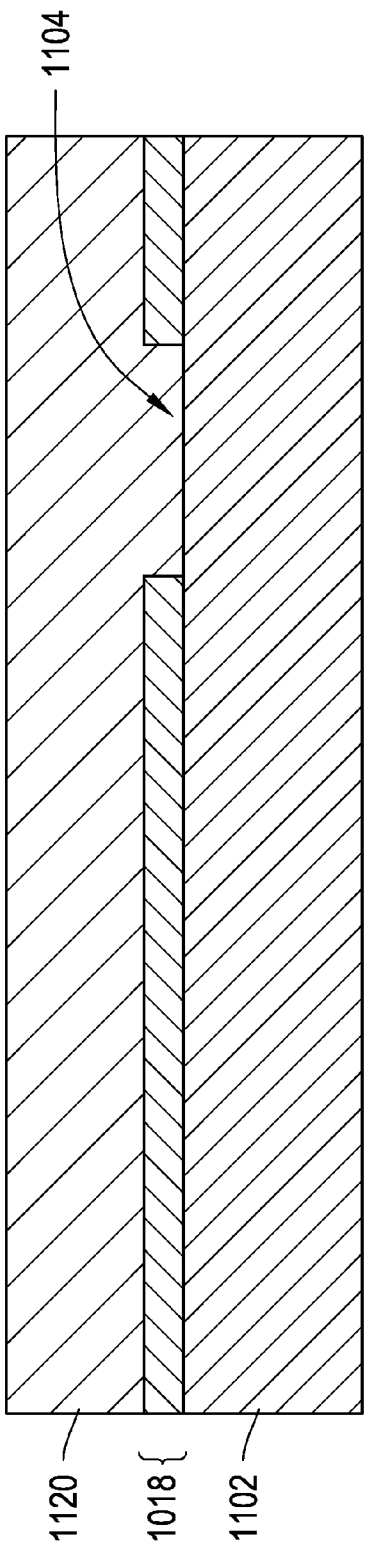
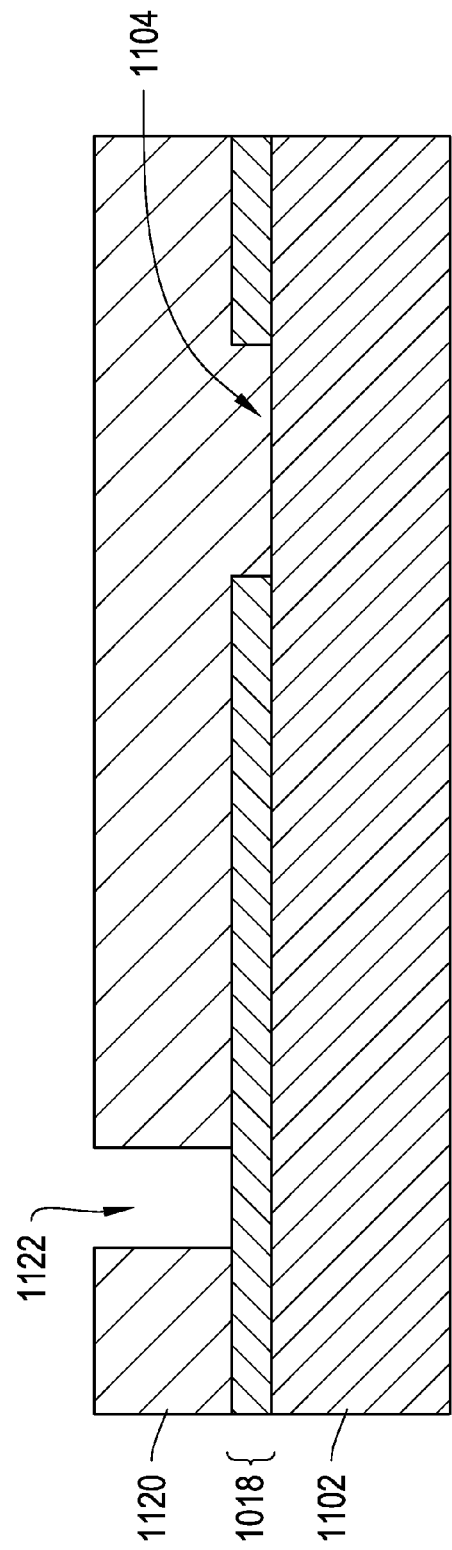
FIGURE 11A
FIGURE 11B

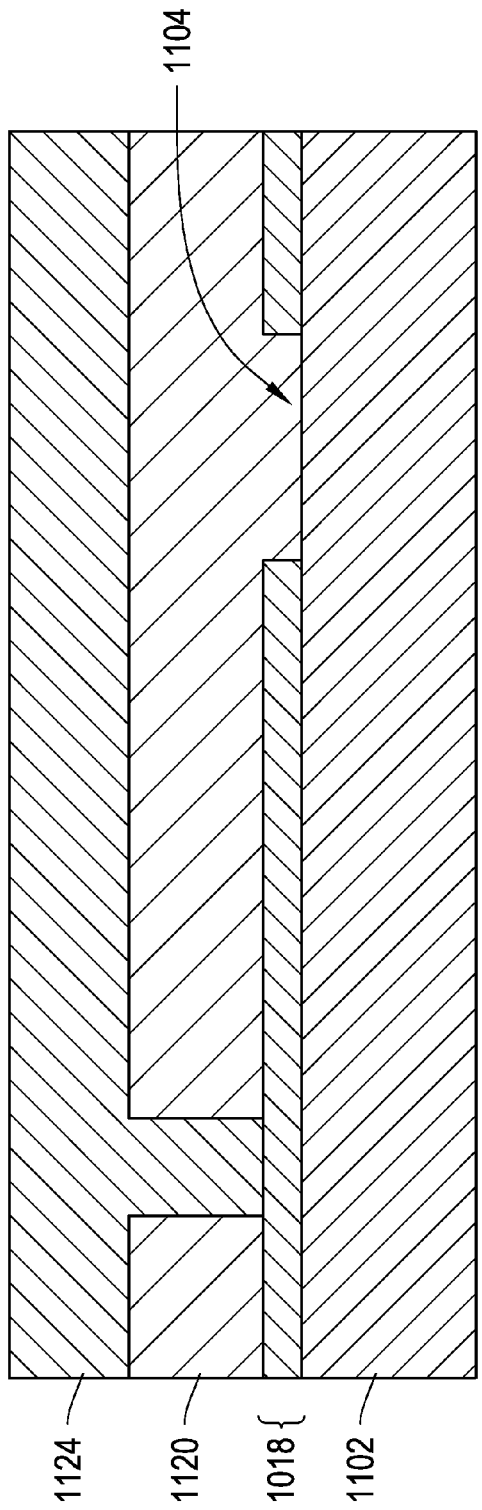
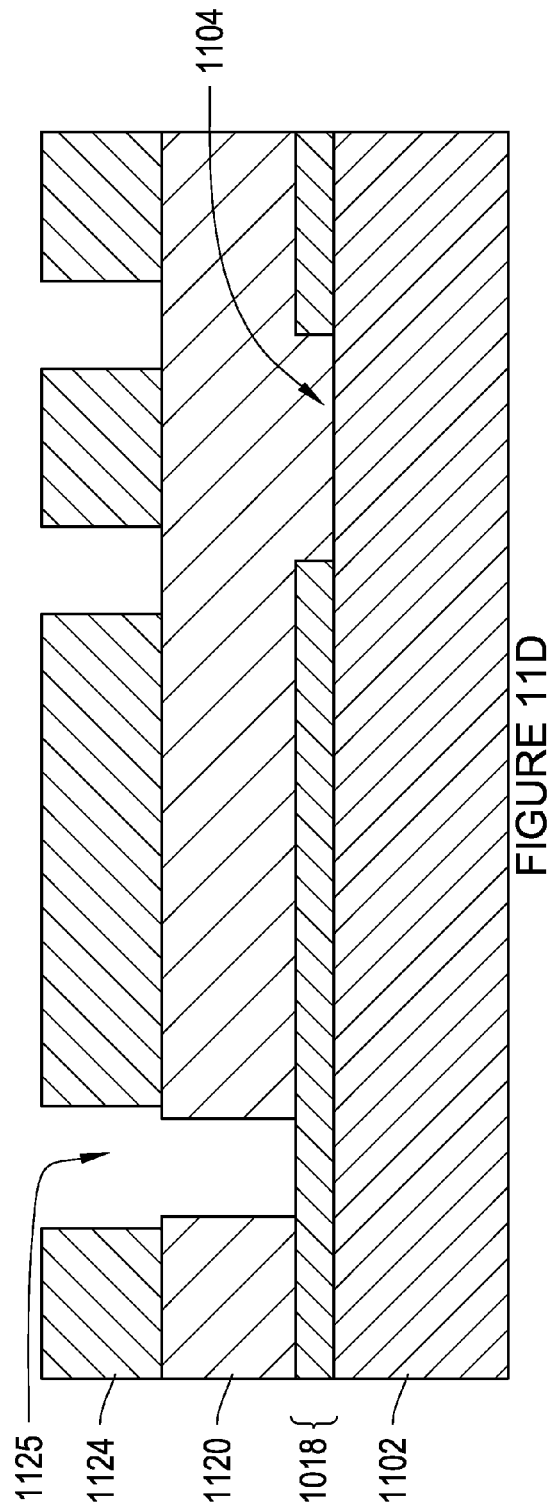
FIGURE 11C
FIGURE 11D

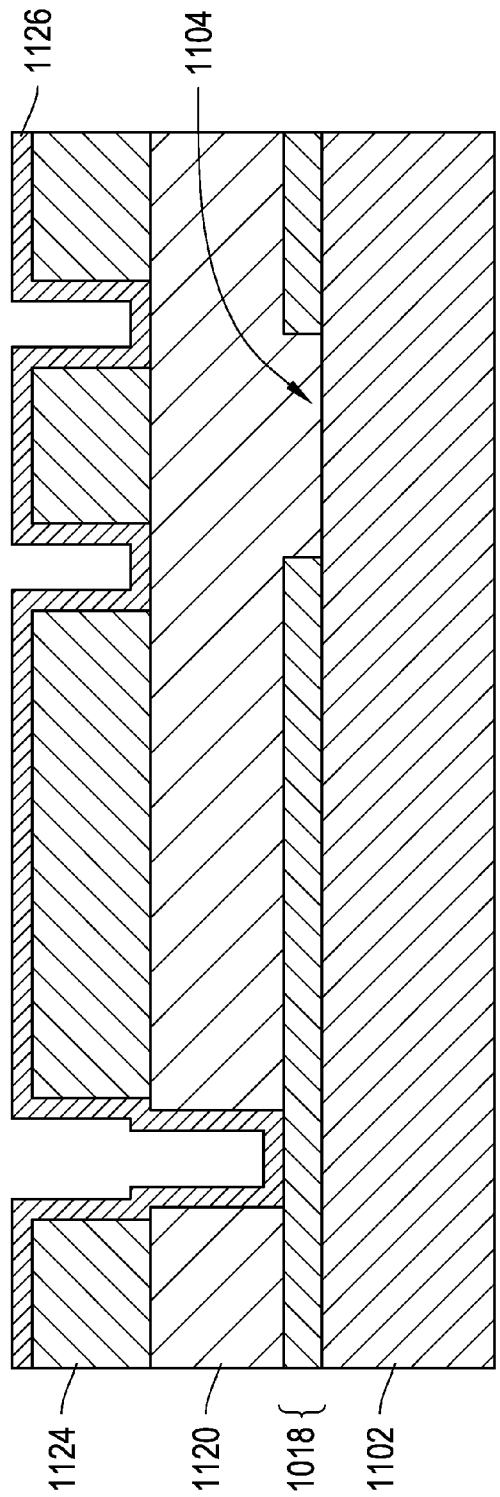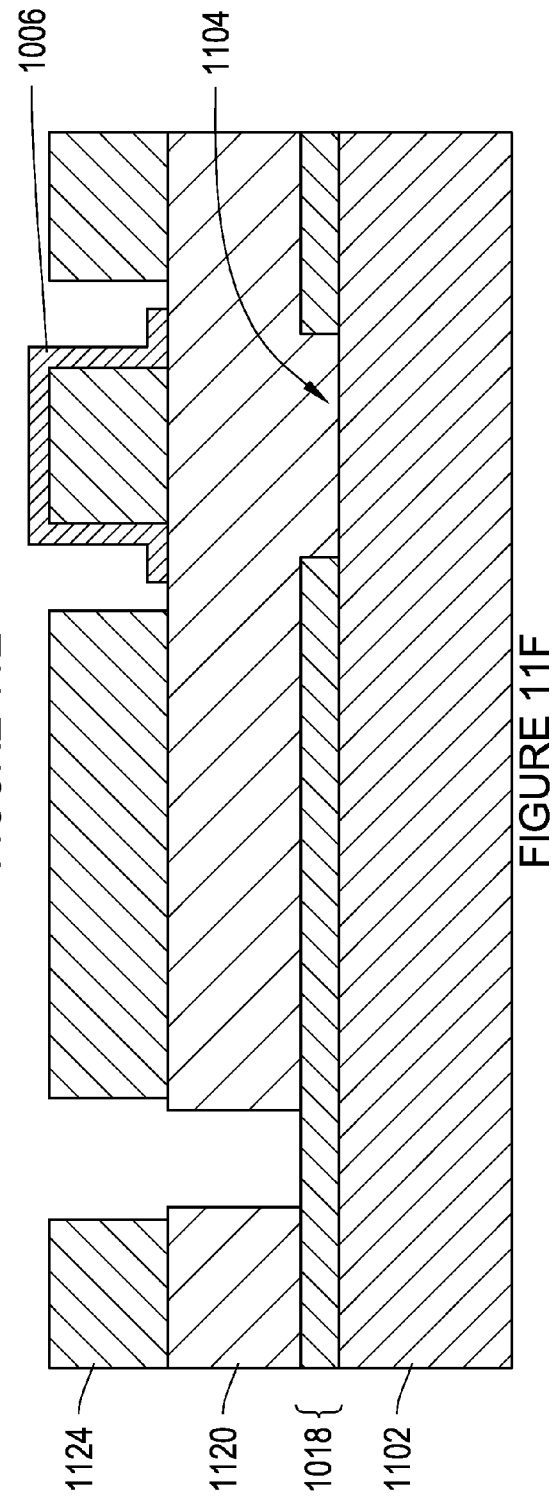

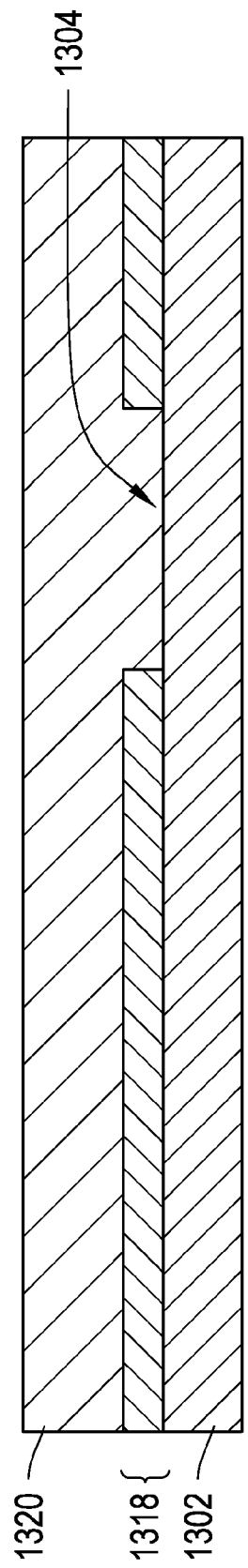
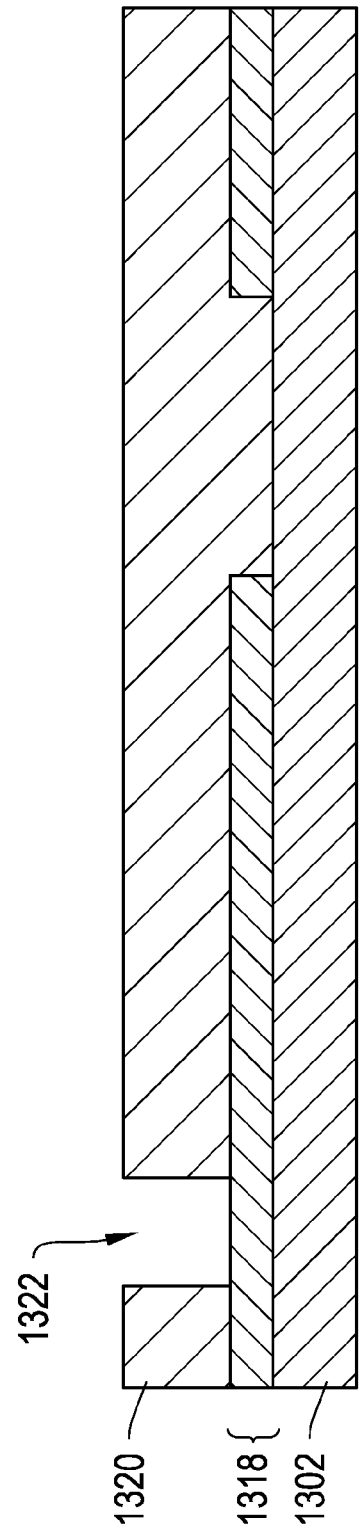

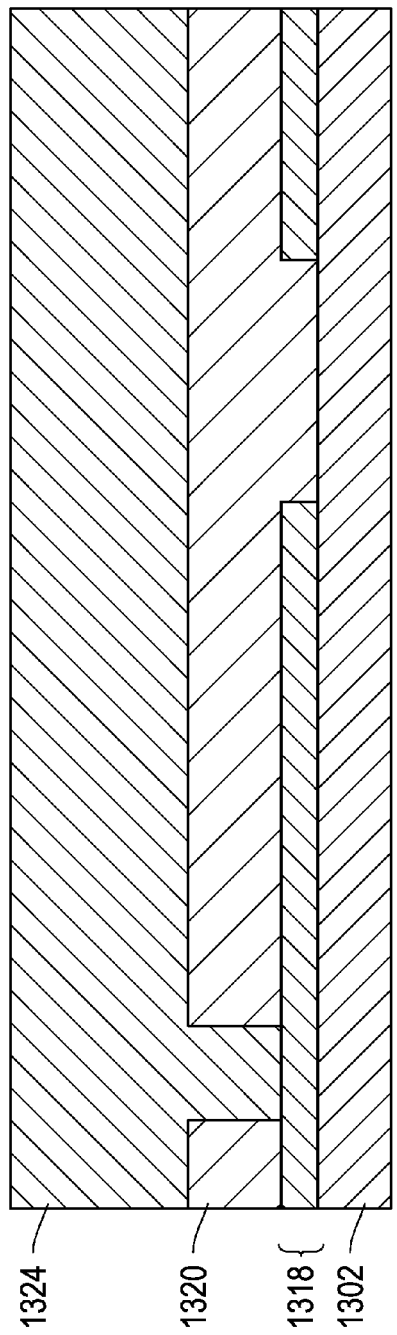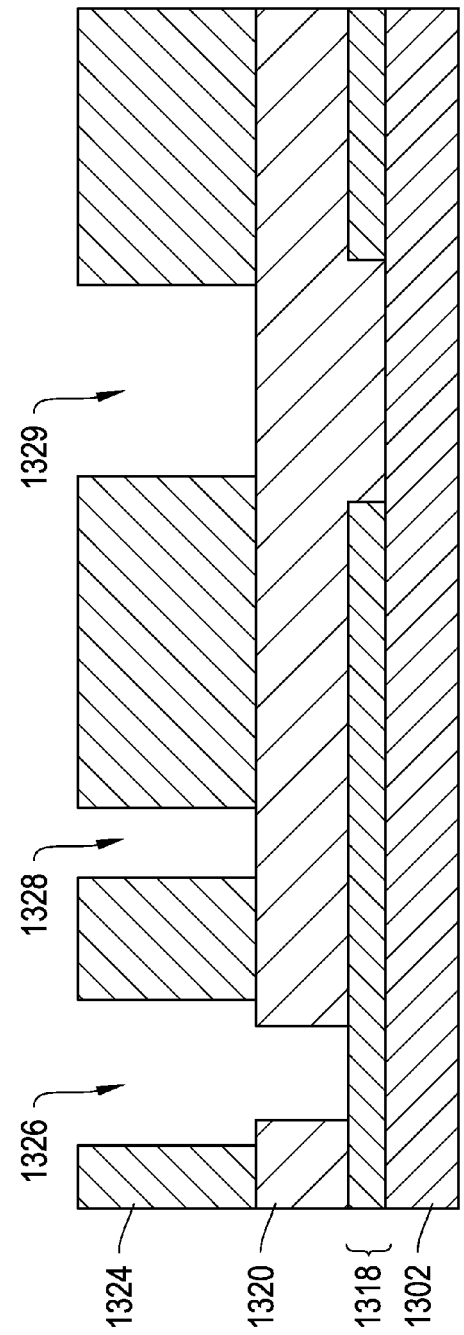

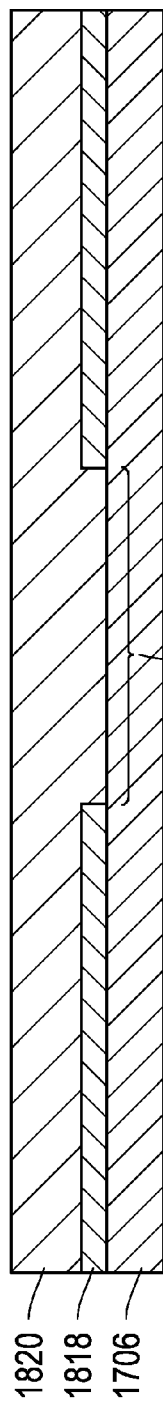
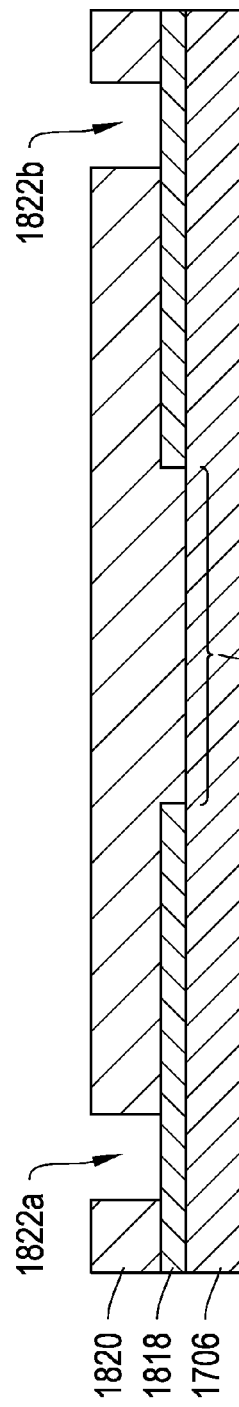
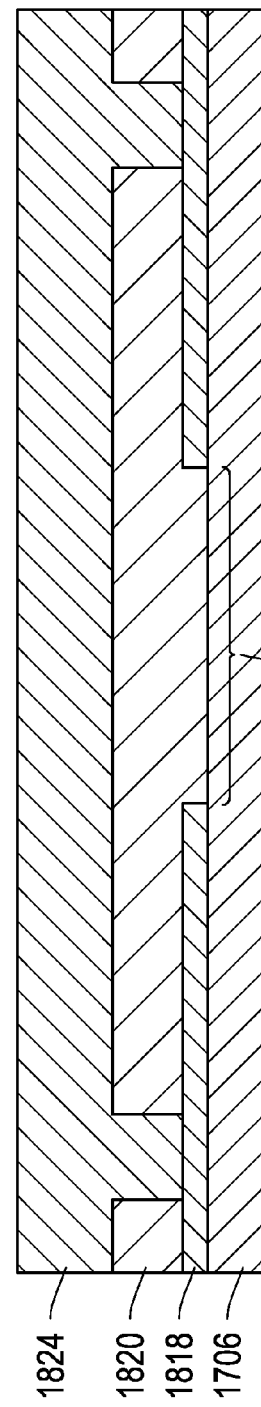
FIGURE 18A
FIGURE 18B
FIGURE 18C

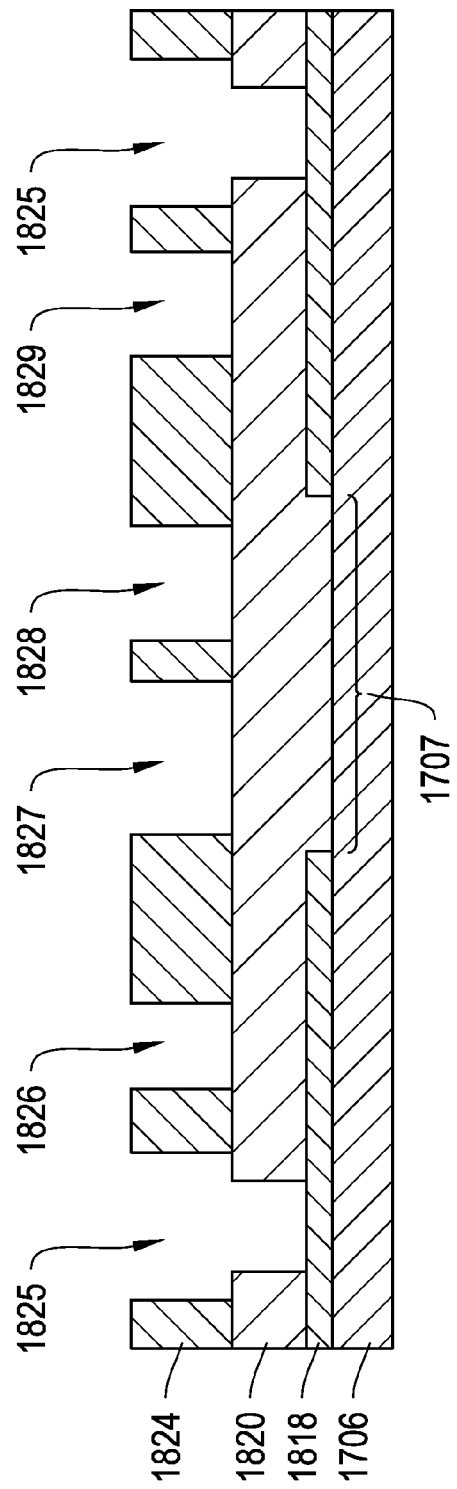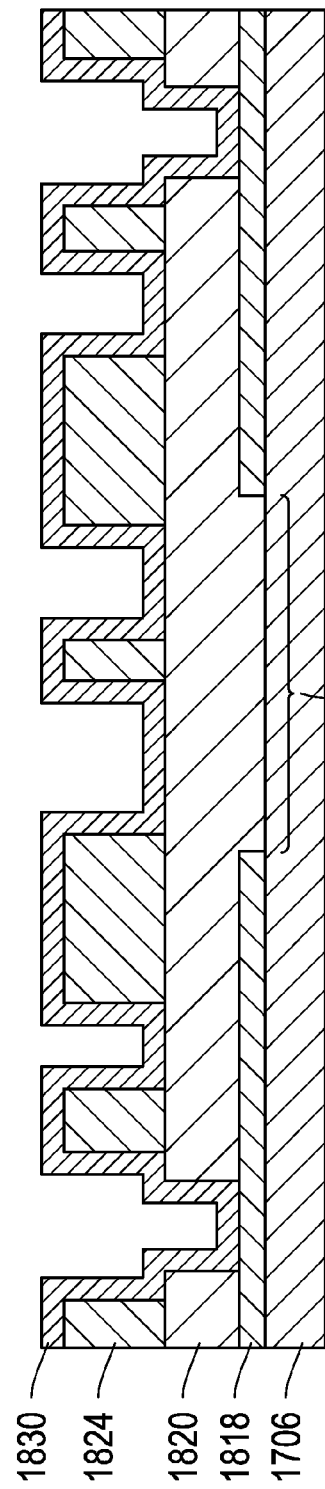

MEMS SHUTTER ASSEMBLIES FOR HIGH-RESOLUTION DISPLAYS

TECHNICAL FIELD

This disclosure relates to electromechanical systems (EMS). In particular, this disclosure relates to EMS shutter designs.

DESCRIPTION OF THE RELATED TECHNOLOGY

Display elements incorporating light blocking shutters have proven successful at modulating light to form images. However, the resolution available using such shutters is limited in part by the space taken up the actuators that move the shutters. In particular, in some laterally actuated shutters, the actuators that move the shutter are fabricated between the shutter and anchors that support the actuator and shutter. During actuation, the entirety of the actuator remains between the shutter and the anchors.

Shutter-based display elements formed from two opposing shutters that together selectively obstruct a common aperture, have also been proposed. However, such shutter configurations pose an increased risk of stiction between the shutters if they contact one another in the closed state. On the other hand, if they do not make contact in the closed position, such shutter configurations can suffer from a decreased contrast ratio resulting from light passing between the shutters.

SUMMARY

The systems, methods and devices of the disclosure each have several innovative aspects, no single one of which is solely responsible for the desirable attributes disclosed herein.

One innovative aspect of the subject matter described in this disclosure can be implemented in an apparatus that includes a first light obstructing component and a second light obstructing component. The first light obstructing component is configured to be moved with respect to an aperture to selectively obstruct passage of light through the aperture. The second light obstructing component is configured to be moved with respect to the same aperture as the first light blocking component to selectively obstruct the passage of light through the aperture. When both the first and second light obstructing components are in a closed position, the first and second light obstructing components together block substantially all of the light passing through the aperture, and a first portion of the first light obstructing component extends over a first portion of the second light blocking component and substantially abuts a second portion of the second light blocking component.

In some implementations, the apparatus also includes a first actuator configured to selectively move the first light blocking component into a first open position and a second actuator configured to selectively move the second light blocking component into a second open position. In some such implementations, the apparatus includes a third actuator positioned between the first and second light blocking components. The third actuator can be configured to selectively move at least one of the first and second light blocking components into the closed position. In some implementations, portions of the first and second light blocking components form opposing electrodes of the third actuator. When a potential difference is applied across the first and second light blocking components, the first and second light blocking components are drawn together into the closed position. In some other implementations, the first and second actuators are configured to operate independently of one another.

In some implementations, the first and second light blocking components include light blocking portions that extend over at least parts of their respective actuators when the first and second light blocking components are in their respective open positions.

In some implementations, each of the first and second light blocking components includes a proximal light blocking level and a distal light blocking level. In some such implementations, the portion of the first light blocking component that extends over the first portion of the second light blocking component is a portion of the distal light blocking level of the first light blocking component, the first portion of the second light blocking component is a portion of the proximal light blocking level of the second light blocking component, and the second portion of the second light blocking component is a portion of the distal light blocking level of the second light blocking component.

In some implementations, the apparatus includes a display that includes the EMS display element, a processor, and a memory device. The processor is configured to communicate with the display and to process image data. The memory device is configured to communicate with the processor. In some implementations, the apparatus includes a driver circuit configured to send at least one signal to the display. In some such implementations, the processor is further configured to send at least a portion of the image data to the driver circuit. In some other applications, the apparatus includes an image source module configured to send the image data to the processor, and the image source module includes at least one of a receiver, transceiver, and a transmitter. In some other implementations, the apparatus also includes an input device configured to receive input data and to communicate the input data to the processor.

innovative aspect of the subject matter described in this disclosure can be implemented in a method of manufacturing a display element. The method includes defining an aperture in a light blocking layer deposited on a substrate and forming, over the light blocking layer, a first sacrificial mold shaped for the fabrication of a proximal level of first shutter and a proximal level of a second shutter. Each shutter is configured for lateral movement with respect to the aperture. The method also includes depositing a first layer of structural material over the first sacrificial mold and patterning the layer of structural material to define the proximal levels of the first and second shutters. A second sacrificial mold shaped for the fabrication of a distal level of the first shutter and a distal level a mold for a display element shutter is then formed over the proximal levels of the first and second shutters. The method also includes depositing a second layer of structural material over the second sacrificial mold and patterning the second layer of structural material to define the distal levels of the first and second shutters. The distal levels can be defined such that when both the first and second shutters are in a closed position, the first and second shutters together block substantially all of the light passing through the aperture, and a portion of the distal level of the first shutter extends over the proximal level of the second shutter and substantially abuts a portion of the distal level of second shutter.

In some implementations, the first sacrificial mold is further shaped for the fabrication of a first actuator configured to selectively move the first shutter into a first open position and a second actuator configured to selectively move the second shutter into a second open position. In some implementations, the first sacrificial mold is further shaped for the fabrication of a third actuator positioned between the first and second shutters. The third actuator can be configured to selectively move at least one of the first and second shutters into the closed position. In some other implementations, portions of the first and second shutters form opposing electrodes of a third actuator, such that when a potential difference is applied across the first and second shutters, the first and second shutters are drawn together into the closed position.

In some implementations, patterning the second layer of structural material includes defining the distal levels of the first and second shutters to include light blocking portions that extend over at least parts of first and second actuators when the first and second shutters are in their respective open positions. In some other implementations, patterning the second layer of structural material includes defining the distal levels of the first and second shutters to each include inner and outer light blocking portion. In some implementations, the light blocking portion of the distal level of the first shutter is defined to be substantially larger than the inner light blocking portion of the distal level of the second shutter.

Details of one or more implementations of the subject matter described in this specification are set forth in the accompanying drawings and the description below. Although the examples provided in this summary are primarily described in terms of MEMS-based displays, the concepts provided herein may apply to other types of displays, such as liquid crystal displays (LCD), organic light emitting diode (OLED) displays, electrophoretic displays, and field emission displays, as well as to other non-display MEMS devices, such as MEMS microphones, sensors, and optical switches. Other features, aspects, and advantages will become apparent from the description, the drawings, and the claims. Note that the relative dimensions of the following figures may not be drawn to scale.

BRIEF DESCRIPTION OF THE DRAWINGS

FIGS. 9A-9L show cross sectional views of example stages of fabrication of the shutter assembly shown in FIGS. 8A-8D.

FIGS. 11A-11K show cross sectional views of example stages of fabrication of the shutter assembly shown in FIGS. 10A-10D.

FIGS. 13A-13F show cross sectional views of example stages of fabrication of the shutter assembly shown in FIGS. 11A-11C.

FIGS. 18A-18I show cross sectional views of example stages of fabrication of the shutter assembly shown in FIGS. 17A and 17B.

Like reference numbers and designations in the various drawings indicate like elements.

DETAILED DESCRIPTION

Figure 1A:
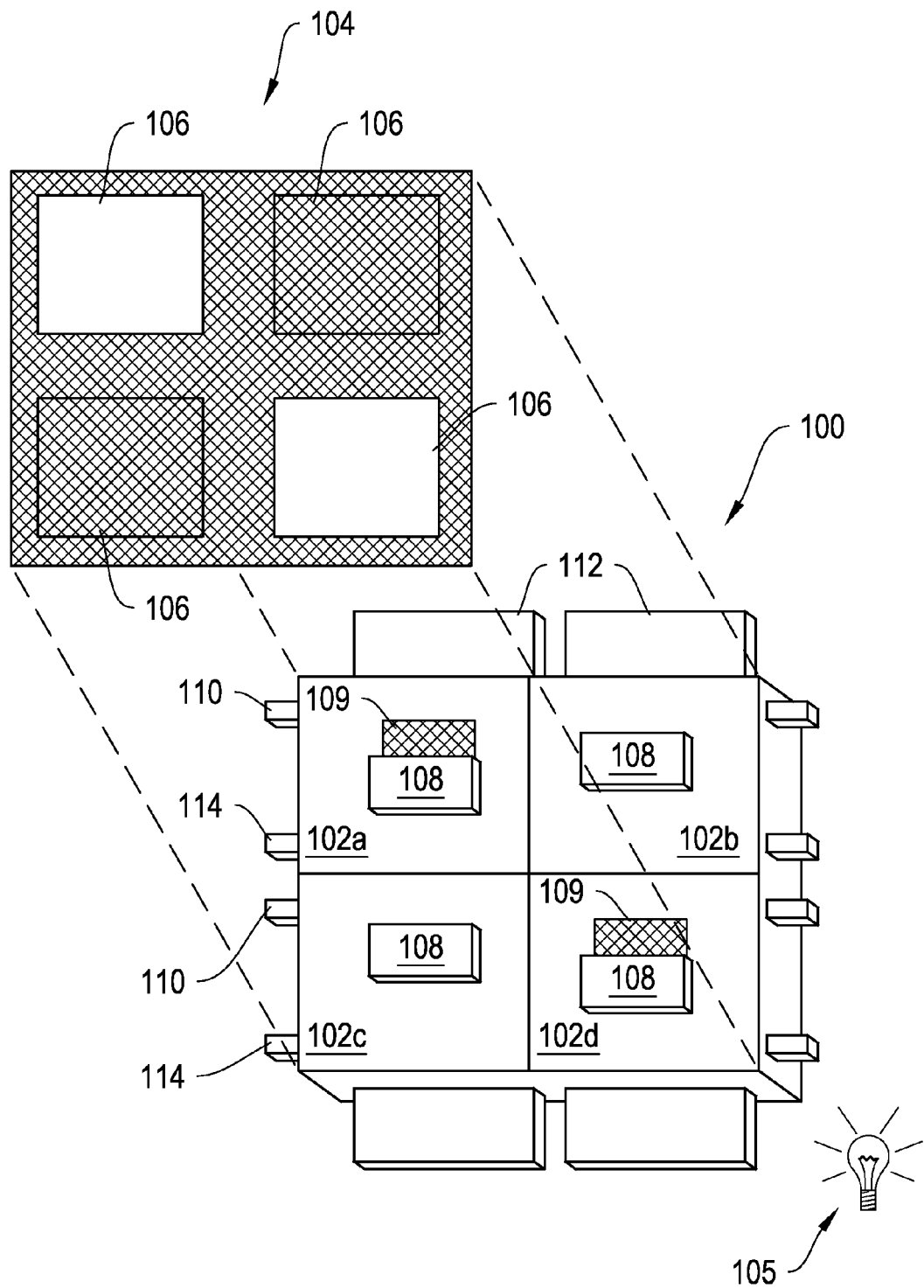
FIG. 1A shows a schematic diagram of an example direct-view MEMS-based display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (such as e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Shutter based display elements that include electrostatic actuators can be fabricated using less space if they are formed such that the portion of the actuator that connects to the shutter does so above or below the shutter. With such configurations, during actuation, the actuator can move portions of the shutter over or below at least a portion of the actuator. As a result, the total area needed for building the shutter and actuator can be reduced.

Particular implementations of the subject matter described in this disclosure can be implemented to realize one or more of the following potential advantages. In particular, forming shutters that are able to pass over or under portions of the actuators that control their position enables more compact shutter assemblies. This in turn allows for the formation of displays with a larger number of pixels-per-inch (PPI) and better image resolution.

In some implementations, a shutter can be fabricated such that a portion of the shutters serves as portions of an electrostatic actuator, directly opposing a drive electrode. Such a configuration obviates the need for a separate load electrode positioned between the shutter and the drive electrode. This also reduces the space needed to form a shutter assembly and enables higher PPI.

FIG. 1A shows a schematic diagram of an example direct-view MEMS-based display apparatus 100. The display apparatus 100 includes a plurality of light modulators 102a-102d (generally "light modulators 102") arranged in rows and columns. In the display apparatus 100, the light modulators 102a and 102d are in the open state, allowing light to pass. The light modulators 102b and 102c are in the closed state, obstructing the passage of light. By selectively setting the states of the light modulators 102a-102d, the display apparatus 100 can be utilized to form an image 104 for a backlit display, if illuminated by a lamp or lamps 105. In another implementation, the apparatus 100 may form an image by reflection of ambient light originating from the front of the apparatus. In another implementation, the apparatus 100 may form an image by reflection of light from a lamp or lamps positioned in the front of the display, i.e., by use of a front light.

In some implementations, each light modulator 102 corresponds to a pixel 106 in the image 104. In some other implementations, the display apparatus 100 may utilize a plurality of light modulators to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In another example, the display apparatus 100 includes two or more light modulators 102 per pixel 106 to provide luminance level in an image 104. With respect to an image, a "pixel" corresponds to the smallest picture element defined by the resolution of image. With respect to structural components of the display apparatus 100, the term "pixel" refers to the combined mechanical and electrical components utilized to modulate the light that forms a single pixel of the image.

The display apparatus 100 is a direct-view display in that it may not include imaging optics typically found in projection applications. In a projection display, the image formed on the surface of the display apparatus is projected onto a screen or onto a wall. The display apparatus is substantially smaller than the projected image. In a direct view display, the user sees the image by looking directly at the display apparatus, which contains the light modulators and optionally a backlight or front light for enhancing brightness and/or contrast seen on the display.

Direct-view displays may operate in either a transmissive or reflective mode. In a transmissive display, the light modulators filter or selectively block light which originates from a lamp or lamps positioned behind the display. The light from the lamps is optionally injected into a lightguide or "backlight" so that each pixel can be uniformly illuminated. Transmissive direct-view displays are often built onto transparent or glass substrates to facilitate a sandwich assembly arrangement where one substrate, containing the light modulators, is positioned directly on top of the backlight.

Each light modulator 102 can include a shutter 108 and an aperture 109. To illuminate a pixel 106 in the image 104, the shutter 108 is positioned such that it allows light to pass through the aperture 109 towards a viewer. To keep a pixel 106 unlit, the shutter 108 is positioned such that it obstructs the passage of light through the aperture 109. The aperture 109 is defined by an opening patterned through a reflective or light-absorbing material in each light modulator 102.

The display apparatus also includes a control matrix connected to the substrate and to the light modulators for controlling the movement of the shutters. The control matrix includes a series of electrical interconnects (e.g., interconnects 110, 112 and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, VWE"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In some other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108.

Figure 1B:
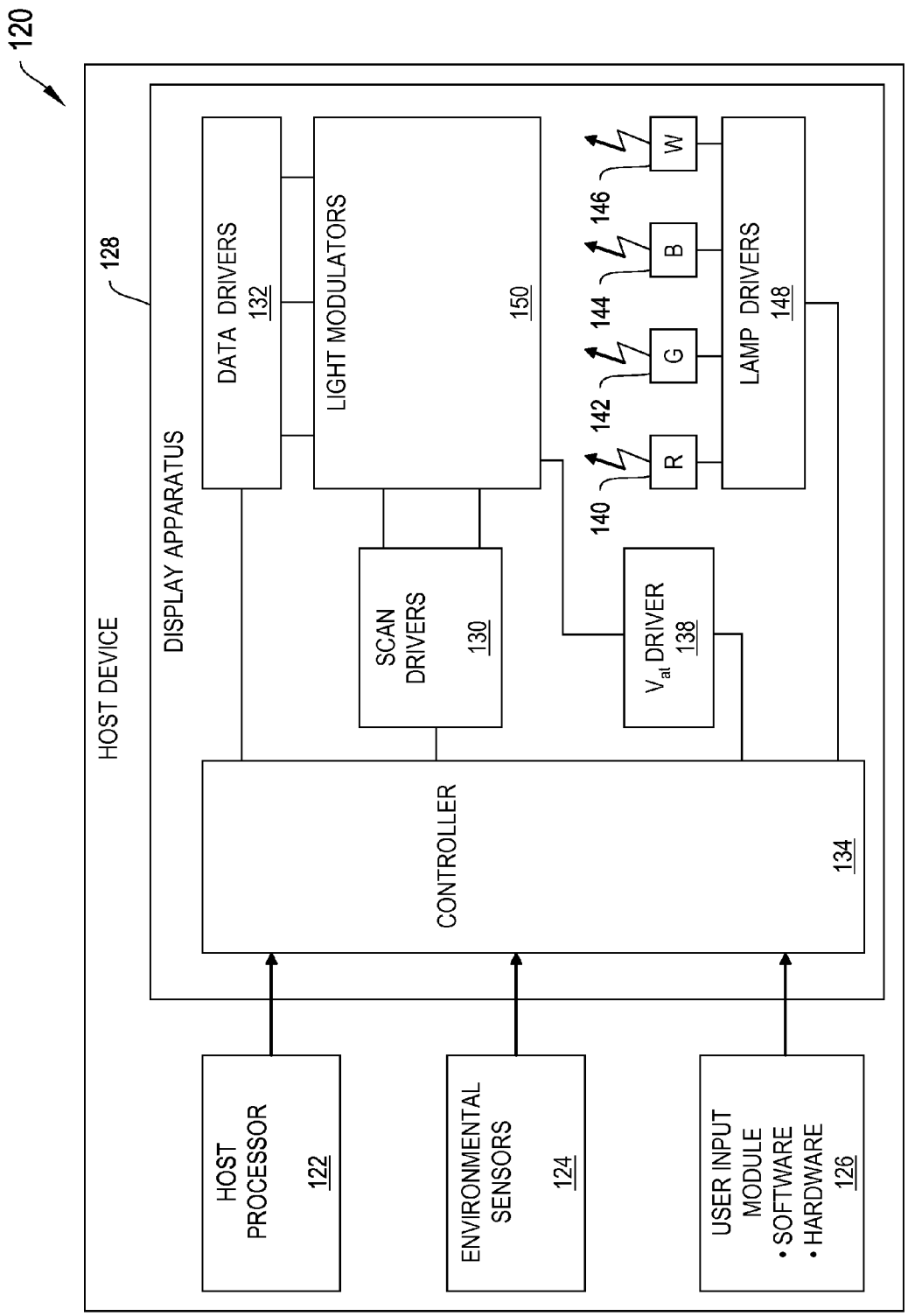
FIG. 1B shows a block diagram of an example host device.

FIG. 1B shows a block diagram of an example host device 120 (i.e., cell phone, smart phone, PDA, MP3 player, tablet, e-reader, netbook, notebook, etc.). The host device 120 includes a display apparatus 128, a host processor 122, environmental sensors 124, a user input module 126, and a power source.

The display apparatus 128 includes a plurality of scan drivers 130 (also referred to as "write enabling voltage sources"), a plurality of data drivers 132 (also referred to as "data voltage sources"), a controller 134, common drivers 138, lamps 140-146, lamp drivers 148 and an array 150 of display elements, such as the light modulators 102 shown in FIG. 1A. The scan drivers 130 apply write enabling voltages to scan-line interconnects 110. The data drivers 132 apply data voltages to the data interconnects 112.

In some implementations of the display apparatus, the data drivers 132 are configured to provide analog data voltages to the array 150 of display elements, especially where the luminance level of the image 104 is to be derived in analog fashion. In analog operation, the light modulators 102 are designed such that when a range of intermediate voltages is applied through the data interconnects 112, there results a range of intermediate open states in the shutters 108 and therefore a range of intermediate illumination states or luminance levels in the image 104. In other cases, the data drivers 132 are configured to apply only a reduced set of 2, 3 or 4 digital voltage levels to the data interconnects 112. These voltage levels are designed to set, in digital fashion, an open state, a closed state, or other discrete state to each of the shutters 108.

The scan drivers 130 and the data drivers 132 are connected to a digital controller circuit 134 (also referred to as the "controller 134"). The controller sends data to the data drivers 132 in a mostly serial fashion, organized in predetermined sequences grouped by rows and by image frames. The data drivers 132 can include series to parallel data converters, level shifting, and for some applications digital to analog voltage converters.

The display apparatus optionally includes a set of common drivers 138, also referred to as common voltage sources. In some implementations, the common drivers 138 provide a DC common potential to all display elements within the array 150 of display elements, for instance by supplying voltage to a series of common interconnects 114. In some other implementations, the common drivers 138, following commands from the controller 134, issue voltage pulses or signals to the array 150 of display elements, for instance global actuation pulses which are capable of driving and/or initiating simultaneous actuation of all display elements in multiple rows and columns of the array 150.

All of the drivers (e.g., scan drivers 130, data drivers 132 and common drivers 138) for different display functions are time-synchronized by the controller 134. Timing commands from the controller coordinate the illumination of red, green and blue and white lamps (140, 142, 144 and 146 respectively) via lamp drivers 148, the write-enabling and sequencing of specific rows within the array 150 of display elements, the output of voltages from the data drivers 132, and the output of voltages that provide for display element actuation. In some implementations, the lamps are light emitting diodes (LEDs).

The controller 134 determines the sequencing or addressing scheme by which each of the shutters 108 can be re-set to the illumination levels appropriate to a new image 104. New images 104 can be set at periodic intervals. For instance, for video displays, the color images 104 or frames of video are refreshed at frequencies ranging from 10 to 300 Hertz (Hz). In some implementations the setting of an image frame to the array 150 is synchronized with the illumination of the lamps 140, 142, 144 and 146 such that alternate image frames are illuminated with an alternating series of colors, such as red, green, and blue. The image frames for each respective color is referred to as a color subframe. In this method, referred to as the field sequential color method, if the color subframes are alternated at frequencies in excess of 20 Hz, the human brain will average the alternating frame images into the perception of an image having a broad and continuous range of colors. In alternate implementations, four or more lamps with primary colors can be employed in display apparatus 100, employing primaries other than red, green, and blue.

In some implementations, where the display apparatus 100 is designed for the digital switching of shutters 108 between open and closed states, the controller 134 forms an image by the method of time division gray scale, as previously described. In some other implementations, the display apparatus 100 can provide gray scale through the use of multiple shutters 108 per pixel.

In some implementations, the data for an image state 104 is loaded by the controller 134 to the display element array 150 by a sequential addressing of individual rows, also referred to as scan lines. For each row or scan line in the sequence, the scan driver 130 applies a write-enable voltage to the write enable interconnect 110 for that row of the array 150, and subsequently the data driver 132 supplies data voltages, corresponding to desired shutter states, for each column in the selected row. This process repeats until data has been loaded for all rows in the array 150. In some implementations, the sequence of selected rows for data loading is linear, proceeding from top to bottom in the array 150. In some other implementations, the sequence of selected rows is pseudo-randomized, in order to minimize visual artifacts. And in some other implementations the sequencing is organized by blocks, where, for a block, the data for only a certain fraction of the image state 104 is loaded to the array 150, for instance by addressing only every 5th row of the array 150 in sequence.

In some implementations, the process for loading image data to the array 150 is separated in time from the process of actuating the display elements in the array 150. In these implementations, the display element array 150 may include data memory elements for each display element in the array 150 and the control matrix may include a global actuation interconnect for carrying trigger signals, from common driver 138, to initiate simultaneous actuation of shutters 108 according to data stored in the memory elements.

In alternative implementations, the array 150 of display elements and the control matrix that controls the display elements may be arranged in configurations other than rectangular rows and columns. For example, the display elements can be arranged in hexagonal arrays or curvilinear rows and columns. In general, as used herein, the term scan-line shall refer to any plurality of display elements that share a write-enabling interconnect.

The host processor 122 generally controls the operations of the host. For example, the host processor 122 may be a general or special purpose processor for controlling a portable electronic device. With respect to the display apparatus 128, included within the host device 120, the host processor 122 outputs image data as well as additional data about the host. Such information may include data from environmental sensors, such as ambient light or temperature; information about the host, including, for example, an operating mode of the host or the amount of power remaining in the host's power source; information about the content of the image data; information about the type of image data; and/or instructions for display apparatus for use in selecting an imaging mode.

The user input module 126 conveys the personal preferences of the user to the controller 134, either directly, or via the host processor 122. In some implementations, the user input module 126 is controlled by software in which the user programs personal preferences such as "deeper color," "better contrast," "lower power," "increased brightness," "sports," "live action," or "animation." In some other implementations, these preferences are input to the host using hardware, such as a switch or dial. The plurality of data inputs to the controller 134 direct the controller to provide data to the various drivers 130, 132, 138 and 148 which correspond to optimal imaging characteristics.

An environmental sensor module 124 also can be included as part of the host device 120. The environmental sensor module 124 receives data about the ambient environment, such as temperature and or ambient lighting conditions. The sensor module 124 can be programmed to distinguish whether the device is operating in an indoor or office environment versus an outdoor environment in bright daylight versus an outdoor environment at nighttime. The sensor module 124 communicates this information to the display controller 134, so that the controller 134 can optimize the viewing conditions in response to the ambient environment.

Figure 2:
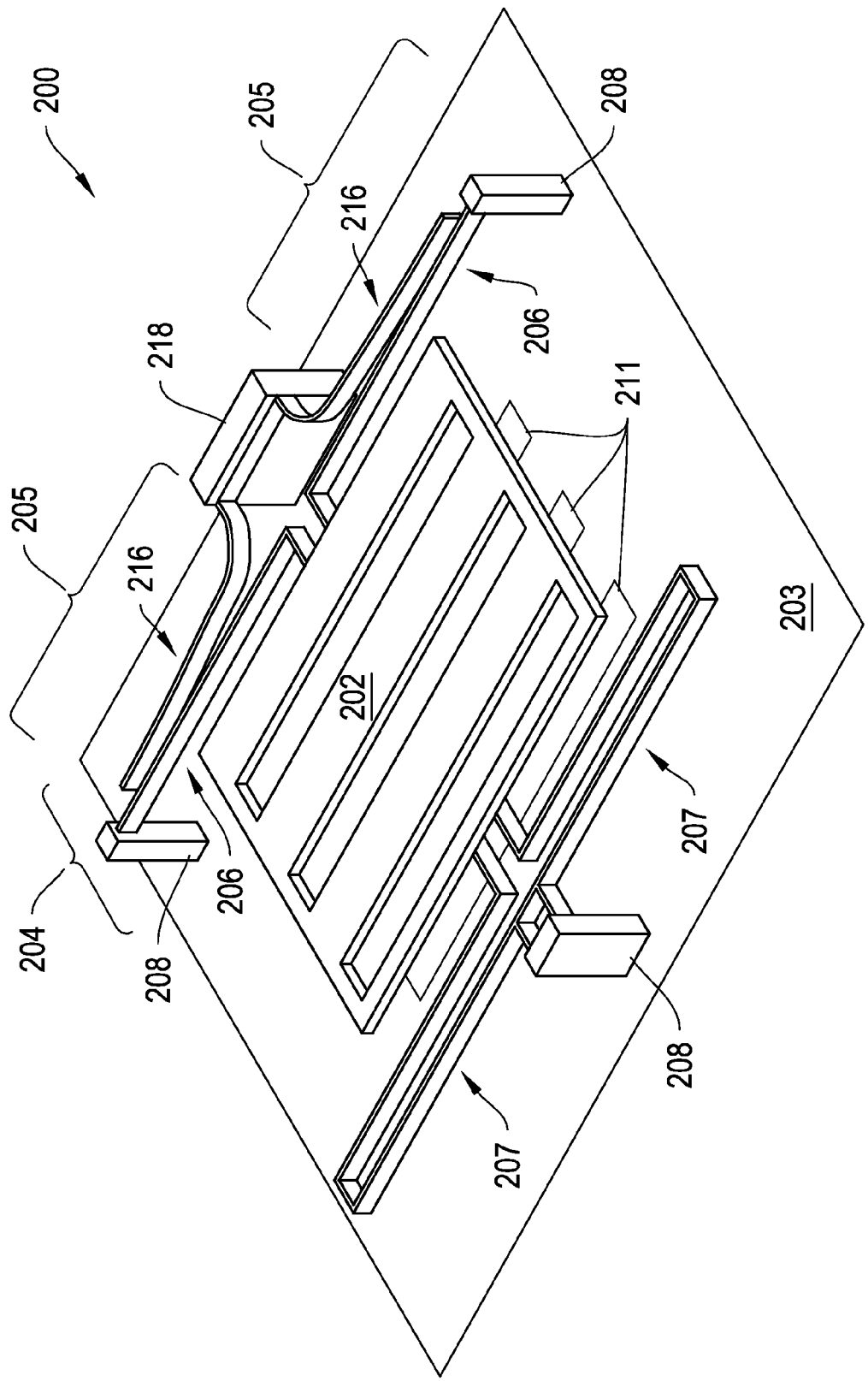
FIG. 2 shows a perspective view of an example shutter-based light modulator.

FIG. 2 shows a perspective view of an example shutter-based light modulator 200. The shutter-based light modulator 200 is suitable for incorporation into the direct-view MEMS-based display apparatus 100 of FIG. 1A. The light modulator 200 includes a shutter 202 coupled to an actuator 204. The actuator 204 can be formed from two separate compliant electrode beam actuators 205 (the "actuators 205"). The shutter 202 couples on one side to the actuators 205. The actuators 205 move the shutter 202 transversely over a surface 203 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203. The surface 203 includes one or more aperture holes 211 for admitting the passage of light. The load anchors 208 physically connect the compliant load beams 206 and the shutter 202 to the surface 203 and electrically connect the load beams 206 to a bias voltage, in some instances, ground.

If the substrate is opaque, such as silicon, then aperture holes 211 are formed in the substrate by etching an array of holes through the substrate. If the substrate is transparent, such as glass or plastic, then the aperture holes 211 are formed in a layer of light-blocking material deposited on the substrate. The aperture holes 211 can be generally circular, elliptical, polygonal, serpentine, or irregular in shape.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely toward the drive anchor 218. The compliant members 206 act as springs, such that when the voltage across the beams 206 and 216 potential is removed, the load beams 206 push the shutter 202 back into its initial position, releasing the stress stored in the load beams 206.

A light modulator, such as the light modulator 200, incorporates a passive restoring force, such as a spring, for returning a shutter to its rest position after voltages have been removed. Other shutter assemblies can incorporate a dual set of "open" and "closed" actuators and separate sets of "open" and "closed" electrodes for moving the shutter into either an open or a closed state.

There are a variety of methods by which an array of shutters and apertures can be controlled via a control matrix to produce images, in many cases moving images, with appropriate luminance levels. In some cases, control is accomplished by means of a passive matrix array of row and column interconnects connected to driver circuits on the periphery of the display. In other cases, it is appropriate to include switching and/or data storage elements within each pixel of the array (the so-called active matrix) to improve the speed, the luminance level and/or the power dissipation performance of the display.

Figure 3A:
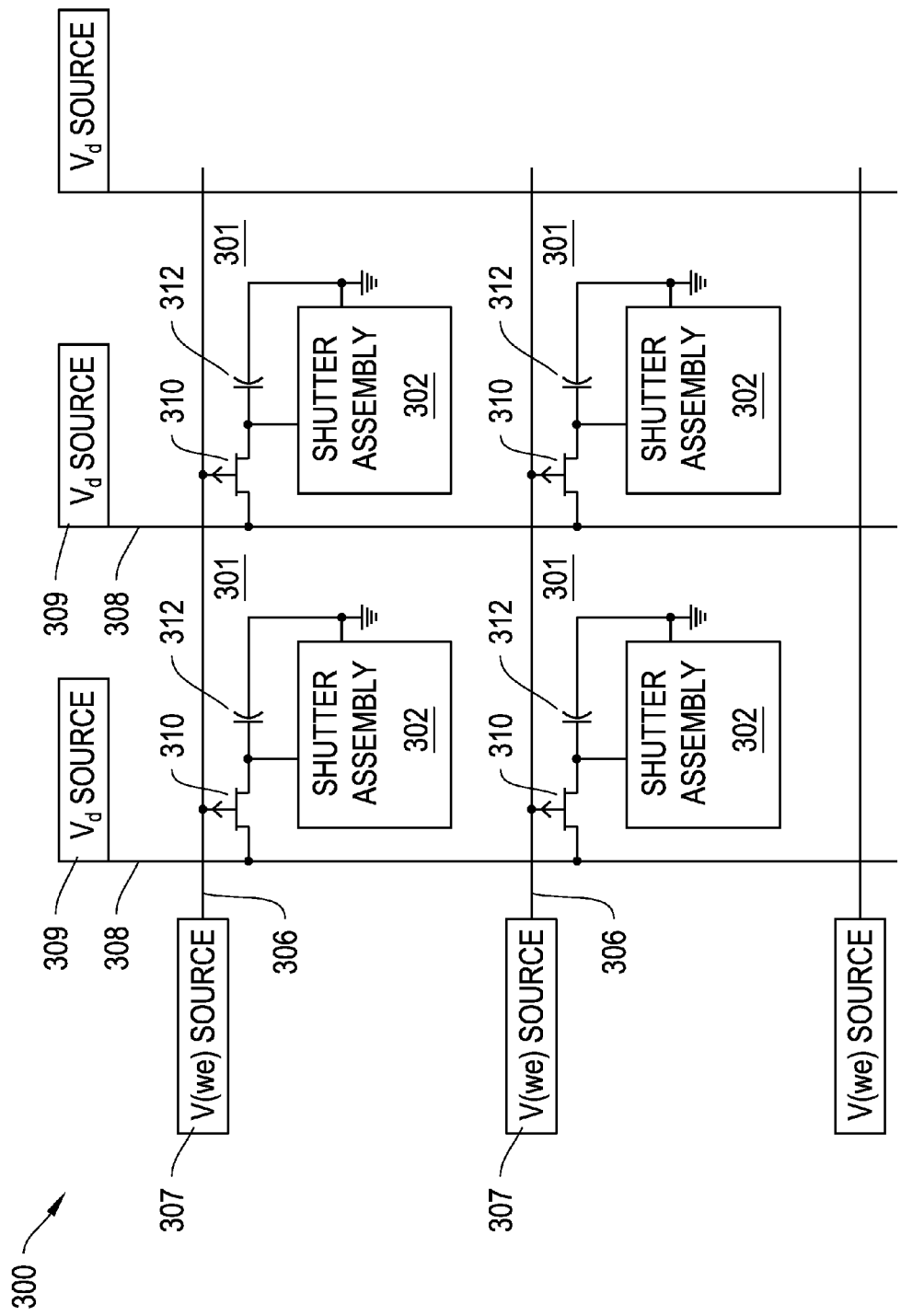
FIG. 3A shows a schematic diagram of an example control matrix.
Figure 3B:
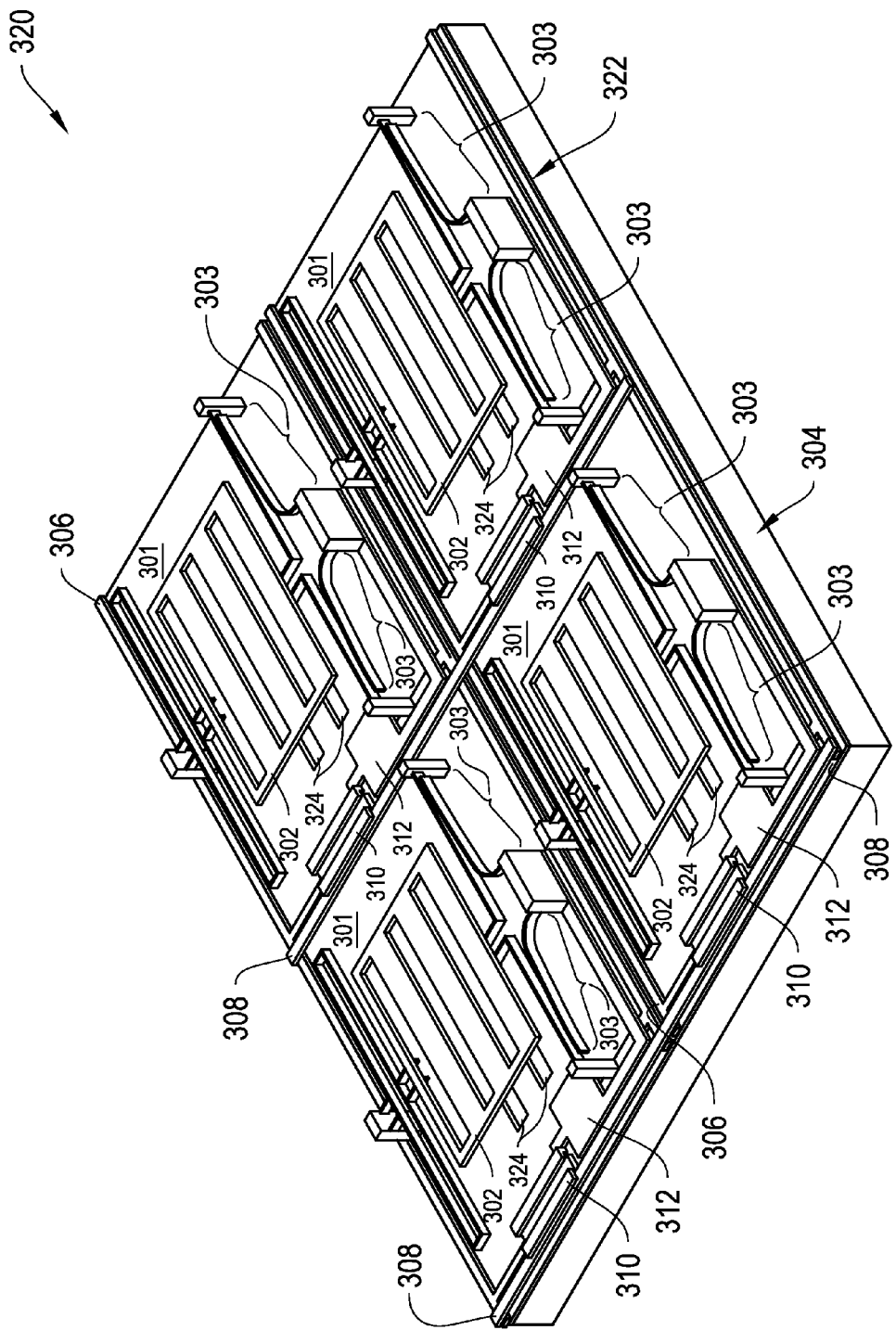
FIG. 3B shows a perspective view of an example array of shutter-based light modulators connected to the control matrix of FIG. 3A.

FIG. 3A shows a schematic diagram of an example control matrix 300. The control matrix 300 is suitable for controlling the light modulators incorporated into the MEMS-based display apparatus 100 of FIG. 1A. FIG. 3B shows a perspective view of an example array 320 of shutter-based light modulators connected to the control matrix 300 of FIG. 3A. The control matrix 300 may address an array of pixels 320 (the "array 320"). Each pixel 301 can include an elastic shutter assembly 302, such as the shutter assembly 200 of FIG. 2, controlled by an actuator 303. Each pixel also can include an aperture layer 322 that includes apertures 324.

The control matrix 300 is fabricated as a diffused or thin-film-deposited electrical circuit on the surface of a substrate 304 on which the shutter assemblies 302 are formed. The control matrix 300 includes a scan-line interconnect 306 for each row of pixels 301 in the control matrix 300 and a data-interconnect 308 for each column of pixels 301 in the control matrix 300. Each scan-line interconnect 306 electrically connects a write-enabling voltage source 307 to the pixels 301 in a corresponding row of pixels 301. Each data interconnect 308 electrically connects a data voltage source 309 ("Vd source") to the pixels 301 in a corresponding column of pixels. In the control matrix 300, the Vd source 309 provides the majority of the energy to be used for actuation of the shutter assemblies 302. Thus, the data voltage source, Vd source 309, also serves as an actuation voltage source.

Referring to FIGS. 3A and 3B, for each pixel 301 or for each shutter assembly 302 in the array of pixels 320, the control matrix 300 includes a transistor 310 and a capacitor 312. The gate of each transistor 310 is electrically connected to the scan-line interconnect 306 of the row in the array 320 in which the pixel 301 is located. The source of each transistor 310 is electrically connected to its corresponding data interconnect 308. The actuators 303 of each shutter assembly 302 include two electrodes. The drain of each transistor 310 is electrically connected in parallel to one electrode of the corresponding capacitor 312 and to one of the electrodes of the corresponding actuator 303. The other electrode of the capacitor 312 and the other electrode of the actuator 303 in shutter assembly 302 are connected to a common or ground potential. In alternate implementations, the transistors 310 can be replaced with semiconductor diodes and or metal-insulator-metal sandwich type switching elements.

In operation, to form an image, the control matrix 300 write-enables each row in the array 320 in a sequence by applying Vwe to each scan-line interconnect 306 in turn. For a write-enabled row, the application of Vwe to the gates of the transistors 310 of the pixels 301 in the row allows the flow of current through the data interconnects 308 through the transistors 310 to apply a potential to the actuator 303 of the shutter assembly 302. While the row is write-enabled, data voltages Vd are selectively applied to the data interconnects 308. In implementations providing analog gray scale, the data voltage applied to each data interconnect 308 is varied in relation to the desired brightness of the pixel 301 located at the intersection of the write-enabled scan-line interconnect 306 and the data interconnect 308. In implementations providing digital control schemes, the data voltage is selected to be either a relatively low magnitude voltage (i.e., a voltage near ground) or to meet or exceed Vat (the actuation threshold voltage). In response to the application of Vat to a data interconnect 308, the actuator 303 in the corresponding shutter assembly actuates, opening the shutter in that shutter assembly 302. The voltage applied to the data interconnect 308 remains stored in the capacitor 312 of the pixel 301 even after the control matrix 300 ceases to apply Vwe to a row. Therefore, the voltage Vwe does not have to wait and hold on a row for times long enough for the shutter assembly 302 to actuate; such actuation can proceed after the write-enabling voltage has been removed from the row. The capacitors 312 also function as memory elements within the array 320, storing actuation instructions for the illumination of an image frame.

The pixels 301 as well as the control matrix 300 of the array 320 are formed on a substrate 304. The array 320 includes an aperture layer 322, disposed on the substrate 304, which includes a set of apertures 324 for respective pixels 301 in the array 320. The apertures 324 are aligned with the shutter assemblies 302 in each pixel. In some implementations, the substrate 304 is made of a transparent material, such as glass or plastic. In some other implementations, the substrate 304 is made of an opaque material, but in which holes are etched to form the apertures 324.

The shutter assembly 302 together with the actuator 303 can be made bi-stable. That is, the shutters can exist in at least two equilibrium positions (e.g., open or closed) with little or no power required to hold them in either position. More particularly, the shutter assembly 302 can be mechanically bi-stable. Once the shutter of the shutter assembly 302 is set in position, no electrical energy or holding voltage is required to maintain that position. The mechanical stresses on the physical elements of the shutter assembly 302 can hold the shutter in place.

The shutter assembly 302 together with the actuator 303 also can be made electrically bi-stable. In an electrically bi-stable shutter assembly, there exists a range of voltages below the actuation voltage of the shutter assembly, which if applied to a closed actuator (with the shutter being either open or closed), holds the actuator closed and the shutter in position, even if an opposing force is exerted on the shutter. The opposing force may be exerted by a spring such as the spring 207 in the shutter-based light modulator 200 depicted in FIG. 2A, or the opposing force may be exerted by an opposing actuator, such as an "open" or "closed" actuator.

The light modulator array 320 is depicted as having a single MEMS light modulator per pixel. Other implementations are possible in which multiple MEMS light modulators are provided in each pixel, thereby providing the possibility of more than just binary "on" or "off" optical states in each pixel. Certain forms of coded area division gray scale are possible where multiple MEMS light modulators in the pixel are provided, and where apertures 324, which are associated with each of the light modulators, have unequal areas.

Figure 4A:
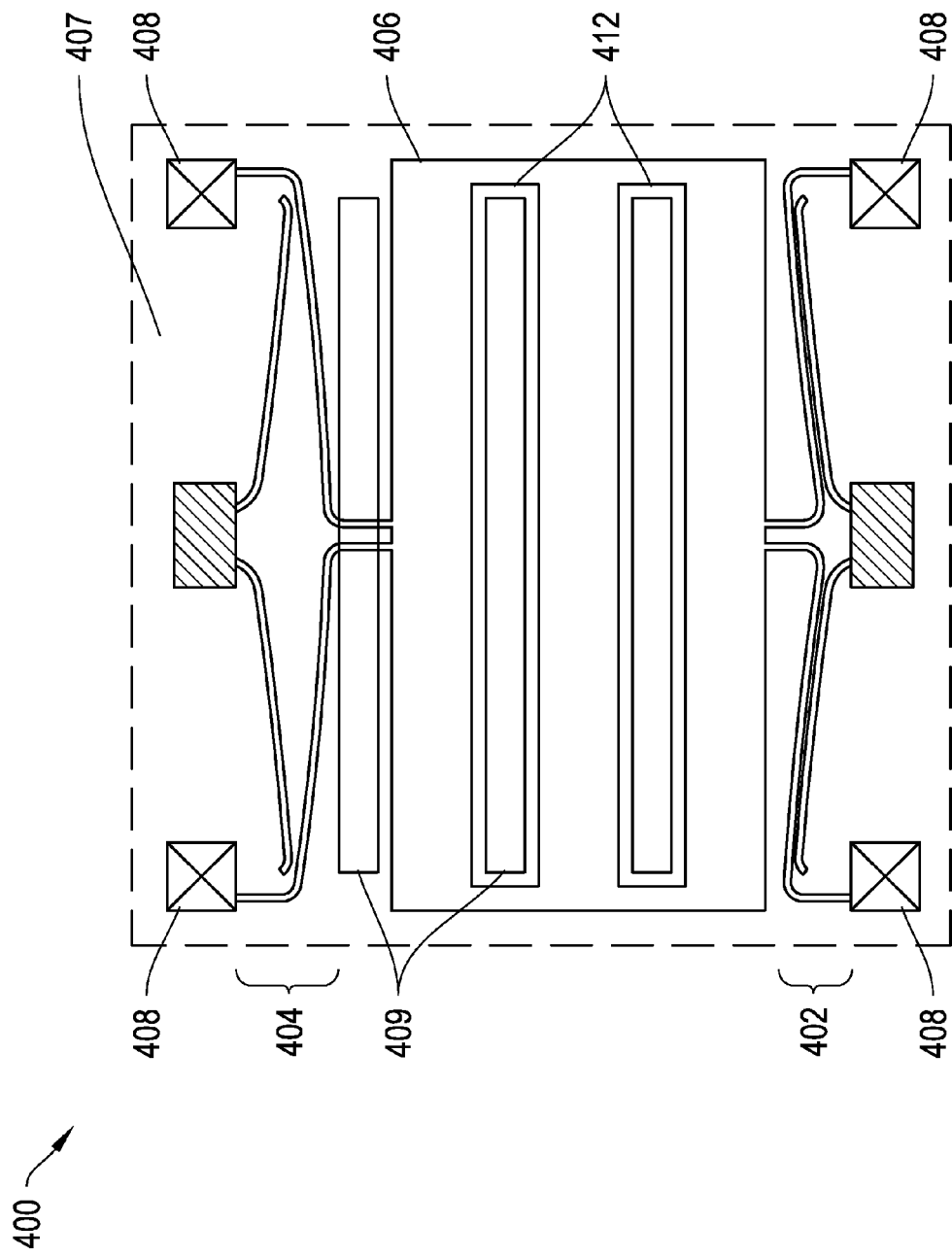
FIG. 4A and FIG. 4B show views of an example dual actuator shutter assembly.
Figure 4B:
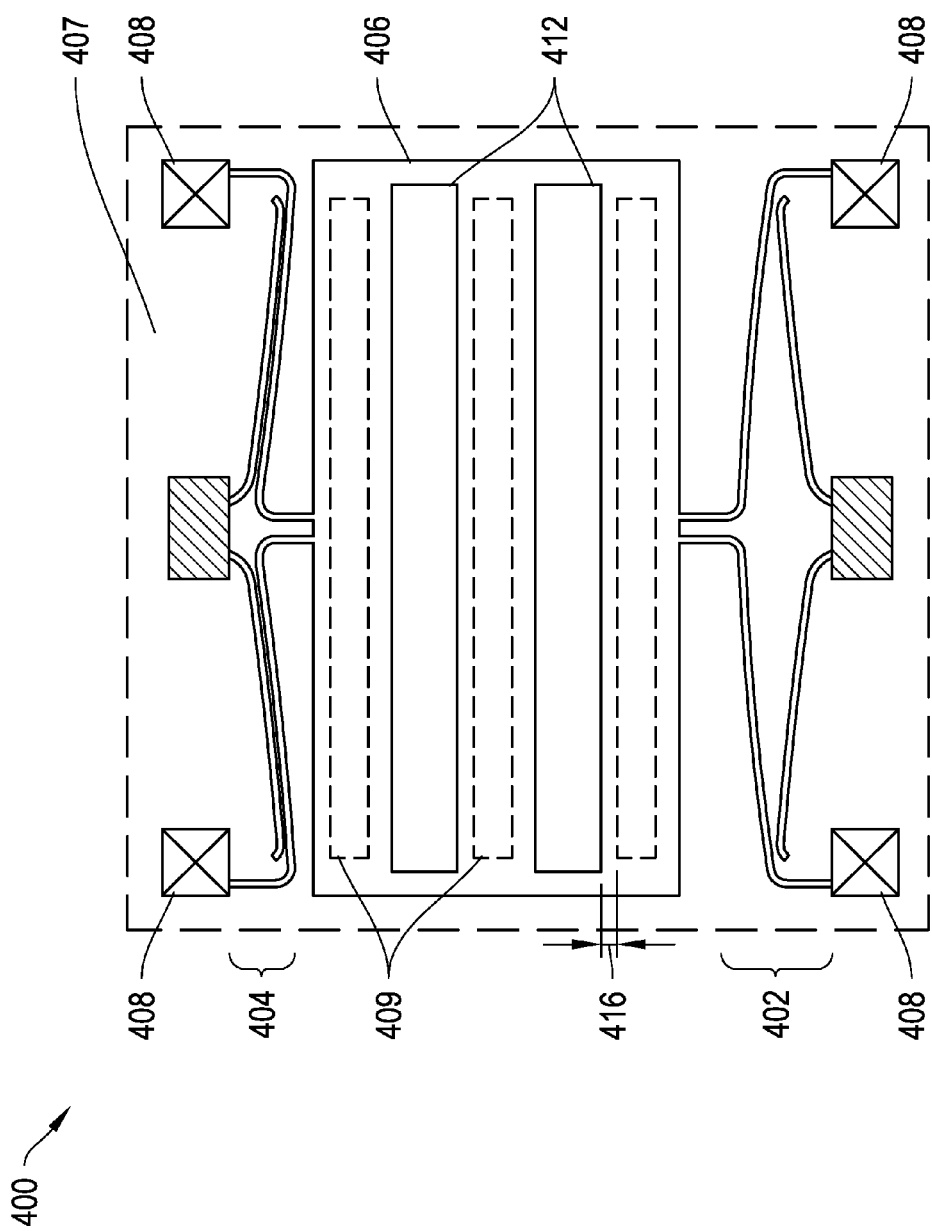

FIGS. 4A and 4B show views of an example dual actuator shutter assembly 400. The dual actuator shutter assembly 400, as depicted in FIG. 4A, is in an open state. FIG. 4B shows the dual actuator shutter assembly 400 in a closed state. In contrast to the shutter assembly 200, the shutter assembly 400 includes actuators 402 and 404 on either side of a shutter 406. Each actuator 402 and 404 is independently controlled. A first actuator, a shutter-open actuator 402, serves to open the shutter 406. A second opposing actuator, the shutter-close actuator 404, serves to close the shutter 406. Both of the actuators 402 and 404 are compliant beam electrode actuators. The actuators 402 and 404 open and close the shutter 406 by driving the shutter 406 substantially in a plane parallel to an aperture layer 407 over which the shutter is suspended. The shutter 406 is suspended a short distance over the aperture layer 407 by anchors 408 attached to the actuators 402 and 404. The inclusion of supports attached to both ends of the shutter 406 along its axis of movement reduces out of plane motion of the shutter 406 and confines the motion substantially to a plane parallel to the substrate. By analogy to the control matrix 300 of FIG. 3A, a control matrix suitable for use with the shutter assembly 400 might include one transistor and one capacitor for each of the opposing shutter-open and shutter-close actuators 402 and 404.

The shutter 406 includes two shutter apertures 412 through which light can pass. The aperture layer 407 includes a set of three apertures 409. In FIG. 4A, the shutter assembly 400 is in the open state and, as such, the shutter-open actuator 402 has been actuated, the shutter-close actuator 404 is in its relaxed position, and the centerlines of the shutter apertures 412 coincide with the centerlines of two of the aperture layer apertures 409. In FIG. 4B, the shutter assembly 400 has been moved to the closed state and, as such, the shutter-open actuator 402 is in its relaxed position, the shutter-close actuator 404 has been actuated, and the light blocking portions of the shutter 406 are now in position to block transmission of light through the apertures 409 (depicted as dotted lines).

Each aperture has at least one edge around its periphery. For example, the rectangular apertures 409 have four edges. In alternative implementations in which circular, elliptical, oval, or other curved apertures are formed in the aperture layer 407, each aperture may have only a single edge. In some other implementations, the apertures need not be separated or disjoint in the mathematical sense, but instead can be connected. That is to say, while portions or shaped sections of the aperture may maintain a correspondence to each shutter, several of these sections may be connected such that a single continuous perimeter of the aperture is shared by multiple shutters.

In order to allow light with a variety of exit angles to pass through apertures 412 and 409 in the open state, it is advantageous to provide a width or size for shutter apertures 412 which is larger than a corresponding width or size of apertures 409 in the aperture layer 407. In order to effectively block light from escaping in the closed state, it is preferable that the light blocking portions of the shutter 406 overlap the apertures 409. FIG. 4B shows a predefined overlap 416 between the edge of light blocking portions in the shutter 406 and one edge of the aperture 409 formed in the aperture layer 407.

The electrostatic actuators 402 and 404 are designed so that their voltage-displacement behavior provides a bi-stable characteristic to the shutter assembly 400. For each of the shutter-open and shutter-close actuators there exists a range of voltages below the actuation voltage, which if applied while that actuator is in the closed state (with the shutter being either open or closed), will hold the actuator closed and the shutter in position, even after an actuation voltage is applied to the opposing actuator. The minimum voltage needed to maintain a shutter's position against such an opposing force is referred to as a maintenance voltage Vm.

Figure 5:
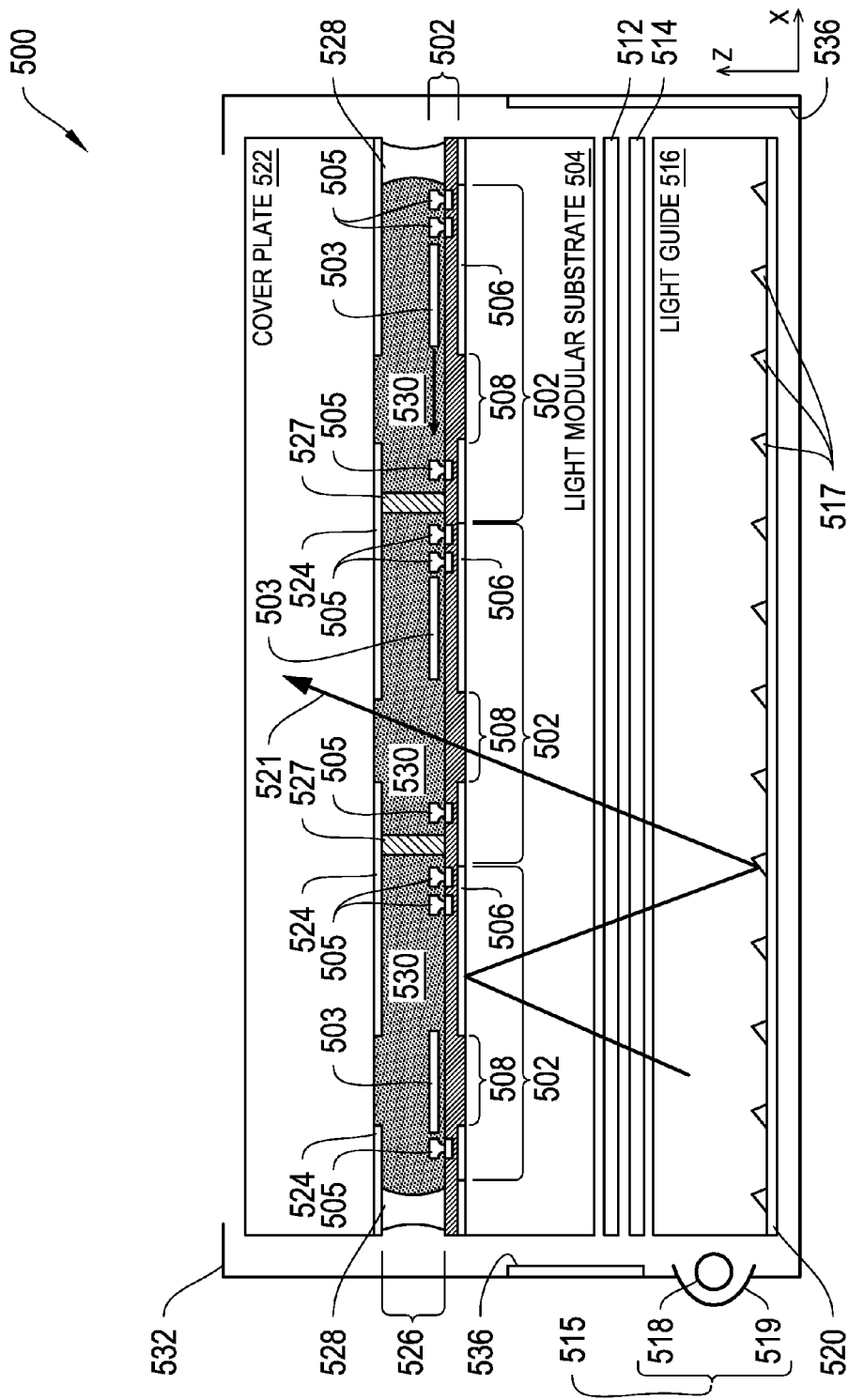
FIG. 5 shows a cross sectional view of an example display apparatus incorporating shutter-based light modulators.

FIG. 5 shows a cross sectional view of an example display apparatus 500 incorporating shutter-based light modulators (shutter assemblies) 502. Each shutter assembly 502 incorporates a shutter 503 and an anchor 505. Not shown are the compliant beam actuators which, when connected between the anchors 505 and the shutters 503, help to suspend the shutters 503 a short distance above the surface. The shutter assemblies 502 are disposed on a transparent substrate 504, such a substrate made of plastic or glass. A rear-facing reflective layer, reflective film 506, disposed on the substrate 504 defines a plurality of surface apertures 508 located beneath the closed positions of the shutters 503 of the shutter assemblies 502. The reflective film 506 reflects light not passing through the surface apertures 508 back towards the rear of the display apparatus 500. The reflective aperture layer 506 can be a fine-grained metal film without inclusions formed in thin film fashion by a number of vapor deposition techniques including sputtering, evaporation, ion plating, laser ablation, or chemical vapor deposition (CVD). In some other implementations, the rear-facing reflective layer 506 can be formed from a mirror, such as a dielectric mirror. A dielectric mirror can be fabricated as a stack of dielectric thin films which alternate between materials of high and low refractive index. The vertical gap which separates the shutters 503 from the reflective film 506, within which the shutter is free to move, is in the range of 0.5 to 10 microns. The magnitude of the vertical gap is preferably less than the lateral overlap between the edge of shutters 503 and the edge of apertures 508 in the closed state, such as the overlap 416 depicted in FIG. 4B.

The display apparatus 500 includes an optional diffuser 512 and/or an optional brightness enhancing film 514 which separate the substrate 504 from a planar light guide 516. The light guide 516 includes a transparent, i.e., glass or plastic material. The light guide 516 is illuminated by one or more light sources 518, forming a backlight. The light sources 518 can be, for example, and without limitation, incandescent lamps, fluorescent lamps, lasers or light emitting diodes (LEDs). A reflector 519 helps direct light from lamp 518 towards the light guide 516. A front-facing reflective film 520 is disposed behind the backlight 516, reflecting light towards the shutter assemblies 502. Light rays such as ray 521 from the backlight that do not pass through one of the shutter assemblies 502 will be returned to the backlight and reflected again from the film 520. In this fashion light that fails to leave the display apparatus 500 to form an image on the first pass can be recycled and made available for transmission through other open apertures in the array of shutter assemblies 502. Such light recycling has been shown to increase the illumination efficiency of the display.

The light guide 516 includes a set of geometric light redirectors or prisms 517 which re-direct light from the lamps 518 towards the apertures 508 and hence toward the front of the display. The light redirectors 517 can be molded into the plastic body of light guide 516 with shapes that can be alternately triangular, trapezoidal, or curved in cross section. The density of the prisms 517 generally increases with distance from the lamp 518.

In some implementations, the aperture layer 506 can be made of a light absorbing material, and in alternate implementations the surfaces of shutter 503 can be coated with either a light absorbing or a light reflecting material. In some other implementations, the aperture layer 506 can be deposited directly on the surface of the light guide 516. In some implementations, the aperture layer 506 need not be disposed on the same substrate as the shutters 503 and anchors 505 (such as in the MEMS-down configuration described below).

In some implementations, the light sources 518 can include lamps of different colors, for instance, the colors red, green and blue. A color image can be formed by sequentially illuminating images with lamps of different colors at a rate sufficient for the human brain to average the different colored images into a single multi-color image. The various color-specific images are formed using the array of shutter assemblies 502. In another implementation, the light source 518 includes lamps having more than three different colors. For example, the light source 518 may have red, green, blue and white lamps, or red, green, blue and yellow lamps. In some other implementations, the light source 518 may include cyan, magenta, yellow and white lamps, red, green, blue and white lamps. In some other implementations, additional lamps may be included in the light source 518. For example, if using five colors, the light source 518 may include red, green, blue, cyan and yellow lamps. In some other implementations, the light source 518 may include white, orange, blue, purple and green lamps or white, blue, yellow, red and cyan lamps. If using six colors, the light source 518 may include red, green, blue, cyan, magenta and yellow lamps or white, cyan, magenta, yellow, orange and green lamps.

A cover plate 522 forms the front of the display apparatus 500. The rear side of the cover plate 522 can be covered with a black matrix 524 to increase contrast. In alternate implementations the cover plate includes color filters, for instance distinct red, green, and blue filters corresponding to different ones of the shutter assemblies 502. The cover plate 522 is supported a predetermined distance away from the shutter assemblies 502 forming a gap 526. The gap 526 is maintained by mechanical supports or spacers 527 and/or by an adhesive seal 528 attaching the cover plate 522 to the substrate 504.

The adhesive seal 528 seals in a fluid 530. The fluid 530 is engineered with viscosities preferably below about 10 centipoise and with relative dielectric constant preferably above about 2.0, and dielectric breakdown strengths above about 104 V/cm. The fluid 530 also can serve as a lubricant. In some implementations, the fluid 530 is a hydrophobic liquid with a high surface wetting capability. In alternate implementations, the fluid 530 has a refractive index that is either greater than or less than that of the substrate 504.

Displays that incorporate mechanical light modulators can include hundreds, thousands, or in some cases, millions of moving elements. In some devices, every movement of an element provides an opportunity for static friction to disable one or more of the elements. This movement is facilitated by immersing all the parts in a fluid (also referred to as fluid 530) and sealing the fluid (e.g., with an adhesive) within a fluid space or gap in a MEMS display cell. The fluid 530 is usually one with a low coefficient of friction, low viscosity, and minimal degradation effects over the long term. When the MEMS-based display assembly includes a liquid for the fluid 530, the liquid at least partially surrounds some of the moving parts of the MEMS-based light modulator. In some implementations, in order to reduce the actuation voltages, the liquid has a viscosity below 70 centipoise. In some other implementations, the liquid has a viscosity below 10 centipoise. Liquids with viscosities below 70 centipoise can include materials with low molecular weights: below 4000 grams/mole, or in some cases below 400 grams/mole. Fluids 530 that also may be suitable for such implementations include, without limitation, de-ionized water, methanol, ethanol and other alcohols, paraffins, olefins, ethers, silicone oils, fluorinated silicone oils, or other natural or synthetic solvents or lubricants. Useful fluids can be polydimethylsiloxanes (PDMS), such as hexamethyldisiloxane and octamethyltrisiloxane, or alkyl methyl siloxanes such as hexylpentamethyldisiloxane. Useful fluids can be alkanes, such as octane or decane. Useful fluids can be nitroalkanes, such as nitromethane. Useful fluids can be aromatic compounds, such as toluene or diethylbenzene. Useful fluids can be ketones, such as butanone or methyl isobutyl ketone. Useful fluids can be chlorocarbons, such as chlorobenzene. Useful fluids can be chlorofluorocarbons, such as dichlorofluoroethane or chlorotrifluoroethylene. Other fluids considered for these display assemblies include butyl acetate and dimethylformamide. Still other useful fluids for these displays include hydro fluoro ethers, perfluoropolyethers, hydro fluoro poly ethers, pentanol, and butanol. Example suitable hydro fluoro ethers include ethyl nonafluorobutyl ether and 2-trifluoromethyl-3-ethoxydodecafluorohexane.

A sheet metal or molded plastic assembly bracket 532 holds the cover plate 522, the substrate 504, the backlight and the other component parts together around the edges. The assembly bracket 532 is fastened with screws or indent tabs to add rigidity to the combined display apparatus 500. In some implementations, the light source 518 is molded in place by an epoxy potting compound. Reflectors 536 help return light escaping from the edges of the light guide 516 back into the light guide 516. Not depicted in FIG. 5 are electrical interconnects which provide control signals as well as power to the shutter assemblies 502 and the lamps 518.

In some other implementations, the roller-based light modulator 220, the light tap 250, or the electrowetting-based light modulation array 270, as depicted in FIGS. 2A-2D, as well as other MEMS-based light modulators, can be substituted for the shutter assemblies 502 within the display apparatus 500.

The display apparatus 500 is referred to as the MEMS-up configuration, wherein the MEMS based light modulators are formed on a front surface of the substrate 504, i.e., the surface that faces toward the viewer. The shutter assemblies 502 are built directly on top of the reflective aperture layer 506. In an alternate implementation, referred to as the MEMS-down configuration, the shutter assemblies are disposed on a substrate separate from the substrate on which the reflective aperture layer is formed. The substrate on which the reflective aperture layer is formed, defining a plurality of apertures, is referred to herein as the aperture plate. In the MEMS-down configuration, the substrate that carries the MEMS-based light modulators takes the place of the cover plate 522 in the display apparatus 500 and is oriented such that the MEMS-based light modulators are positioned on the rear surface of the top substrate, i.e., the surface that faces away from the viewer and toward the light guide 516. The MEMS-based light modulators are thereby positioned directly opposite to and across a gap from the reflective aperture layer 506. The gap can be maintained by a series of spacer posts connecting the aperture plate and the substrate on which the MEMS modulators are formed. In some implementations, the spacers are disposed within or between each pixel in the array. The gap or distance that separates the MEMS light modulators from their corresponding apertures is preferably less than 10 microns, or a distance that is less than the overlap between shutters and apertures, such as overlap 416.

Figure 6A:
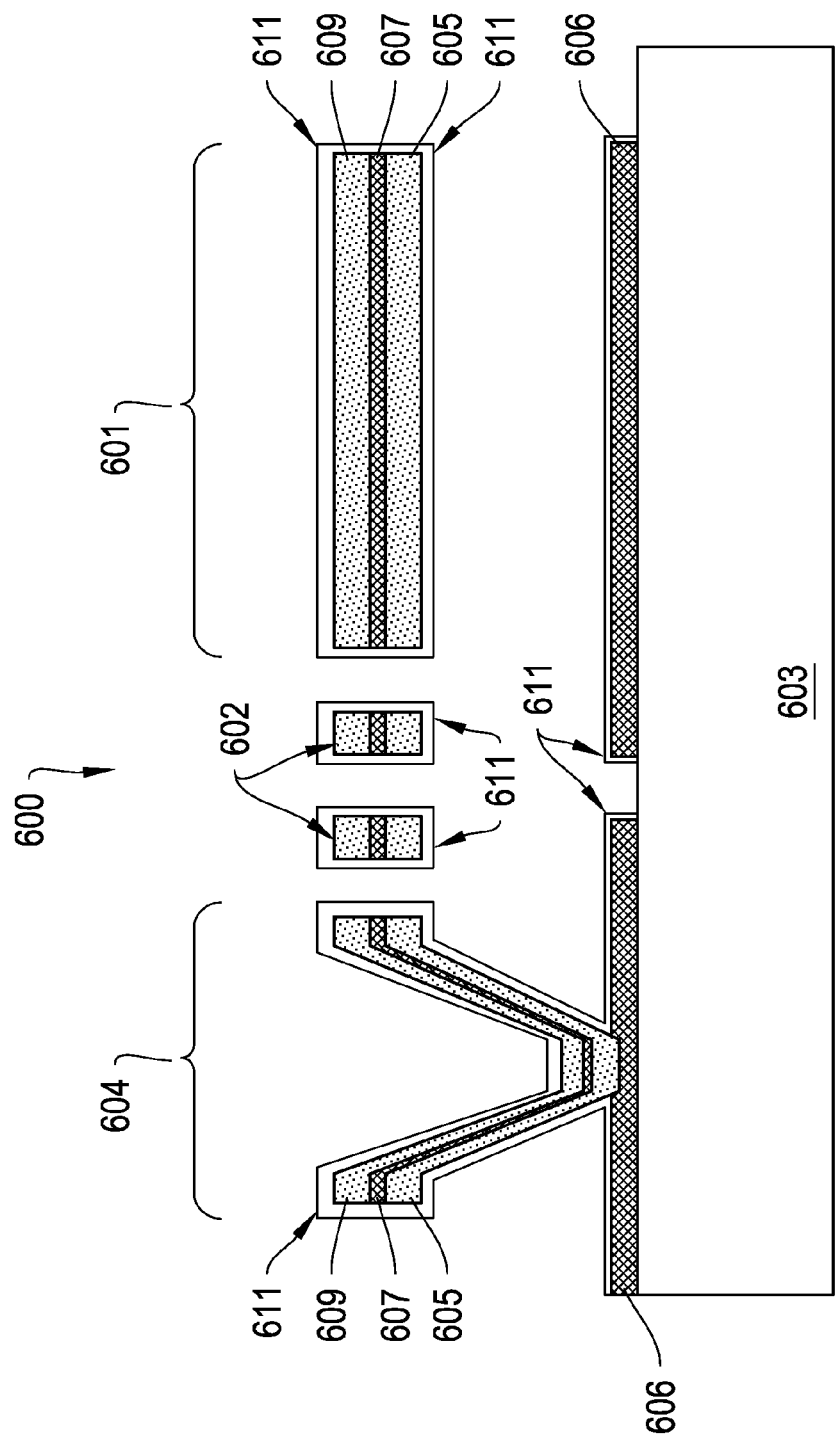
FIGS. 6A-6E show cross sectional views of stages of construction of an example composite shutter assembly.

FIGS. 6A-6E show cross sectional views of stages of construction of an example composite shutter assembly. FIG. 6A shows an example cross sectional diagram of a completed composite shutter assembly 600. The shutter assembly 600 includes a shutter 601, two compliant beams 602, and an anchor structure 604 built-up on a substrate 603 and an aperture layer 606. The elements of the composite shutter assembly 600 include a first mechanical layer 605, a conductor layer 607, a second mechanical layer 609, and an encapsulating dielectric 611. At least one of the mechanical layers 605 or 609 can be deposited to thicknesses in excess of 0.15 microns, as one or both of the mechanical layers 605 or 609 serves as the principal load bearing and mechanical actuation member for the shutter assembly 600, though in some implementations, the mechanical layers 605 and 609 may be thinner.

Candidate materials for the mechanical layers 605 and 609 include, without limitation, metals such as aluminum (Al), copper (Cu), nickel (Ni), chromium (Cr), molybdenum (Mo), titanium (Ti), tantalum (Ta), niobium (Nb), neodymium (Nd), or alloys thereof; dielectric materials such as aluminum oxide ($Al_2O_3$), silicon oxide ($SiO_2$), tantalum pentoxide ($Ta_2O_5$), or silicon nitride ($Si_3N_4$); or semiconducting materials such as diamond-like carbon, silicon (Si), germanium (Ge), gallium arsenide (GaAs), cadmium telluride (CdTe) or alloys thereof. At least one of the layers, such as the conductor layer 607, should be electrically conducting so as to carry charge on to and off of the actuation elements. Candidate materials include, without limitation, Al, Cu, Ni, Cr, Mo, Ti, Ta, Nb, Nd, or alloys thereof or semiconducting materials such as diamond-like carbon, Si, Ge, GaAs, CdTe or alloys thereof. In some implementations employing semiconductor layers, the semiconductors are doped with impurities such as phosphorus (P), arsenic (As), boron (B), or Al. FIG. 6A depicts a sandwich configuration for the composite in which the mechanical layers 605 and 609, having similar thicknesses and mechanical properties, are deposited on either side of the conductor layer 607. In some implementations, the sandwich structure helps to ensure that stresses remaining after deposition and/or stresses that are imposed by temperature variations will not act to cause bending, warping or other deformation of the shutter assembly 600.

In some implementations, the order of the layers in the composite shutter assembly 600 can be inverted, such that the outside of the shutter assembly 600 is formed from a conductor layer while the inside of the shutter assembly 600 is formed from a mechanical layer.

The shutter assembly 600 can include an encapsulating dielectric 611. In some implementations, dielectric coatings can be applied in conformal fashion, such that all exposed bottom, top, and side surfaces of the shutter 601, the anchor 604, and the beams 602 are uniformly coated. Such thin films can be grown by thermal oxidation and/or by conformal CVD of an insulator such as $Al_2O_3$, chromium (III) oxide ($Cr_2O_3$), titanium oxide ($TiO_2$), hafnium oxide ($HfO_2$), vanadium oxide ($V_2O_5$), niobium oxide ($Nb_2O_5$), $Ta_2O_5$, $SiO_2$, or $Si_3N_4$, or by depositing similar materials via atomic layer deposition. The dielectric coating layer can be applied with thicknesses in the range of 10 nm to 1 micron. In some implementations, sputtering and evaporation can be used to deposit the dielectric coating onto sidewalls.

FIGS. 6B-6E show example cross sectional views of the results of certain intermediate manufacturing stages of an example process used to form the shutter assembly 600 depicted in FIG. 6A. In some implementations, the shutter assembly 600 is built on top of a pre-existing control matrix, such as an active matrix array of thin film transistors, such as the control matrices depicted in FIGS. 3A and 3B.

Figure 6B:
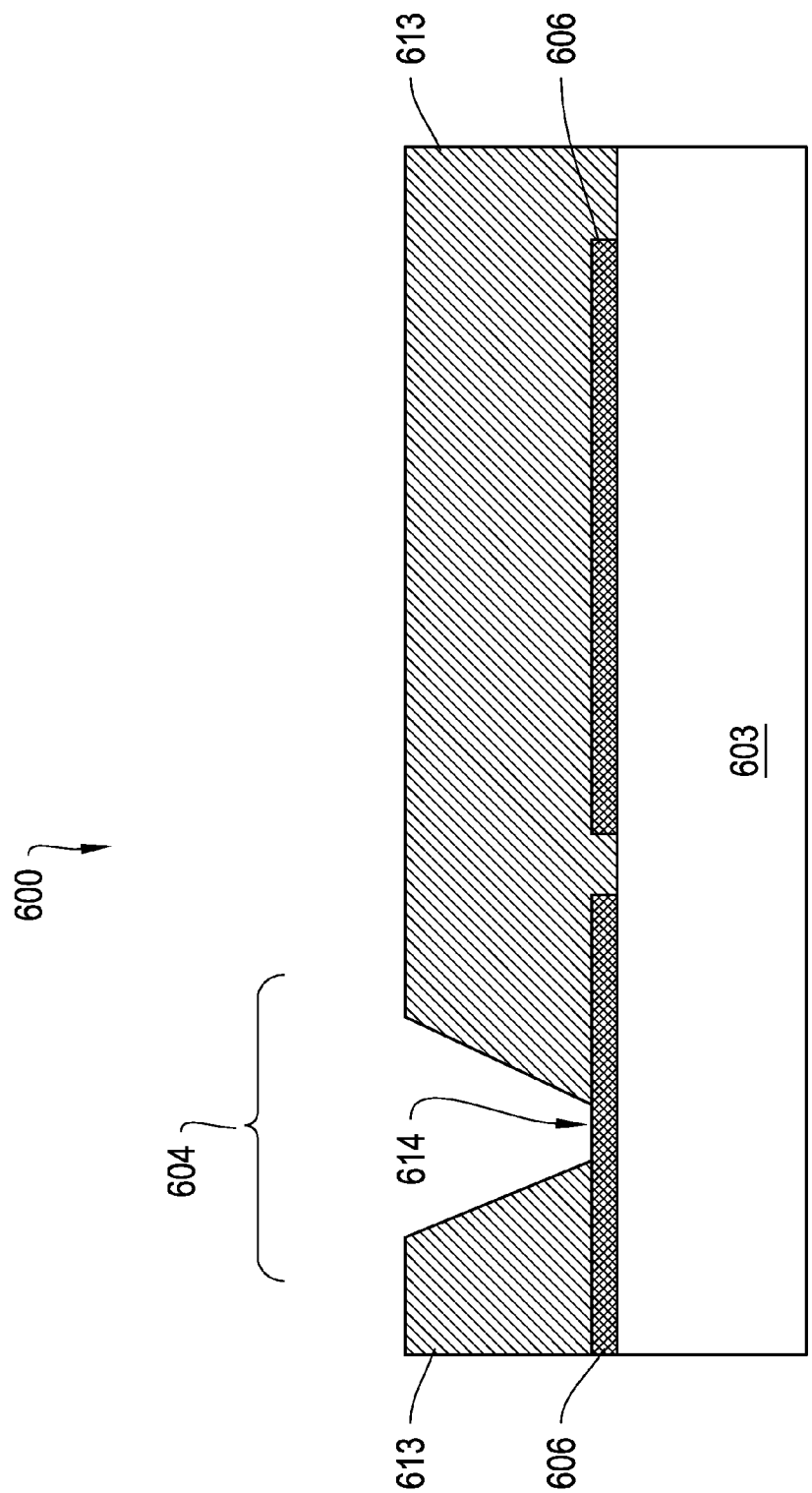

FIG. 6B shows a cross sectional view of the results of a first stage in an example process of forming the shutter assembly 600. As depicted in FIG. 6B, a sacrificial layer 613 is deposited and patterned. In some implementations, polyimide is used as a sacrificial layer material. Other candidate sacrificial layer materials include, without limitation, polymer materials such as polyamide, fluoropolymer, benzocyclobutene, polyphenylquinoxylene, parylene, or polynorbornene. These materials are chosen for their ability to planarize rough surfaces, maintain mechanical integrity at processing temperatures in excess of 250° C., and their ease of etch and/or thermal decomposition during removal. In other implementations, the sacrificial layer 613 is formed from a photoresist, such as polyvinyl acetate, polyvinyl ethylene, and phenolic or novolac resins. An alternate sacrificial layer material used in some implementations is $SiO_2$, which can be removed preferentially as long as other electronic or structural layers are resistant to the hydrofluoric acid solutions used for its removal. One such suitable resistant material is $Si_3N_4$. Another alternate sacrificial layer material is Si, which can be removed preferentially as long as electronic or structural layers are resistant to the fluorine plasmas or xenon difluoride ($XeF_2$) used for its removal, such as most metals and $Si_3N_4$. Yet another alternate sacrificial layer material is Al, which can be removed preferentially as long as other electronic or structural layers are resistant to strong base solutions, such as concentrated sodium hydroxide (NaOH) solutions. Suitable materials include, for example, Cr, Ni, Mo, Ta and Si. Still another alternate sacrificial layer material is Cu, which can be removed preferentially as long as other electronic or structural layers are resistant to nitric or sulfuric acid solutions. Such materials include, for example, Cr, Ni, and Si.

Next the sacrificial layer 613 is patterned to expose holes or vias at the anchor regions 604. In implementations employing polyimide or other non-photoactive materials as the sacrificial layer material, the sacrificial layer material can be formulated to include photoactive agents, allowing regions exposed through a UV photomask to be preferentially removed in a developer solution. Sacrificial layers formed from other materials can be patterned by coating the sacrificial layer 613 in an additional layer of photoresist, photopatterning the photoresist, and finally using the photoresist as an etching mask. The sacrificial layer 613 alternatively can be patterned by coating the sacrificial layer 613 with a hard mask, which can be a thin layer of $SiO_2$ or a metal such as Cr. A photopattern is then transferred to the hard mask by way of photoresist and wet chemical etching. The pattern developed in the hard mask can be resistant to dry chemical, anisotropic, or plasma etching—techniques which can be used to impart deep and narrow anchor holes into the sacrificial layer 613.

After the anchor regions 604 have been opened in the sacrificial layer 613, the exposed and underlying conducting surface 614 can be etched, either chemically or via the sputtering effects of a plasma, to remove any surface oxide layers. Such a contact etching stage can improve the ohmic contact between the underlying conducting surface 614 and the shutter material. After patterning of the sacrificial layer 613, any photoresist layers or hard masks can be removed through use of either solvent cleaning or acid etching.

Figure 6C:
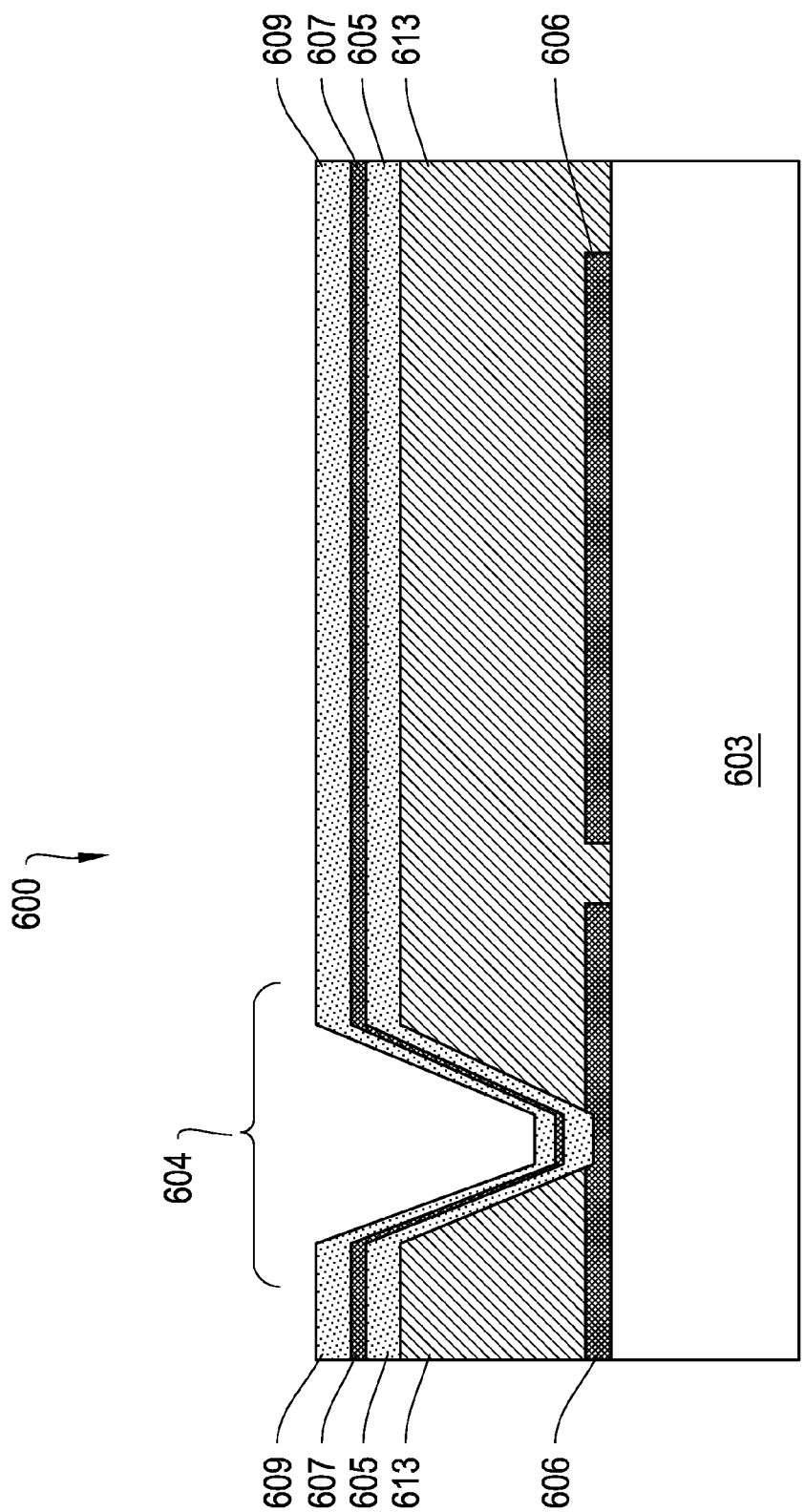

Next, in the process for building the shutter assembly 600, as depicted in FIG. 6C, the shutter materials are deposited. The shutter assembly 600 is composed of multiple thin films: the first mechanical layer 605, the conductor layer 607 and the second mechanical layer 609. In some implementations, the first mechanical layer 605 is an amorphous silicon (a-Si) layer, the conductor layer 607 is Al and the second mechanical layer 609 is a-Si. The first mechanical layer 605, the conductor layer 607, and the second mechanical layer 609 are deposited at a temperature which is below that at which physical degradation occurs for the sacrificial layer 613. For instance, polyimide decomposes at temperatures above about 400° C. Therefore, in some implementations, the first mechanical layer 605, the conductor layer 607 and the second mechanical layer 609 are deposited at temperatures below about 400° C., allowing usage of polyimide as a sacrificial layer material. In some implementations, hydrogenated amorphous silicon (a-Si:H) is a useful mechanical material for the first and second mechanical layers 605 and 609 since it can be grown to thicknesses in the range of about 0.15 to about 3 microns, in a relatively stress-free state, by way of plasma-enhanced chemical vapor deposition (PECVD) from silane gas at temperatures in the range of about 250 to about 350° C. In some of such implementations, phosphine gas ($PH_3$) is used as a dopant so that the a-Si can be grown with resistivities below about 1 ohm-cm. In alternate implementations, a similar PECVD technique can be used for the deposition of $Si_3N_4$, silicon-rich $Si_3N_4$, or $SiO_2$ materials as the first mechanical layer 605 or for the deposition of diamond-like carbon, Ge, SiGe, CdTe, or other semiconducting materials for the first mechanical layer 605. An advantage of the PECVD deposition technique is that the deposition can be quite conformal, that is, it can coat a variety of inclined surfaces or the inside surfaces of narrow via holes. Even if the anchor or via holes which are cut into the sacrificial layer material present nearly vertical sidewalls, the PECVD technique can provide a substantially continuous coating between the bottom and top horizontal surfaces of the anchor.

In addition to the PECVD technique, alternate suitable techniques available for the growth of the first and second mechanical layers 605 and 609 include RF or DC sputtering, metal-organic CVD, evaporation, electroplating or electroless plating.

For the conductor layer 607, in some implementations, a metal thin film, such as Al, is utilized. In some other implementations, alternative metals, such as Cu, Ni, Mo, or Ta can be chosen. The inclusion of such a conducting material serves two purposes. It reduces the overall sheet resistance of the shutter 601, and it helps to block the passage of visible light through the shutter 601, since a-Si, if less than about 2 microns thick, as may be used in some implementations of the shutter 601, can transmit visible light to some degree. The conducting material can be deposited either by sputtering or, in a more conformal fashion, by CVD techniques, electroplating, or electroless plating.

Figure 6D:
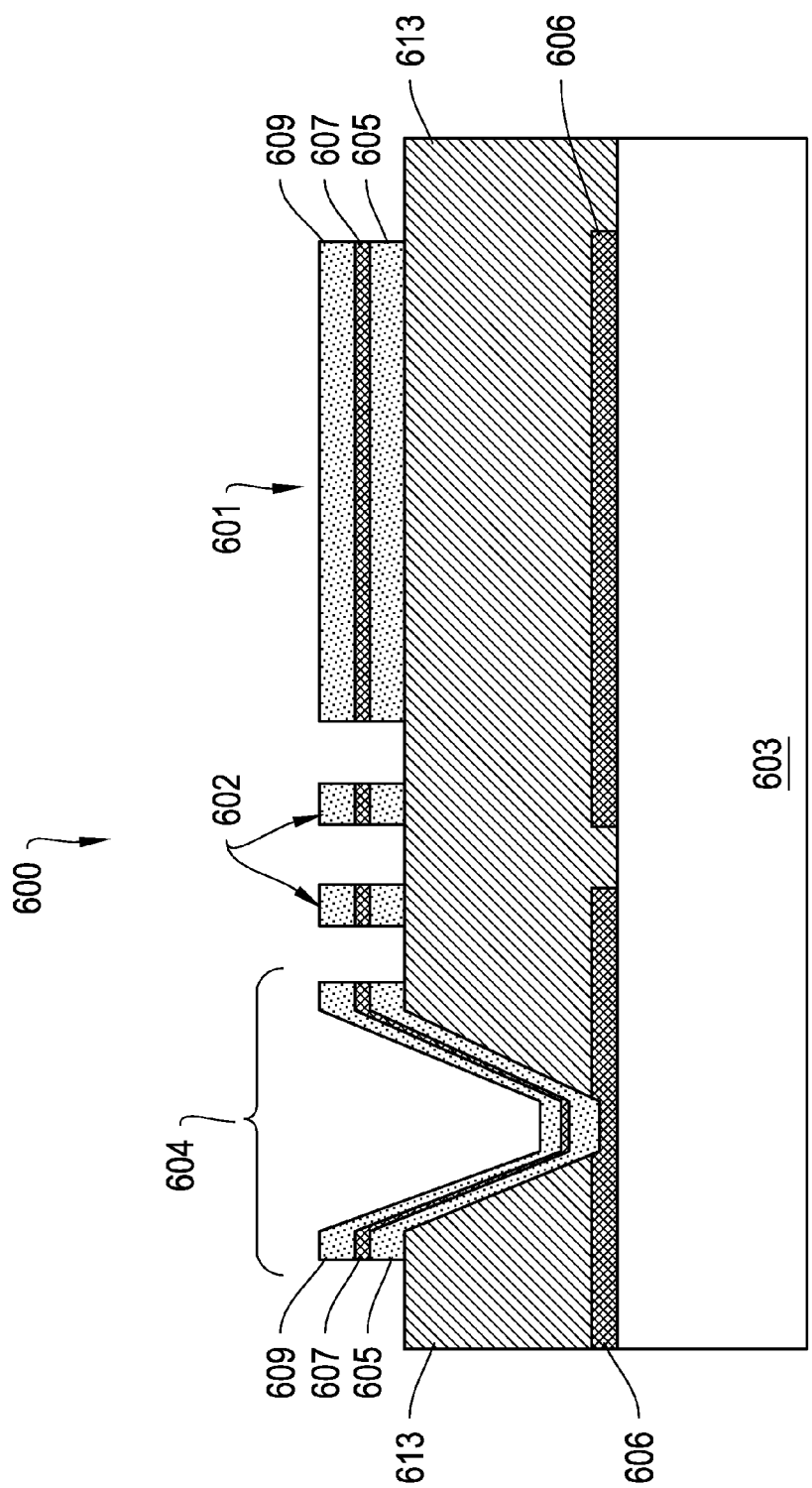

FIG. 6D shows the results of the next set of processing stages used in the formation of the shutter assembly 600. The first mechanical layer 605, the conductor layer 607, and the second mechanical layer 609 are photomasked and etched while the sacrificial layer 613 is still on the substrate 603. First, a photoresist material is applied, then exposed through a photomask, and then developed to form an etch mask. Amorphous silicon, $Si_3N_4$, and $SiO_2$ can then be etched in fluorine-based plasma chemistries. $SiO_2$ mechanical layers also can be etched using HF wet chemicals; and any metals in the conductor layer 607 can be etched with either wet chemicals or chlorine-based plasma chemistries.

The pattern shapes applied through the photomask can influence the mechanical properties, such as stiffness, compliance, and the voltage response in the actuator and shutter 601 of the shutter assembly 600. The shutter assembly 600 includes the compliant beams 602, shown in cross section. Each compliant beam 602 is shaped such that the width is less than the total height or thickness of the shutter material. In some implementations, the beam dimensional ratio is maintained at about 1.4:1 or greater, with the compliant beams 602 being taller or thicker than they are wide.

Figure 6E:
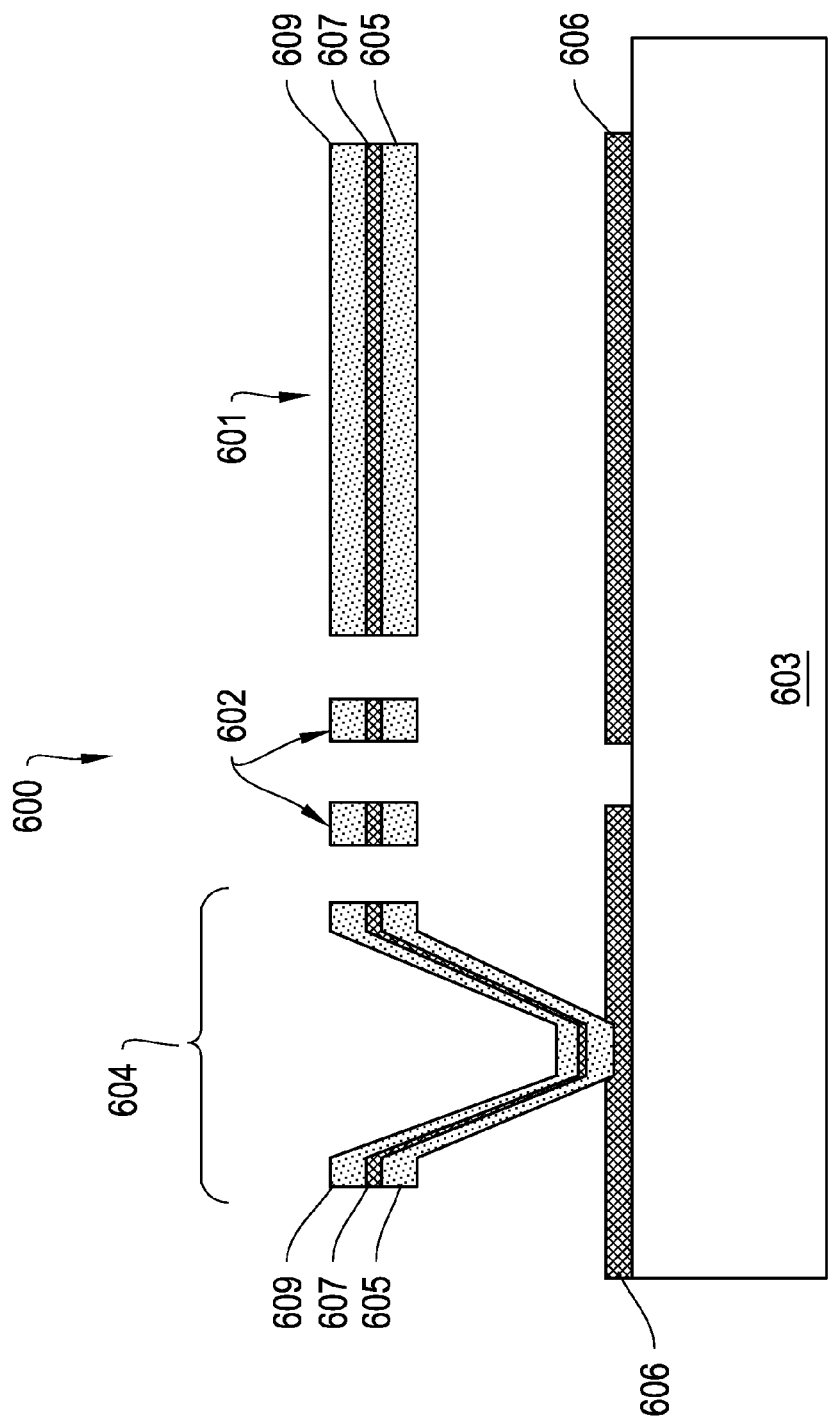

The results of subsequent stages of the example manufacturing process for building the shutter assembly 600 are depicted in FIG. 6E. The sacrificial layer 613 is removed, which frees-up all moving parts from the substrate 603, except at the anchor points. In some implementations, polyimide sacrificial materials are removed in an oxygen plasma. Other polymer materials used for the sacrificial layer 613 also can be removed in an oxygen plasma, or in some cases by thermal pyrolysis. Some sacrificial layer materials (such as $SiO_2$) can be removed by wet chemical etching or by vapor phase etching.

In a final process, the results of which are depicted in FIG. 6A, the encapsulating dielectric 611 is deposited on all exposed surfaces of the shutter assembly 600. In some implementations, the encapsulating dielectric 611 can be applied in a conformal fashion, such that all bottom, top, and side surfaces of the shutter 601 and the beams 602 are uniformly coated using CVD. In some other implementations, only the top and side surfaces of the shutter 601 are coated. In some implementations, $Al_2O_3$ is used for the encapsulating dielectric 611 and is deposited by atomic layer deposition to thicknesses in the range of about 10 to about 100 nanometers.

Finally, anti-stiction coatings can be applied to the surfaces of the shutter 601 and the beams 602. These coatings prevent the unwanted stickiness or adhesion between two independent beams of an actuator. Suitable coatings include carbon films (both graphite and diamond-like) as well as fluoropolymers, and/or low vapor pressure lubricants, as well as chlorosilanes, hydrocarbon chlorosilanes, fluorocarbon chlorosilanes, such as methoxy-terminated silanes, perfluoronated, amino-silanes, siloxanes and carboxylic acid based monomers and species. These coatings can be applied by either exposure to a molecular vapor or by decomposition of precursor compounds by way of CVD. Anti-stiction coatings also can be created by the chemical alteration of shutter surfaces, such as by fluoridation, silanization, siloxidation, or hydrogenation of insulating surfaces.

One class of suitable actuators for use in MEMS-based shutter displays include compliant actuator beams for controlling shutter motion that is transverse to or in-the-plane of the display substrate. The voltage employed for the actuation of such shutter assemblies decreases as the actuator beams become more compliant. The control of actuated motion also improves if the beams are shaped such that in-plane motion is preferred or promoted with respect to out-of-plane motion. Thus, in some implementations, the compliant actuator beams have a rectangular cross section, such that the beams are taller or thicker than they are wide.

The stiffness of a long rectangular beam with respect to bending within a particular plane scales with the thinnest dimension of that beam in that plane to the third power. It is therefore advantageous to reduce the width of the compliant beams to reduce the actuation voltages for in-plane motion. When using conventional photolithography equipment to define and fabricate the shutter and actuator structures, however, the minimum width of the beams can be limited to the resolution of the optics. And although photolithography equipment has been developed for defining patterns in photoresist with narrow features, such equipment is expensive, and the areas over which patterning can be accomplished in a single exposure are limited. For economical photolithography over large panels of glass or other transparent substrates, the patterning resolution or minimum feature size is typically limited to several microns.

FIGS. 7A-7D show isometric views of stages of construction of an example shutter assembly 700 with narrow sidewall beams. This alternate process yields compliant actuator beams 718 and 720 and a compliant spring beam 716 (collectively referred to as "sidewall beams 716, 718 and 720"), which have a width well below the conventional lithography limits on large glass panels. In the process depicted in FIGS. 7A-7D, the compliant beams of shutter assembly 700 are formed as sidewall features on a mold made from a sacrificial material. The process is referred to as a sidewall beams process.

Figure 7A:
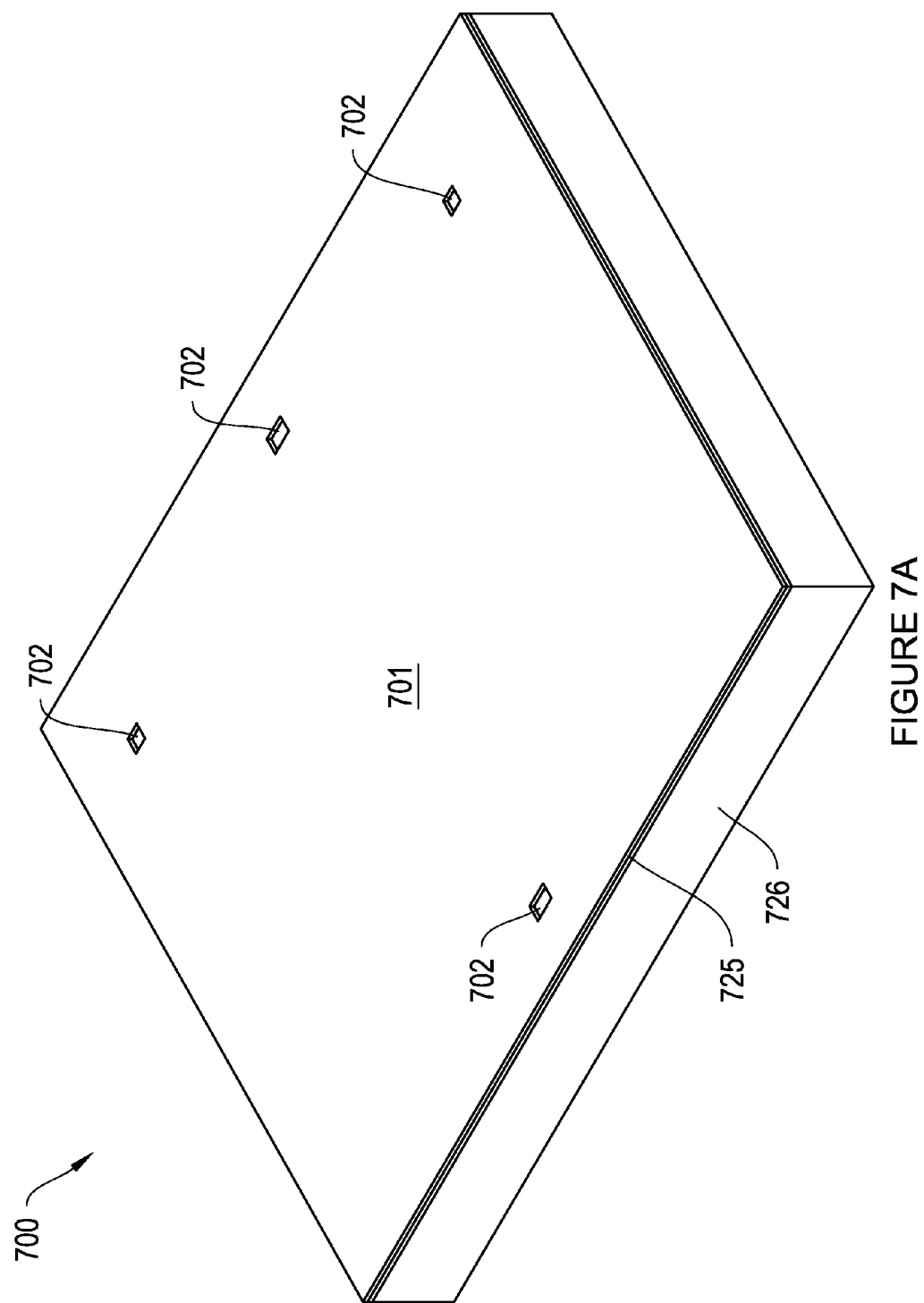
FIGS. 7A-7D show isomeric views of stages of construction of an example shutter assembly with narrow sidewall beams.

The process of forming the shutter assembly 700 with the sidewall beams 716, 718 and 720 begins, as depicted in FIG. 7A, with the deposition and patterning of a first sacrificial material 701. The pattern defined in the first sacrificial material 701 creates openings or vias 702 within which anchors for the shutter assembly 700 eventually will be formed. The deposition and patterning of the first sacrificial material 701 is similar in concept, and uses similar materials and techniques, as those described for the deposition and patterning described in relation to FIGS. 6A-6E.

Figure 7B:
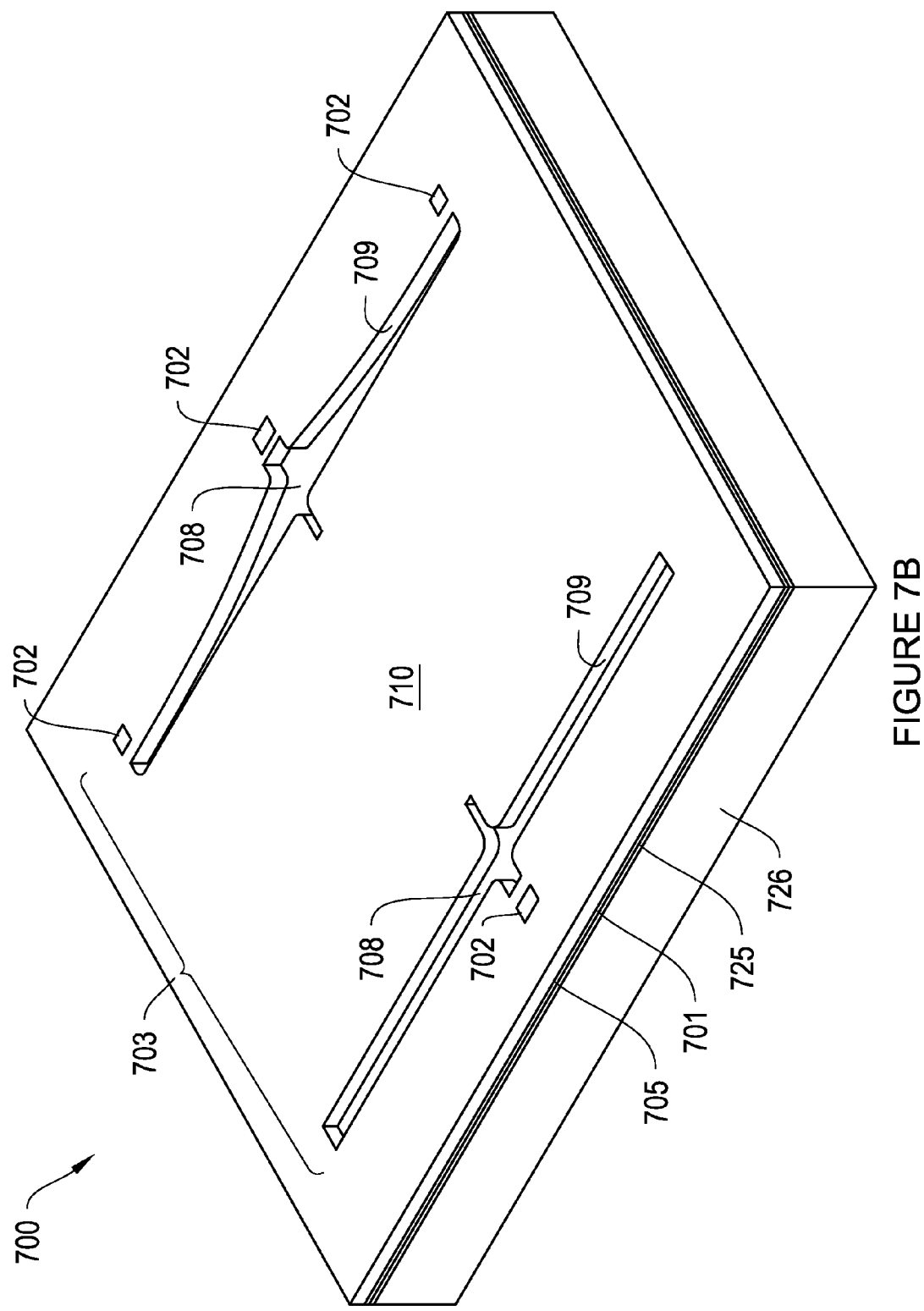

The process of forming the sidewall beams 716, 718 and 720 continues with the deposition and patterning of a second sacrificial material 705. FIG. 7B shows the shape of a mold 703 that is created after patterning of the second sacrificial material 705. The mold 703 also includes the first sacrificial material 701 with its previously defined vias 702. The mold 703 in FIG. 7B includes two distinct horizontal levels. The bottom horizontal level 708 of the mold 703 is established by the top surface of the first sacrificial layer 701 and is accessible in those areas where the second sacrificial material 705 has been etched away. The top horizontal level 710 of the mold 703 is established by the top surface of the second sacrificial material 705. The mold 703 depicted in FIG. 7B also includes substantially vertical sidewalls 709. Materials for use as the first and second sacrificial materials 701 and 705 are described above with respect to the sacrificial layer 613 of FIGS. 6A-6E.

Figure 7C:
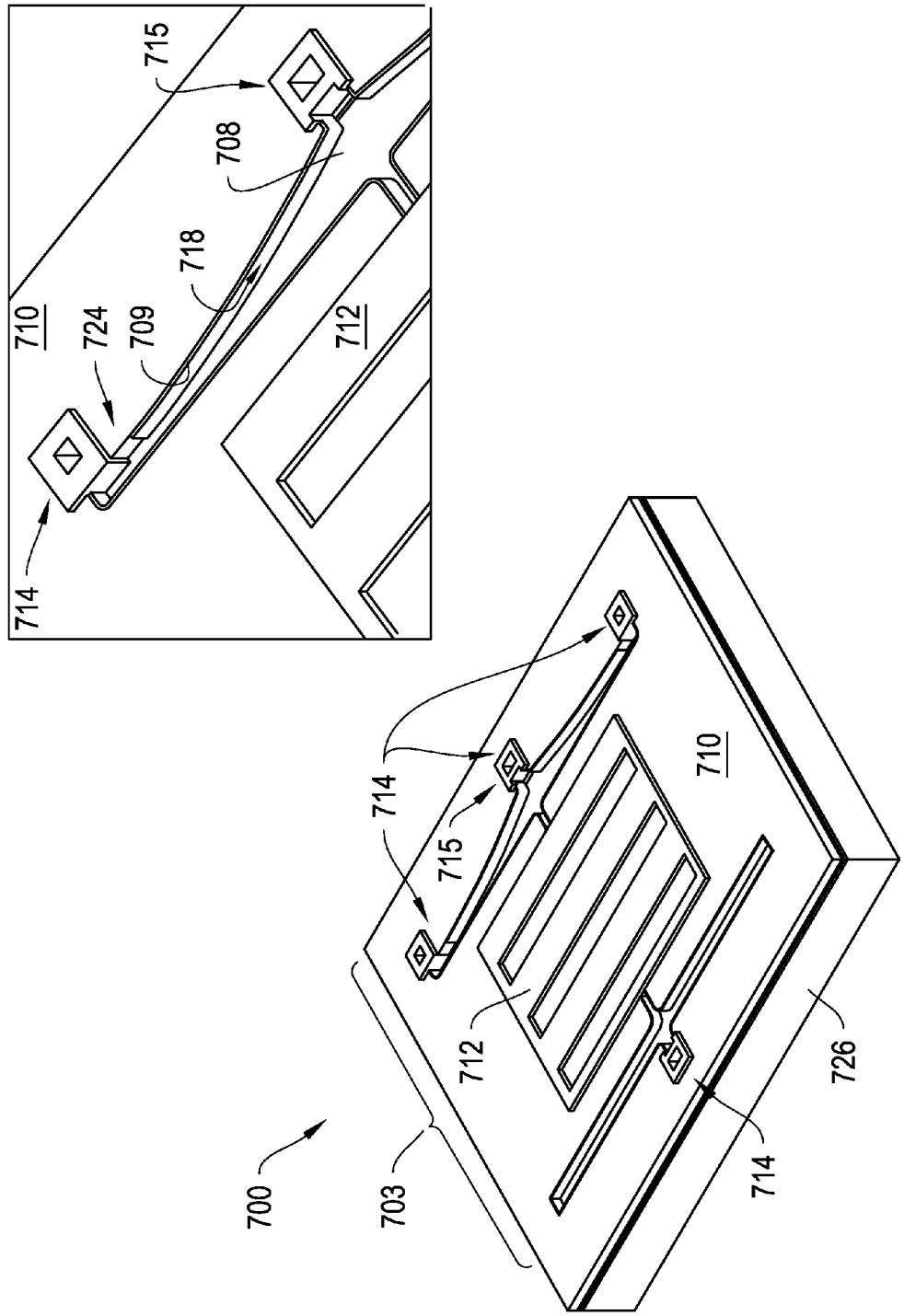

The process of forming the sidewall beams 716, 718 and 720 continues with the deposition and patterning of shutter material onto all of the exposed surfaces of the sacrificial mold 703, as depicted in FIG. 7C. Suitable materials for use in forming the shutter 712 are described above with respect to the first mechanical layer 605, the conductor layer 607, and the second mechanical layer 609 of FIGS. 6A-6E. The shutter material is deposited to a thickness of less than about 2 microns. In some implementations, the shutter material is deposited to have a thickness of less than about 1.5 microns. In some other implementations, the shutter material is deposited to have a thickness of less than about 1.0 microns, and as thin as about 0.10 microns. After deposition, the shutter material (which may be a composite of several materials as described above) is patterned, as depicted in FIG. 7C. First, a photoresist is deposited on the shutter material. The photoresist is then patterned. The pattern developed into the photoresist is designed such that the shutter material, after a subsequent etch stage, remains in the region of the shutter 712 as well as at the anchors 714.

The manufacturing process continues with applying an anisotropic etch, resulting in the structure depicted in FIG. 7C. The anisotropic etch of the shutter material is carried out in a plasma atmosphere with a voltage bias applied to the substrate 726 or to an electrode in proximity to the substrate 726. The biased substrate 726 (with electric field perpendicular to the surface of the substrate 726) leads to acceleration of ions toward the substrate 726 at an angle nearly perpendicular to the substrate 726. Such accelerated ions, coupled with the etching chemicals, lead to etch rates that are much faster in a direction that is normal to the plane of the substrate 726 as compared to directions parallel to the substrate 726. Undercut-etching of shutter material in the regions protected by a photoresist is thereby substantially eliminated. Along the vertical sidewalls 709 of the mold 703, which are substantially parallel to the track of the accelerated ions, the shutter material also is substantially protected from the anisotropic etch. Such protected sidewall shutter material form the sidewall beams 716, 718, and 720 for supporting the shutter 712. Along other (non-photoresist-protected) horizontal surfaces of the mold 703, such as the top horizontal surface 710 or the bottom horizontal surface 708, the shutter material has been substantially completely removed by the etch.

The anisotropic etch used to form the sidewall beams 716, 718 and 720 can be achieved in either an RF or DC plasma etching device as long as provision for electrical bias of the substrate 726 or of an electrode in close proximity of the substrate 726 is supplied. For the case of RF plasma etching, an equivalent self-bias can be obtained by disconnecting the substrate holder from the grounding plates of the excitation circuit, thereby allowing the substrate potential to float in the plasma. In some implementations, it is possible to provide an etching gas such as trifluoromethane ($CHF_3$), perfluorobutene ($C_4F_8$), or chloroform ($CHCl_3$) in which both carbon and hydrogen and/or carbon and fluorine are constituents in the etch gas. When coupled with a directional plasma, achieved again through voltage biasing of the substrate 726, the liberated carbon (C), hydrogen (H), and/or fluorine (F) atoms can migrate to the vertical sidewalls 709 where they build up a passive or protective quasi-polymer coating. This quasi-polymer coating further protects the sidewall beams 716, 718 and 720 from etching or chemical attack.

Figure 7D:
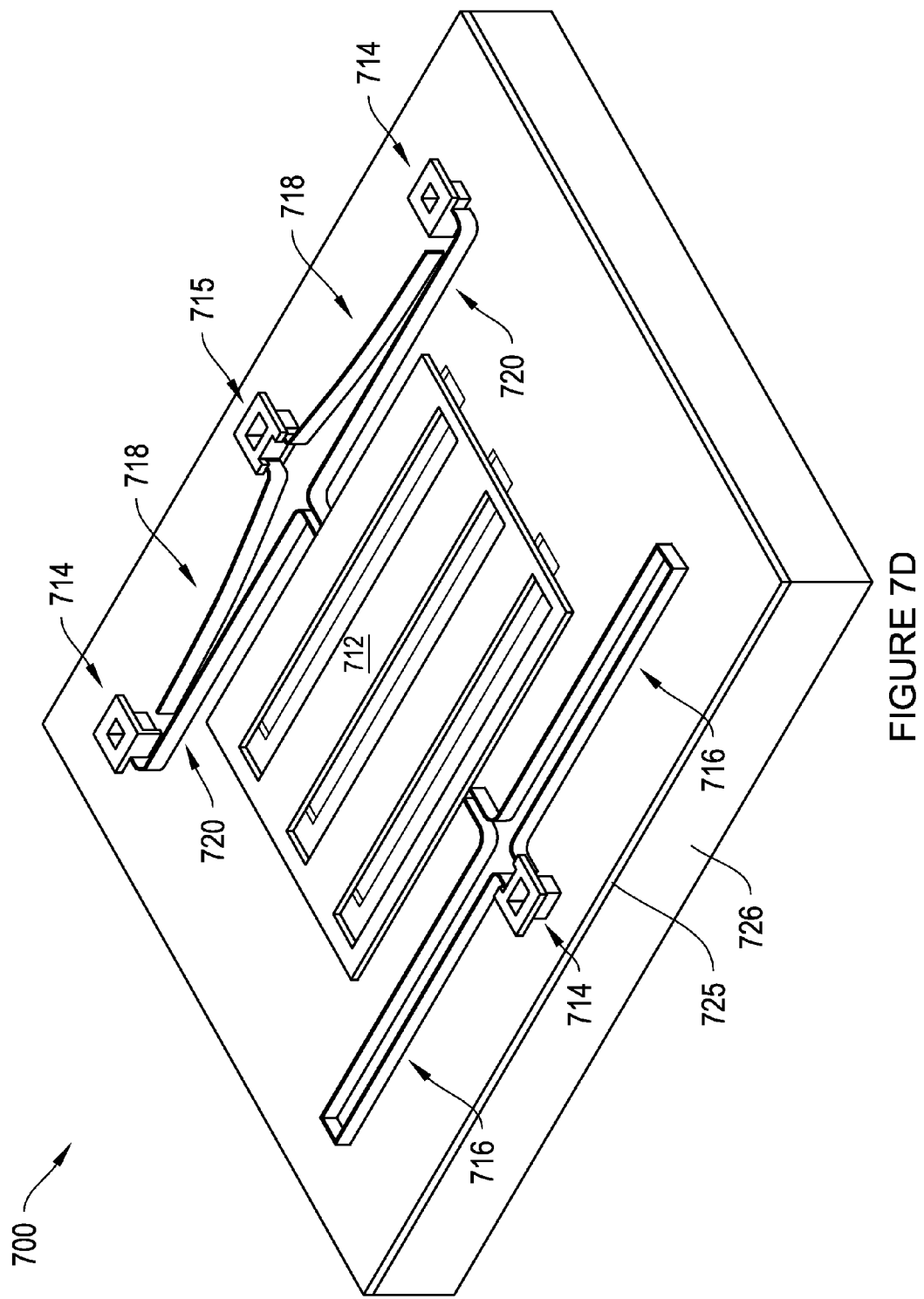

The process of forming the sidewall beams 716, 718 and 720 is completed with the removal of the remainder of the second sacrificial material 705 and the first sacrificial material 701. The result is shown in FIG. 7D. The process of removing sacrificial material is similar to that described with respect to FIG. 6E. The material deposited on the vertical sidewalls 709 of the mold 703 remain as the sidewall beams 716, 718 and 720. The sidewall beam 716 serves as a spring mechanically connecting the anchors 714 to the shutter 712, and also provides a passive restoring force and to counter the forces applied by the actuator formed from the compliant beams 718 and 720. The anchors 714 connect to an aperture layer 725. The sidewall beams 716, 718 and 720 are tall and narrow. The width of the sidewall beams 716, 718 and 720, as formed from the surface of the mold 703, is similar to the thickness of the shutter material as deposited. In some implementations, the width of sidewall beam 716 will be the same as the thickness of shutter 712. In some other implementations, the beam width will be about ½ the thickness of the shutter 712. The height of the sidewall beams 716, 718 and 720 is determined by the thickness of the second sacrificial material 705, or in other words, by the depth of the mold 703, as created during the patterning operation described in relation to FIG. 7B. As long as the thickness of the deposited shutter material is chosen to be less than about 2 microns, the process depicted in FIGS. 7A-7D is well suited for the production of narrow beams. In fact, for many applications the thickness range of 0.1 to 2.0 micron is quite suitable. Conventional photolithography would limit the patterned features shown in FIGS. 7A, 7B and 7C to much larger dimensions, for instance allowing minimum resolved features no smaller than 2 microns or 5 microns.

FIG. 7D depicts an isomeric view of the shutter assembly 700, formed after the release operation in the above-described process, yielding compliant beams with cross sections of high aspect ratios. As long as the thickness of the second sacrificial material 705 is, for example, greater than about 4 times larger than the thickness of the shutter material, the resulting ratio of beam height to beam width will be produced to a similar ratio, i.e., greater than about 4:1.

An optional stage, not illustrated above but included as part of the process leading to FIG. 7C, involves isotropic etching of the sidewall beam material to separate or decouple the compliant load beams 720 from the compliant drive beams 718. For instance, the shutter material at point 724 has been removed from the sidewall through use of an isotropic etch. An isotropic etch is one whose etch rate is substantially the same in all directions, so that sidewall material in regions such as point 724 is no longer protected. The isotropic etch can be accomplished in the typical plasma etch equipment as long as a bias voltage is not applied to the substrate 726. An isotropic etch also can be achieved using wet chemical or vapor phase etching techniques. Prior to this optional fourth masking and etch stage, the sidewall beam material exists essentially continuously around the perimeter of the recessed features in the mold 703. The fourth mask and etch stage is used to separate and divide the sidewall material, forming the distinct beams 718 and 720. The separation of the beams 718 and 720 at point 724 is achieved through a fourth process of photoresist dispense, and exposure through a mask. The photoresist pattern in this case is designed to protect the sidewall beam material against isotropic etching at all points except at the separation point 724.

As a final stage in the sidewall process, an encapsulating dielectric is deposited around the outside surfaces of the sidewall beams 716, 718 and 720.

In order to protect the shutter material deposited on the vertical sidewalls 709 of the mold 703 and to produce the sidewall beams 716, 718 and 720 of substantially uniform cross section, some particular process guidelines can be followed. For instance, in FIG. 7B, the sidewalls 709 can be made as vertical as possible. Slopes at the vertical sidewalls 709 and/or exposed surfaces become susceptible to the anisotropic etch. In some implementations, the vertical sidewalls 709 can be produced by the patterning operation at FIG. 7B, such as the patterning of the second sacrificial material 705 in an anisotropic fashion. The use of an additional photoresist coating or a hard mask in conjunction with patterning of the second sacrificial layer 705 allows the use of aggressive plasmas and/or high substrate bias in the anisotropic etch of the second sacrificial material 705 while mitigating against excessive wear of the photoresist. The vertical sidewalls 709 also can be produced in photoimageable sacrificial materials as long as care is taken to control the depth of focus during the UV exposure and excessive shrinkage is avoided during final cure of the resist.

Another process guideline that helps during sidewall beam processing relates to the conformality of the shutter material deposition. The surfaces of the mold 703 can be covered with similar thicknesses of the shutter material, regardless of the orientation of those surfaces, either vertical or horizontal. Such conformality can be achieved when depositing with CVD. In particular, the following conformal techniques can be employed: PECVD, low pressure chemical vapor deposition (LPCVD), and atomic or self-limited layer deposition (ALD). In the above CVD techniques the growth rate of the thin film can be limited by reaction rates on a surface as opposed to exposing the surface to a directional flux of source atoms. In some implementations, the thickness of material grown on vertical surfaces is at least 50% of the thickness of material grown on horizontal surfaces. Alternatively, shutter materials can be conformally deposited from solution by electroless plating or electroplating, after a metal seed layer is provided that coats the surfaces before plating.

The process leading to the shutter assembly 700 in FIG. 7D was a four-mask process, meaning the process incorporated four distinct photolithography stages in which a photo-sensitive polymer is exposed by illuminating a desired pattern through a photomask. The photolithography stages, also known as masking steps, are amongst the most expensive in the manufacture of MEMS devices, and so it is desirable to create a manufacturing process with a reduced number of masking stages.

Figure 8A:
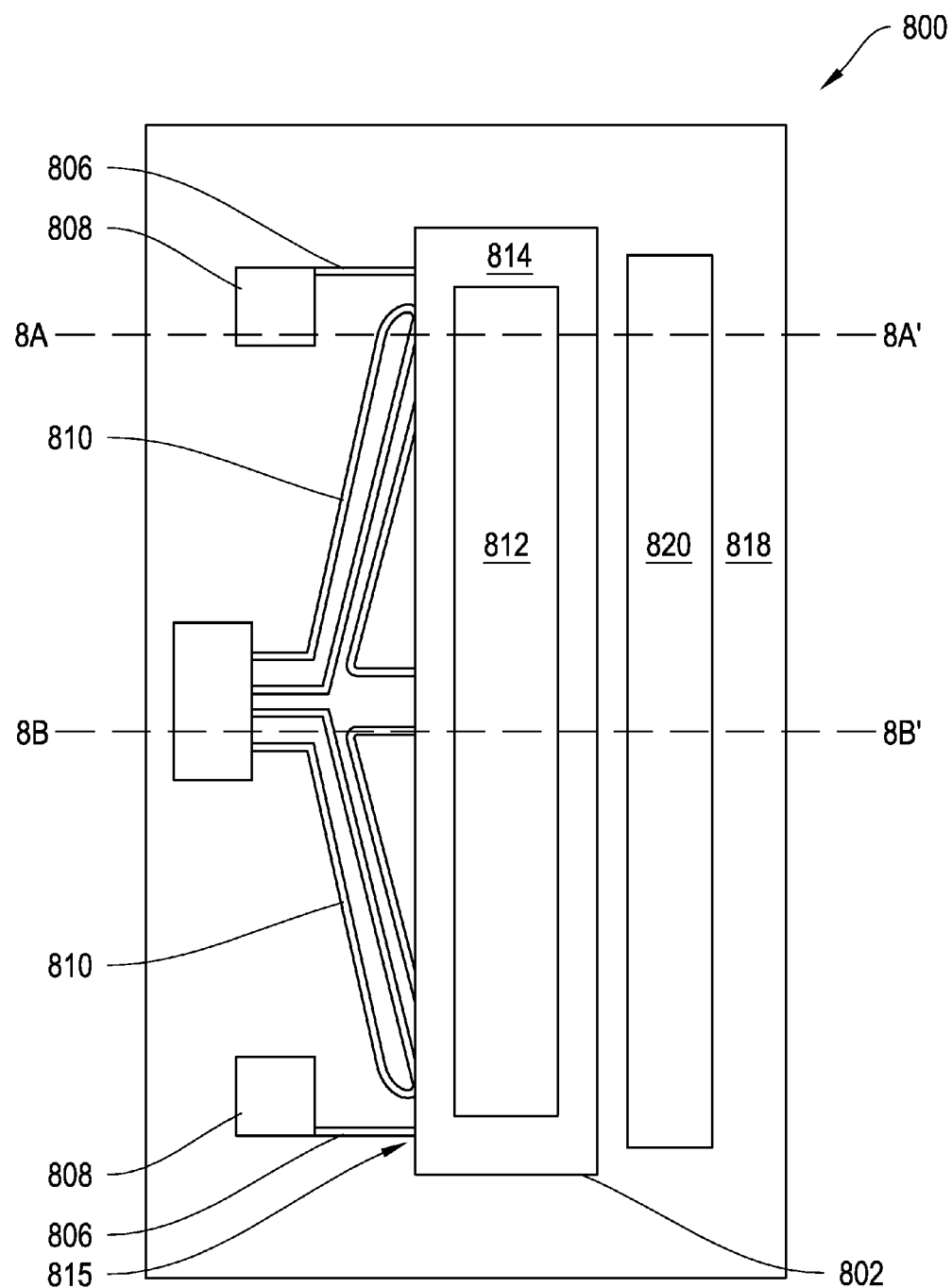
FIGS. 8A-8D show various views of an example shutter assembly.
Figure 8B:
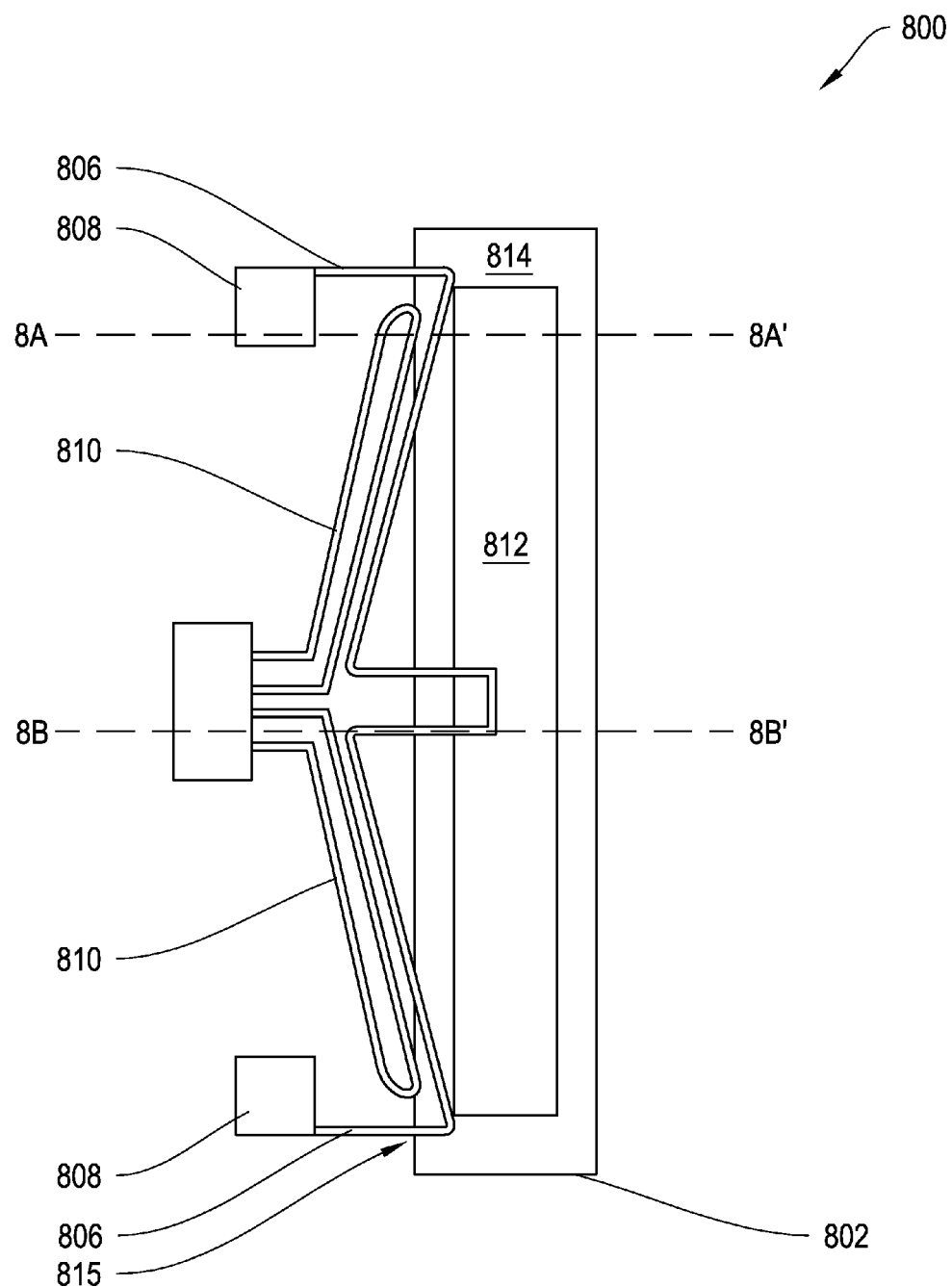
Figure 8C:
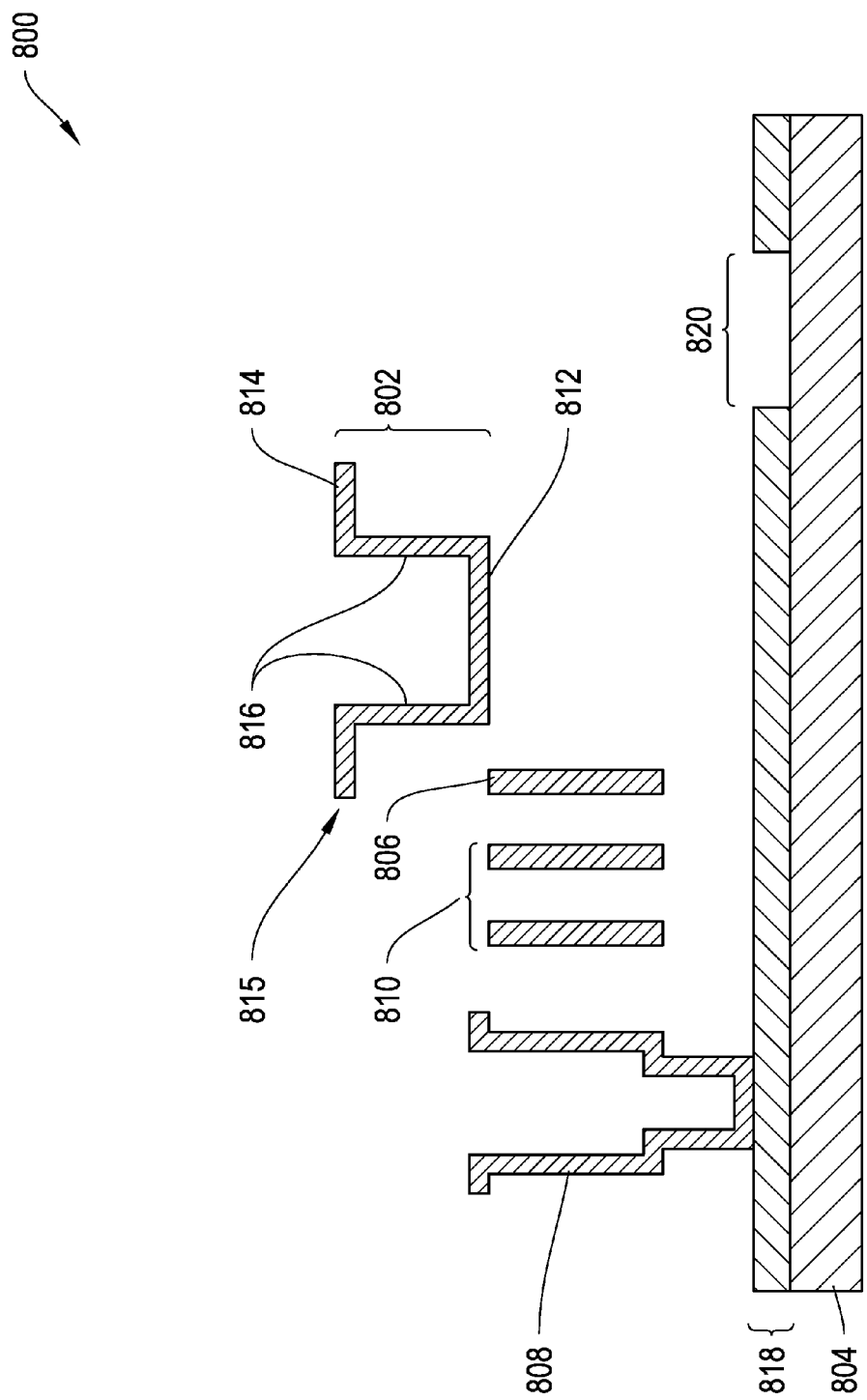
Figure 8D:
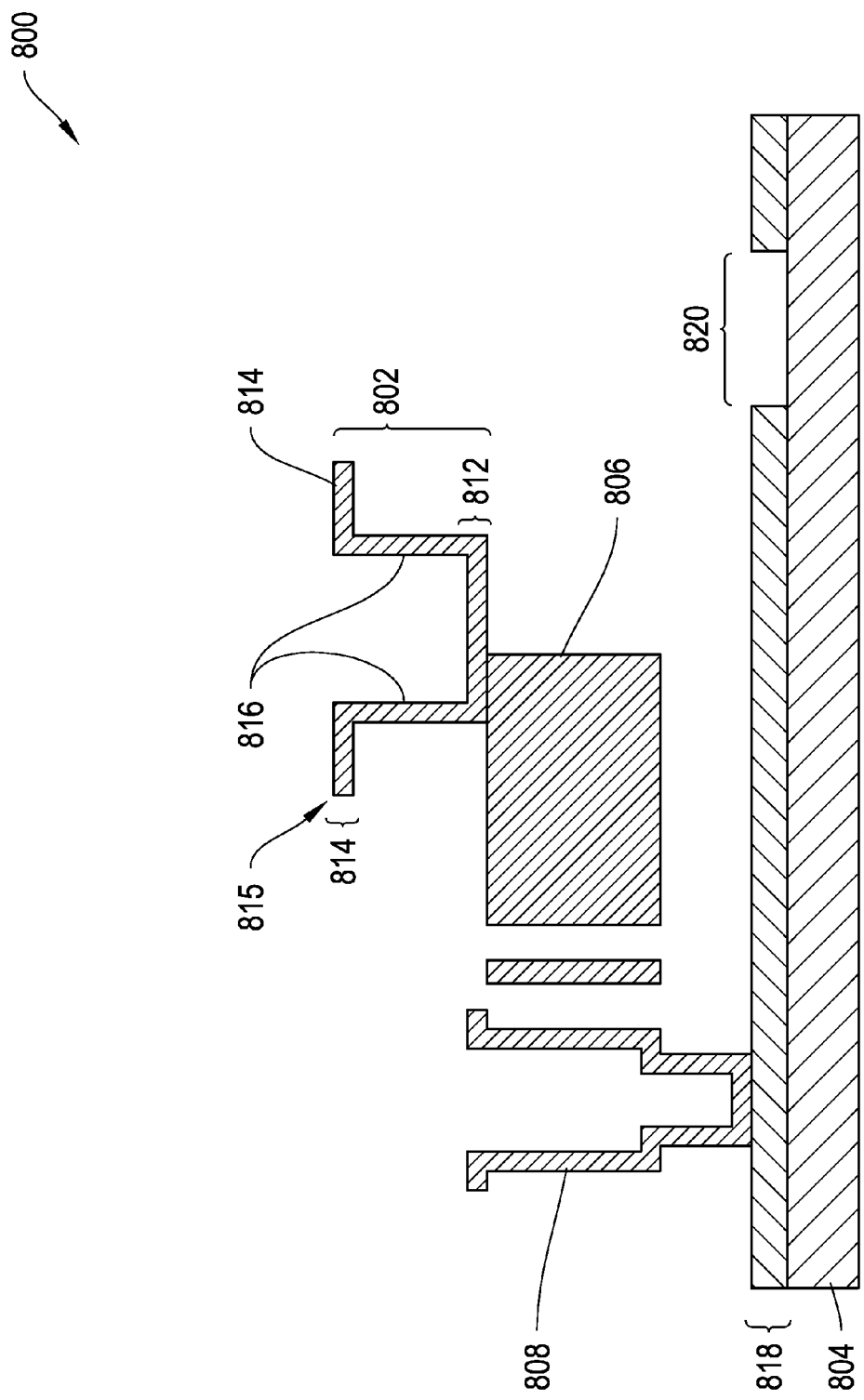

FIGS. 8A-8D show an illustrative shutter assembly 800. FIG. 8A shows a top view of the shutter assembly 800. FIG. 8B shows a bottom view of the shutter assembly 800. FIGS. 8C and 8D show cross sectional views of the shutter assembly 800. Specifically, FIG. 8C shows a cross-sectional view along line 8A-8A' shown in FIGS. 8A and 8B, and FIG. 8D shows a cross-sectional view along line 8B-8B', also shown in FIGS. 8A and 8B.

Referring to FIGS. 8A-8D, the shutter assembly includes a shutter 802 suspended over a substrate 804. The shutter 802 is supported by a pair of load beams 806, coupled to an anchor 808, which extends away from the substrate 804. A pair of looped drive beams 810 are positioned adjacent the pair of load beams 806. Together, the load beams 806 and the drive beams 810 form opposing electrodes of an electrostatic actuator.

The shutter 802 includes two levels, a proximal level 812 and a distal level 814, that are substantially parallel to the substrate 804. The proximal level 812 is closer to the substrate 804 than the distal level 814. In addition, the distal level 814 has an edge 815 that is closer to the anchor 808 than any edge of the proximal level 812. The proximal level 812 is connected to the distal level 814 by a set of sidewalls 816. The set of sidewalls 816, combined with the proximal level 812, form a substantially rectangular protrusion extending down from the distal level 814.

The substrate 804 includes a light blocking layer 818. Apertures 820 are defined through the light blocking layer 818. The shutter assembly 800 modulates the light passing through or directed towards the aperture 820 by controlling the actuator to selectively move the shutter 802 into or out of position over the aperture 820.

The load beams 806 connect to the proximal level 812 of the shutter 802. In some implementations, as shown in FIG. 8D, the load beams 806 connect to the side of the proximal level 812 closest to the substrate 804. As such, when the actuator is in the actuated state, as shown in each of FIGS. 8A-8D, an edge of the distal level 814 of the shutter 802 is able to pass over and above portions of the load beam 806 and portions of the drive beam 810. As a result of being able to pass over portions of the load beams 806, less room needs to be allocated for the actuator, allowing for smaller shutter assemblies, increased shutter assembly density, and therefore greater display resolution.

While the shutter assembly 800 includes only one actuator, in some other implementations, a similar shutter assembly can include two actuators, with one opposing the other. In some other implementations, the shutter assembly 800 can include a shutter which includes one or more shutter apertures formed through its surface for selectively obstructing light passing through two or more apertures formed in an underlying light blocking layer, similar to the shutter 406 shown in FIGS. 4A and 4B.

FIGS. 9A-9L show cross sectional views of example stages of fabrication of the shutter assembly shown in FIGS. 8A-8D. The cross section shown in FIGS. 9A-9L are taken along line 8A-8A' shown in FIGS. 8A and 8B.

Figure 9A:
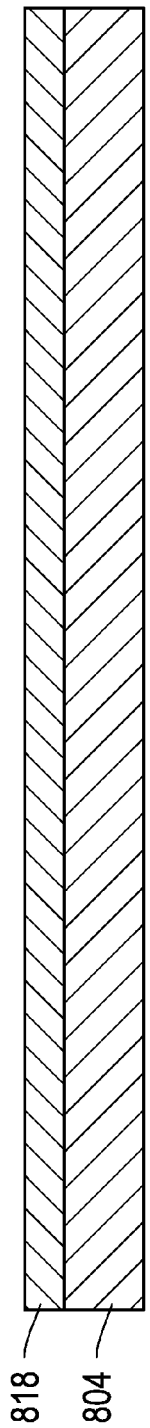

FIG. 9A shows a cross sectional view of the state of construction of the shutter assembly 800 after completion of several initial fabrication stages. FIG. 9A shows the transparent substrate 804 with the light blocking layer 818 deposited on it, prior to patterning of the light blocking layer 818. The light blocking layer 818 can be formed from or include one or more layers of material, including, depending on whether the shutter assembly is being fabricated for a display having a MEMS-up or MEMS-down configuration. For displays having a MEMS-up configuration, the light blocking layer includes a layer of light reflecting material for reflecting light towards the rear of the display and a light absorbing layer for light impinging on the front-facing surface of the light blocking layer 818. For displays having a MEMS-down configuration, the light blocking layer 818 may only include a layer of light absorbing material.

Figure 9B:
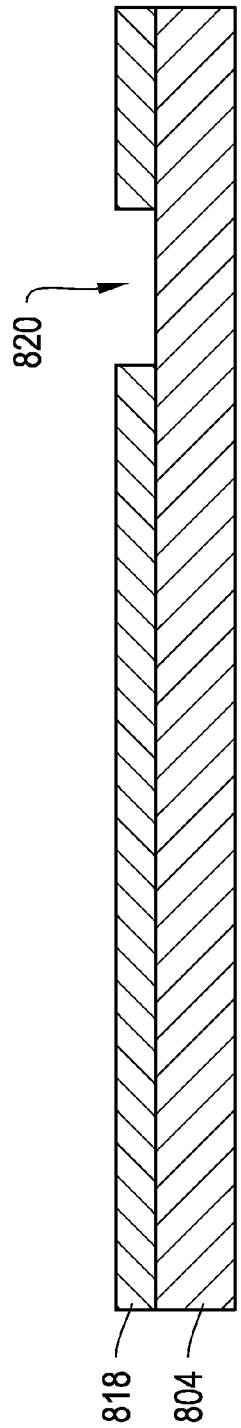

After the light blocking layer 818 is deposited on the transparent substrate 804, the light blocking layer 818 is patterned to define apertures, such as aperture 820, across its surface. Each aperture 820 corresponds to a respective shutter assembly 800. The apertures can be patterned using a variety of photolithographic techniques, depending on the composition of the light blocking layer 818. For example, for light blocking layers 818 formed from photoresist materials, the light blocking layer can be patterned by exposing portions of the light blocking layer 818 to ultraviolet light through a mask. The material can then be bathed in a developing agent, which removes the unwanted material. The result of this patterning stage is shown in FIG. 9B. In some other implementations, a separate mask formed from a resist may be applied and patterned. Exposed portions of the first layer of light blocking layer 818 may then be etched through the patterned mask using any suitable etching process, after which, the mask can be removed.

While not shown, in some implementations, several additional layers, including metal layers and inter-metal dielectric layers can be deposited on top of the light blocking layer 818 and are patterned. These additional layers form or include the control matrix that will control the shutter assembly when completed. In some other implementations, the additional metal and inter-metal dielectric layers may be deposited on the transparent substrate 804 and patterned prior to deposition of the light blocking layer 818.

Figure 9C:
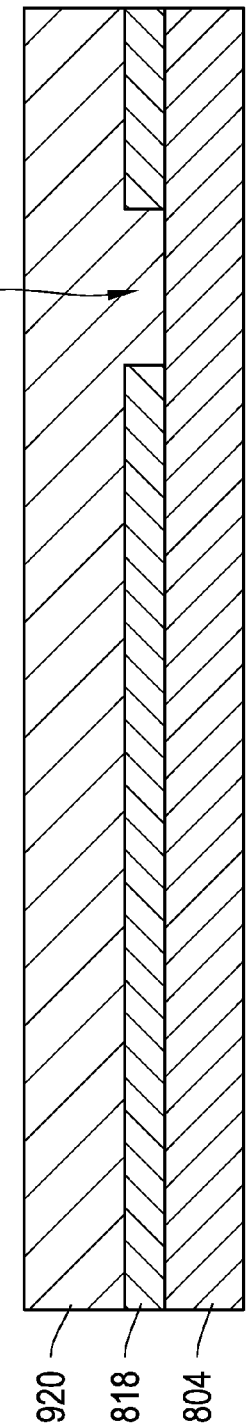

After the light blocking layer 818 is patterned, a first layer of sacrificial material 920 is deposited on top of the light blocking layer 818. Suitable materials for the first layer of sacrificial material 920 include any of the materials described above in relation to FIG. 6B for use as a sacrificial material. The first layer of sacrificial material 920 can be applied through a spin-on process to yield a substantially planar upper surface. In some implementations, the first layer of sacrificial material 920 is deposited to be about 2 to about 10 microns thick. In some implementations, the first layer of sacrificial material 920 is deposited to be about 3 to about 5 microns thick. FIG. 9C shows the state of construction of the shutter assembly 800 after the first layer of sacrificial material 920 has been deposited.

Next, the first layer of sacrificial material 920 is patterned to create a recess 922 that will eventually be coated with structural material to form the base of the anchor 808. The first layer of sacrificial material 920 is patterned by any of the sacrificial layer patterning processes described above in relation to FIG. 6B. The result of this stage of fabrication is shown in FIG. 9D.

Subsequently, a second layer of sacrificial material 924 is deposited on top of the first layer of sacrificial material 920. The second layer of sacrificial material 924 fills the recess 922 and forms a substantially planar upper surface. The second layer of sacrificial material 924 is deposited such that its upper surface is about 3 to about 10 microns above the upper surface of the first layer of sacrificial material 910. The second layer of sacrificial material 924 is then patterned, resulting in the fabrication state shown in FIG. 9E. As shown, a recess 926 is formed over of the region where the recess 922 was previously formed. The recess 926 reaches all the way down to a conductive pad (not shown) located beneath the first layer of sacrificial material that will couple the anchor 808 (when formed) to the underlying control matrix. Additional recesses 928 and 930 are formed to create mold features on which the actuators beams 806 and 810 will be formed.

Figure 9F:
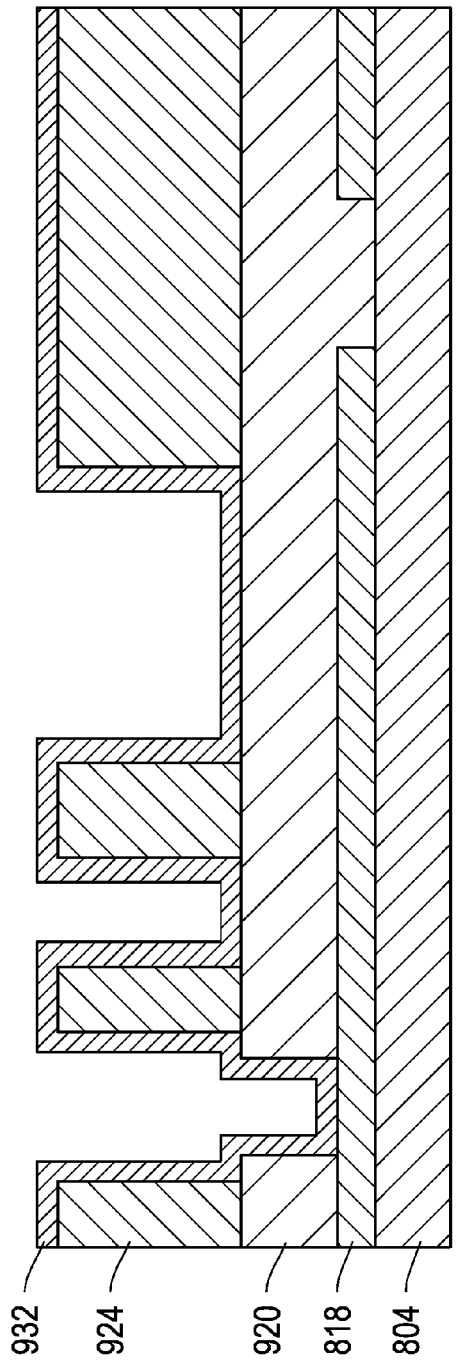

After the second layer of sacrificial material 924 is patterned, a layer of structural material 932 are deposited, yielding the structure shown in FIG. 9F. The structural material 932 can be deposited using a CVD, PECVD, PVD, or ALD process, substantially conformally coating the exposed surfaces of the first layer of sacrificial material 920, the second layer of sacrificial material 924, and the light blocking layer 818. The structural material 932 can include one or more layers of metal, dielectric, and/or semiconductor material, as described above in relation to FIG. 6C as being suitable shutter materials. The structural material 932 can be deposited to have a total thickness of less than about 2.0 microns.

Figure 9G:
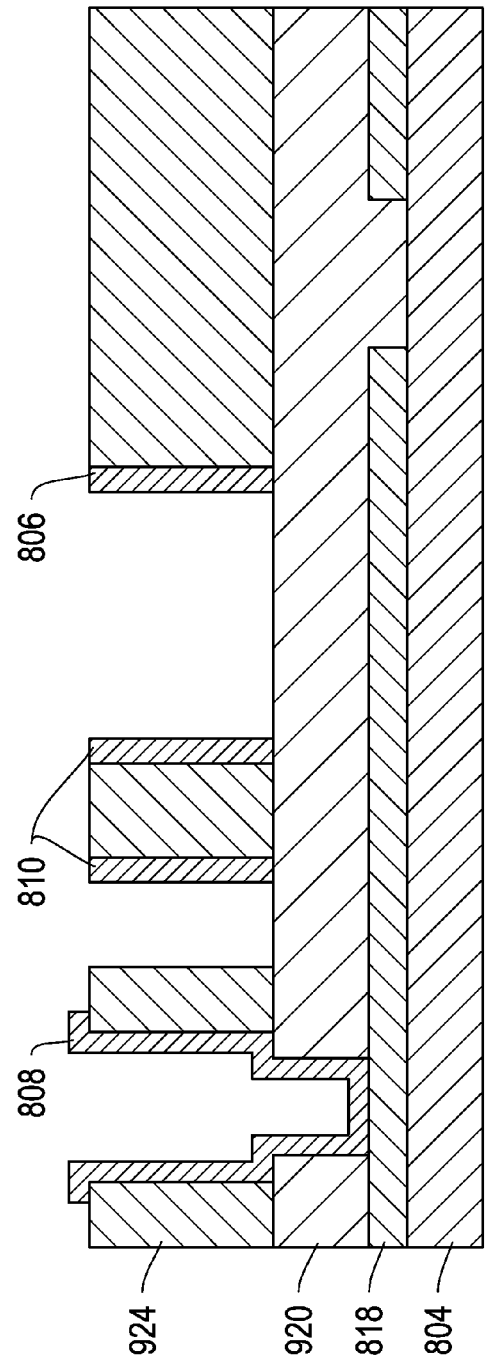

FIG. 9G shows the state of construction of the shutter assembly 800 after the layer of structural material 932 has been patterned. In some implementations, the layer of structural material 932 is patterned in a two-phase process. In the first stage, after an appropriate mask is applied, an anisotropic etch is applied to remove unwanted structural material deposited over the horizontal surfaces of the first and second layers of sacrificial material 920 and 924. Then, after a subsequent mask is applied, undesired materials remaining on the vertical side walls of the second layer of sacrificial material 924 can be removed using a isotropic etch. In some other implementations, the layer of structural material 932 can be patterned in a single-phase etch.

Figure 9H:
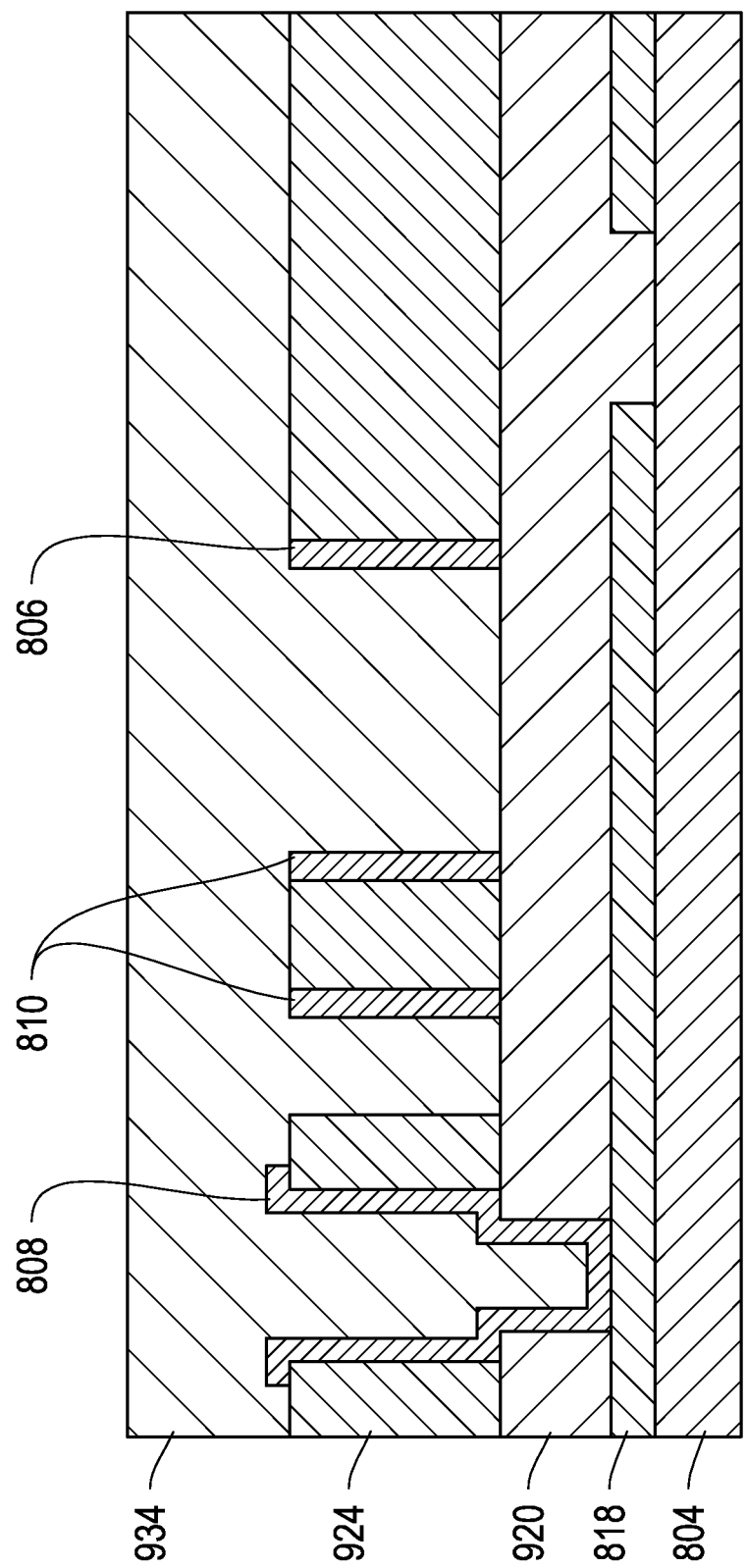
Figure 9I:
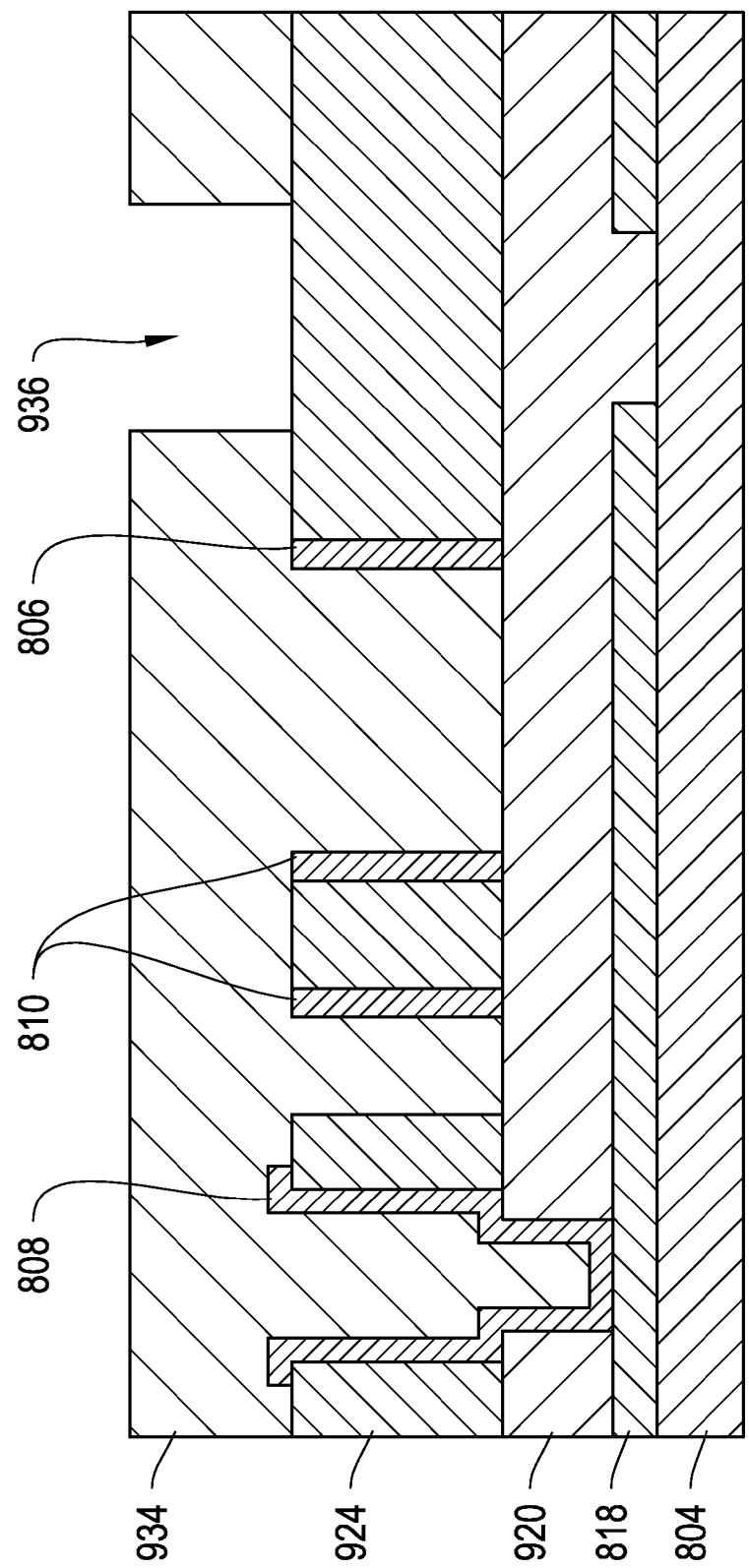
Figure 9J:
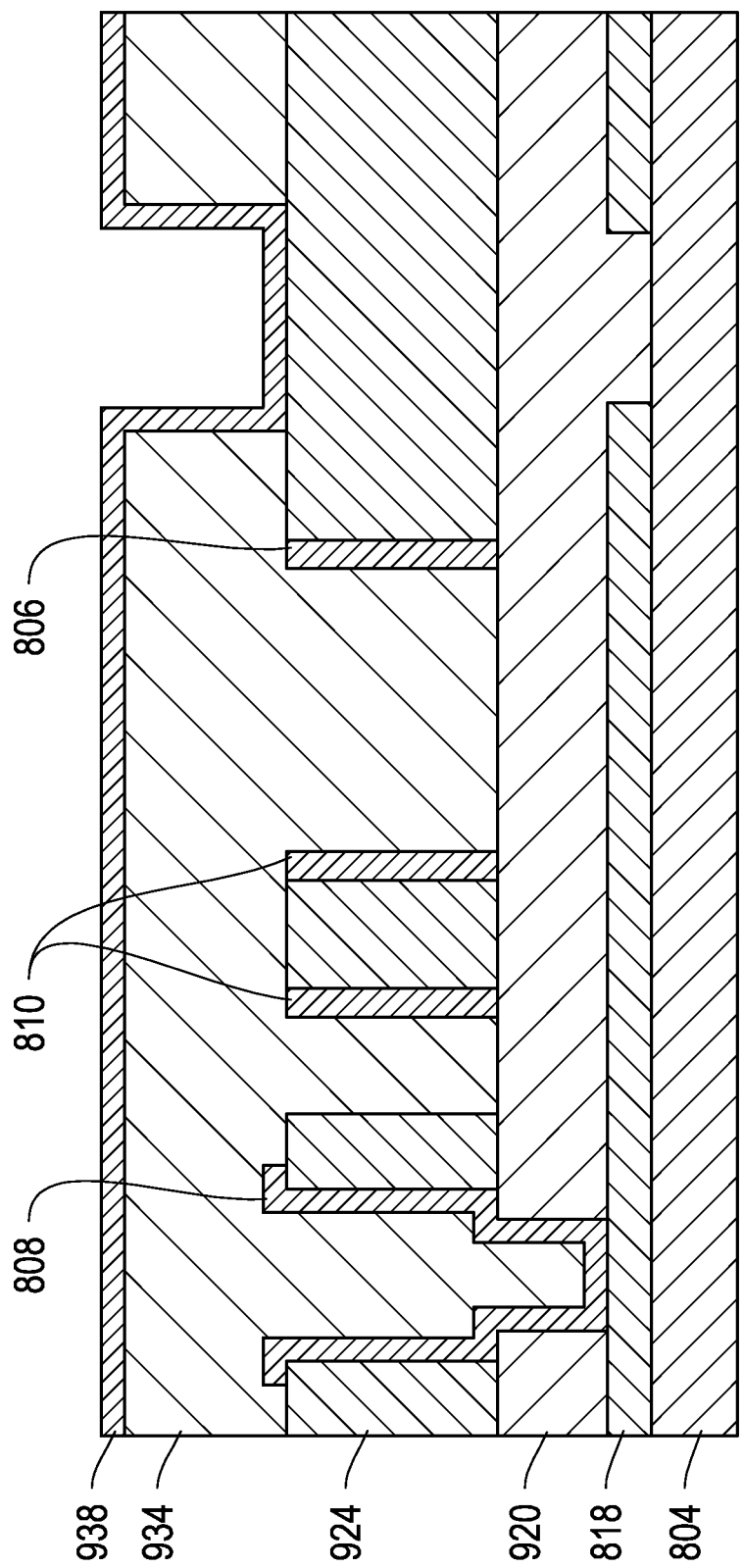

After the layer of structural material 932 is patterned, a third layer of sacrificial material 934 is deposited on top of the structure shown in FIG. 9H, resulting in the state of fabrication shown in FIG. 9I. The third layer of sacrificial layer 934 is deposited such that it is about 2 to about 4 microns thick above the upper-most surface of the remainder of structural material 932. A recess 936 is patterned into the third layer of sacrificial material 934. The recess 936 forms a portion of the mold for the shutter 802. Specifically, it defines the shape of a protrusion extending from the distal level 814 of the shutter 802. A second layer of structural material 938, shown deposited in FIG. 9J, on the bottom of the recess forms the bottom of the protrusion, and the proximal level 812, of the shutter 802. In some implementations in which the structural material 932 includes a dielectric material as an upper layer, an intervening etch may be used to remove portions of this dielectric material to allow for an electrical connection between the layer of structural material 932 and the second layer of structural material 938. Structural material 938 on the sidewalls of the protrusion connect the distal level 814 of the shutter 802 to the proximal level 812 of the shutter. The second layer of structural material 938 can have a similar composition and thickness as the first layer of structural material 932.

Figure 9K:
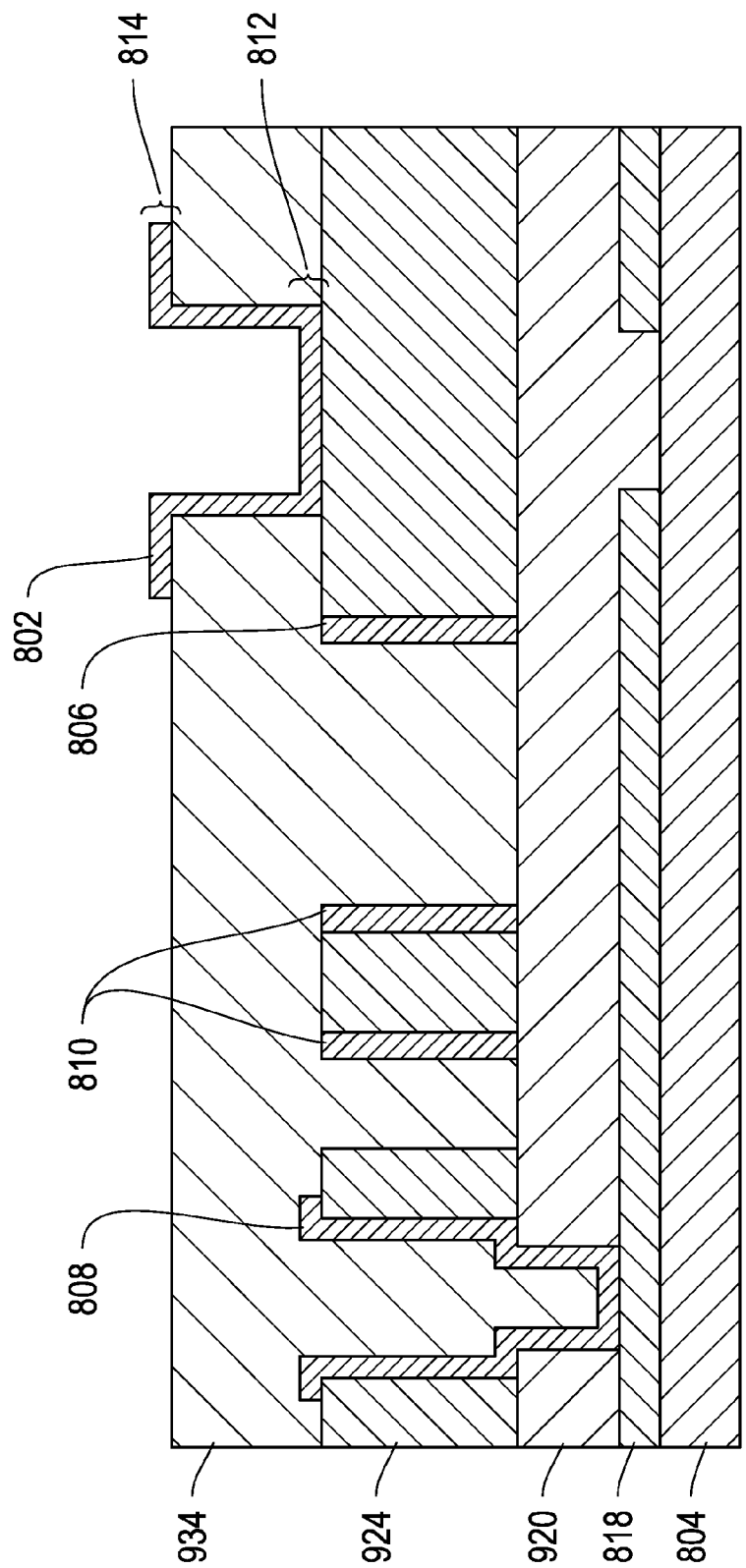
Figure 9L:
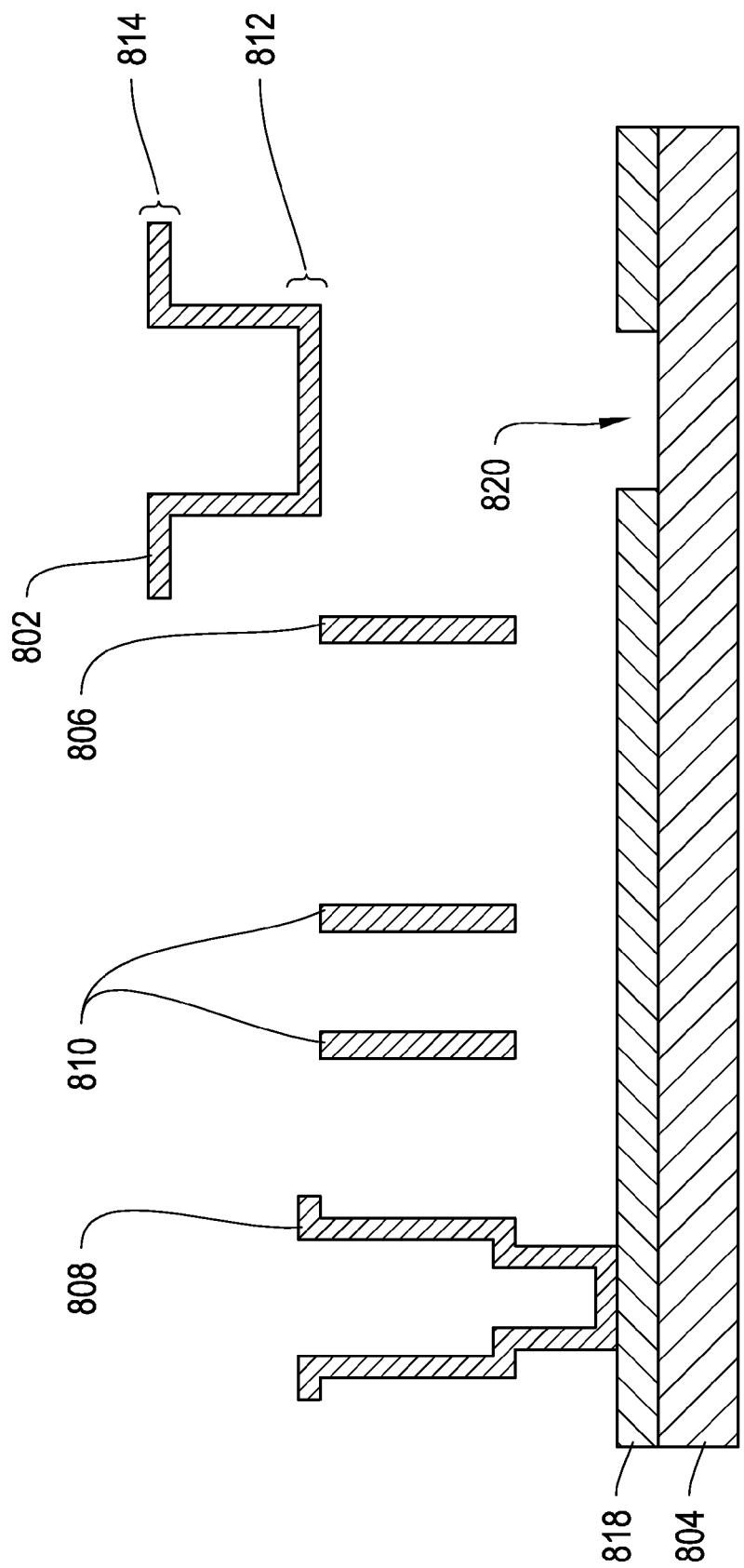

FIG. 9K shows the state of fabrication of the shutter assembly 800 after the second layer of structural material 938 has been patterned. In some implementations, the second layer of structural material 938 can be patterned using only one patterning stage, an anisotropic etch, to remove unwanted structural material on horizontal surfaces of the third layer of sacrificial material 934. The patterning defines the shutter 802. Finally, as shown in FIG. 9L, the shutter assembly 800 is released from the layers of sacrificial material 920, 924, and 934.

Figure 10A:
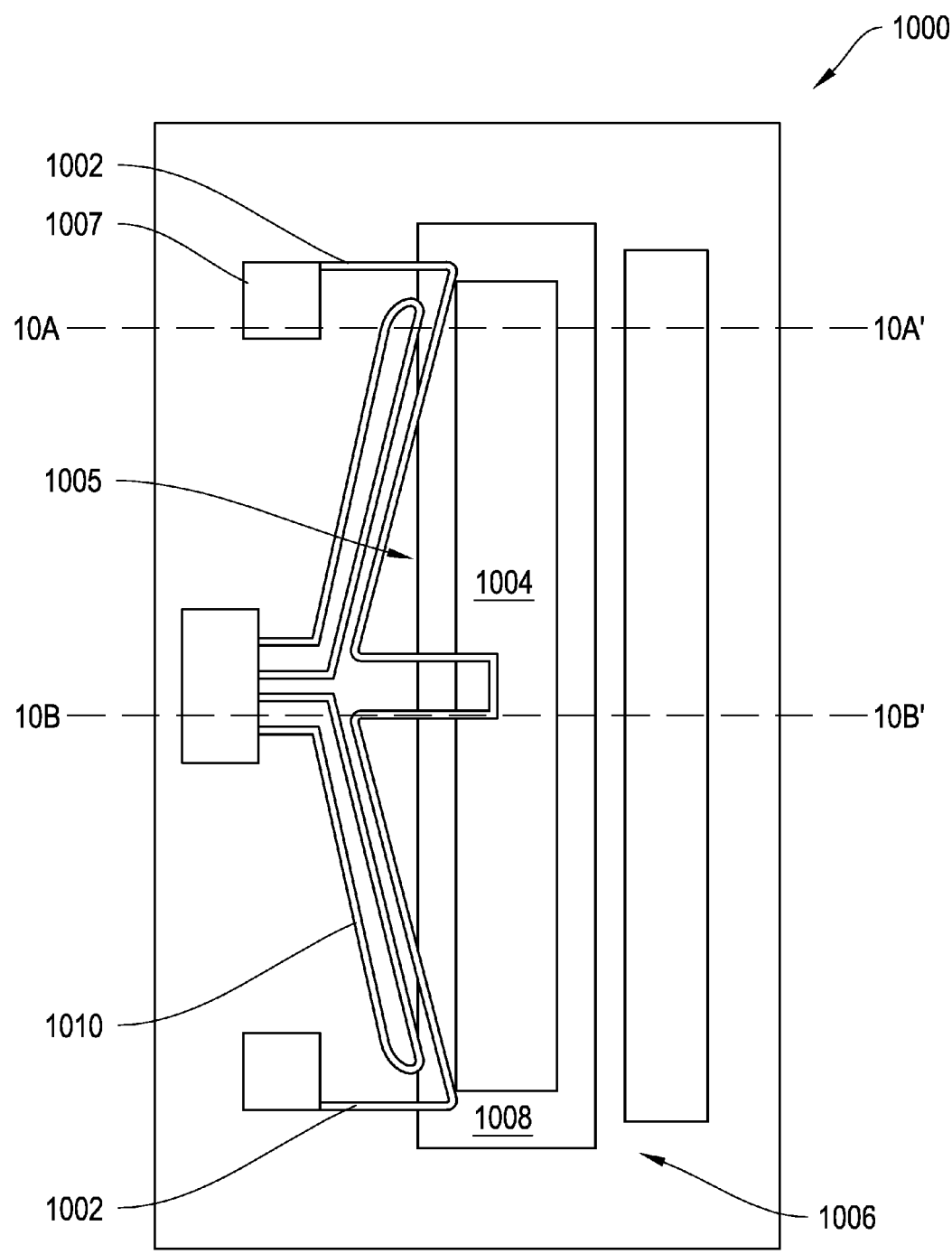
FIGS. 10A-10D show various views of another example shutter assembly.
Figure 10B:
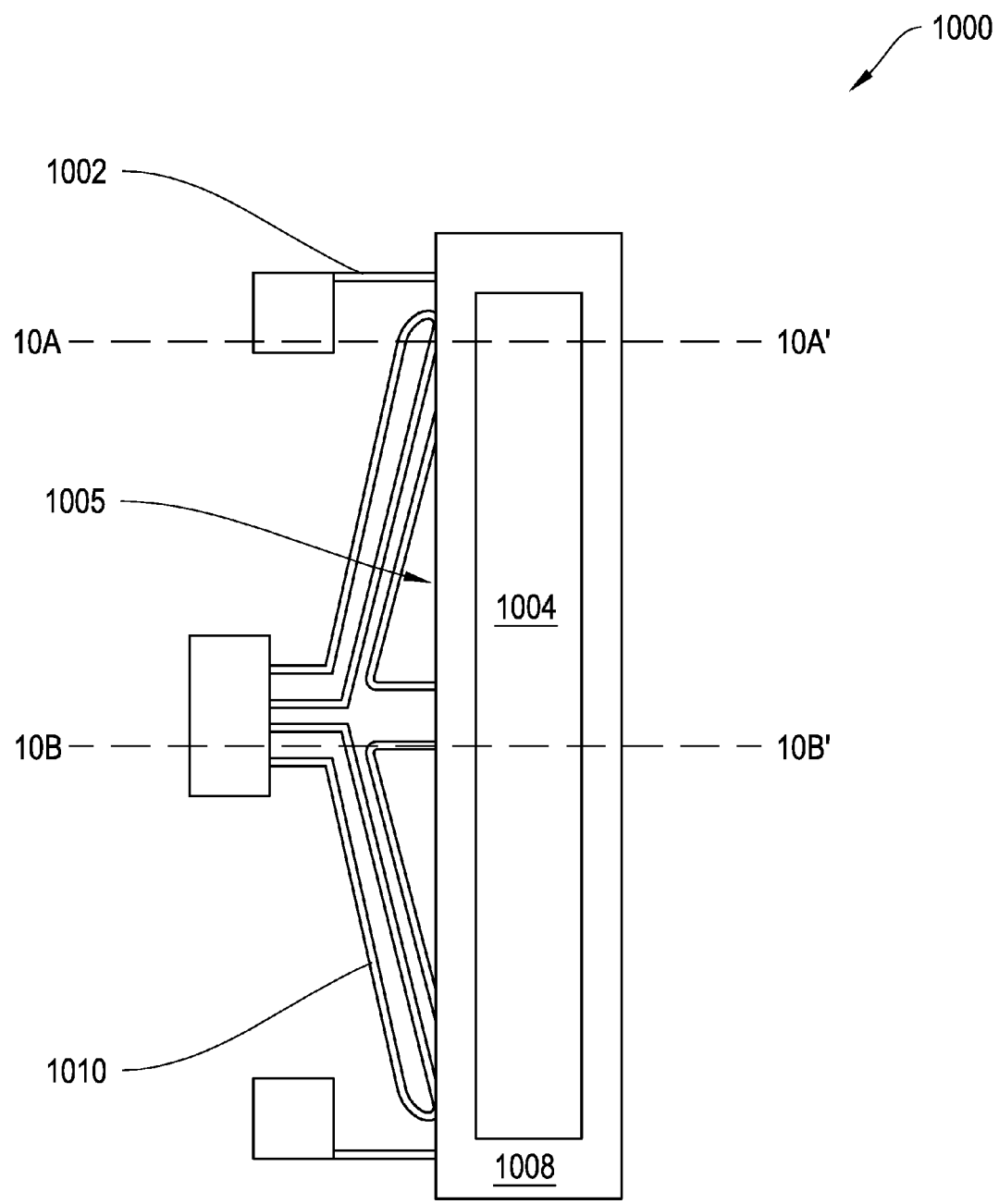
Figure 10C:
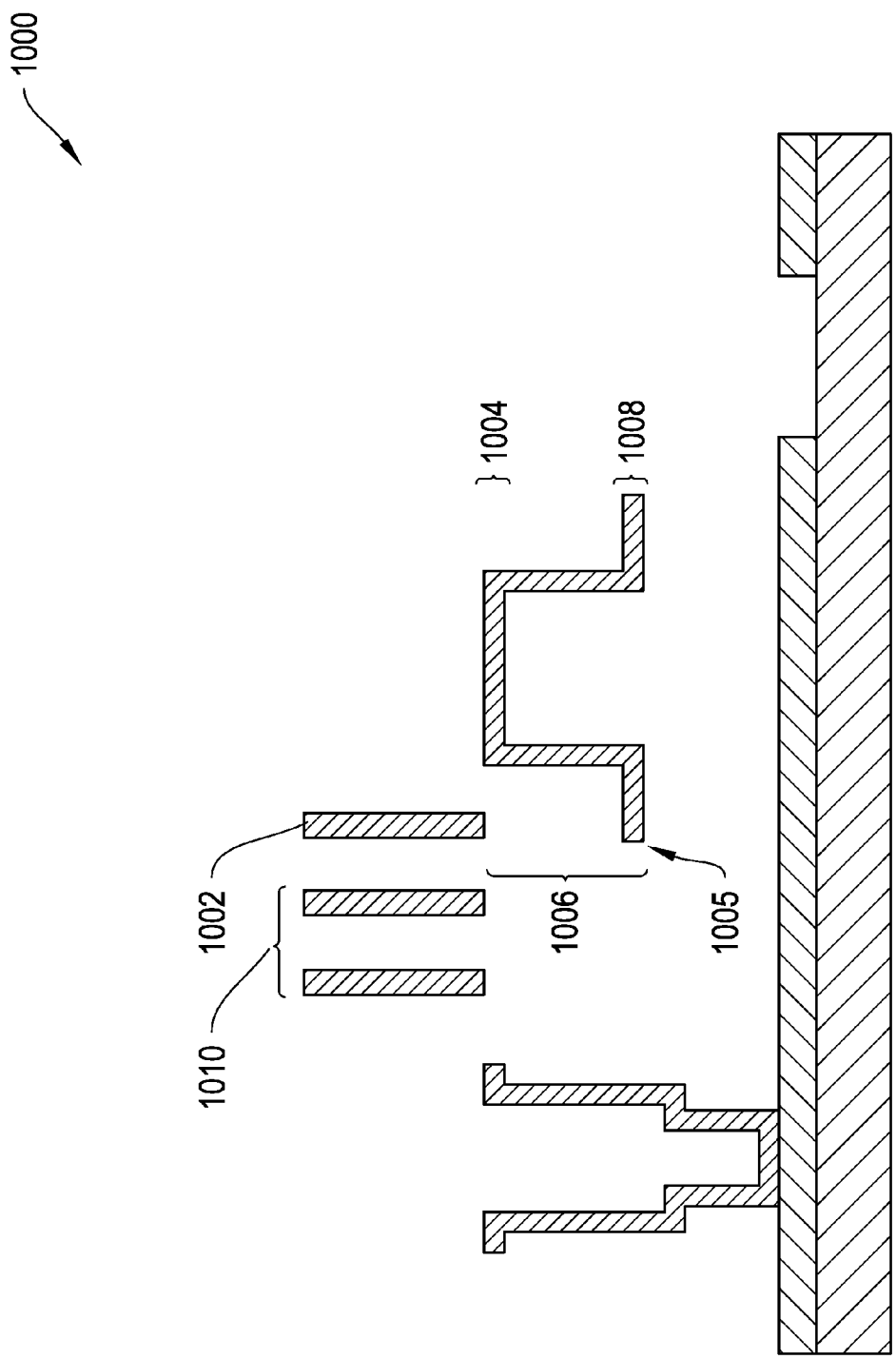
Figure 10D:
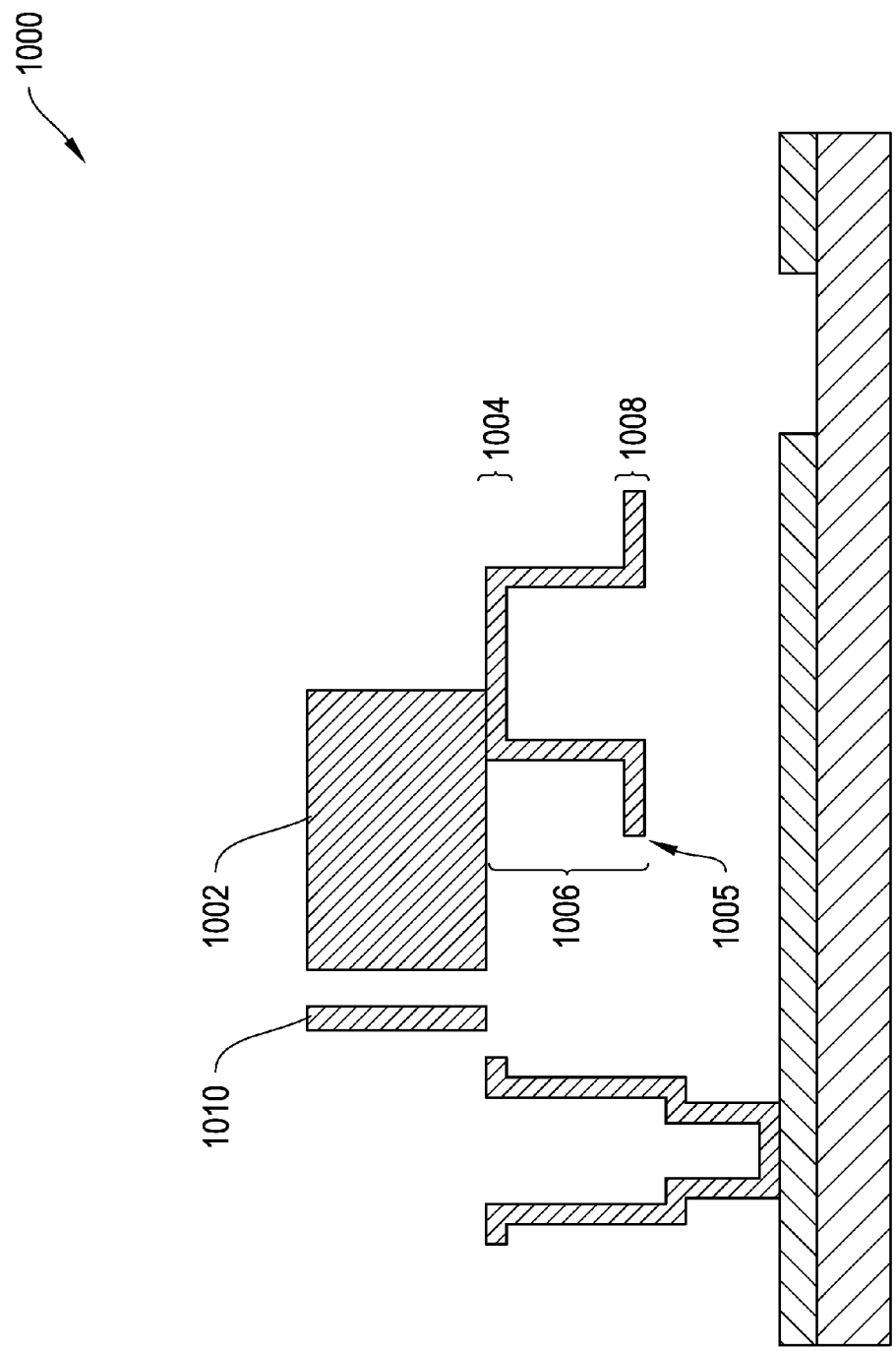

FIGS. 10A-10D show another example shutter assembly 1000. As with FIGS. 8A-8D, FIG. 10A shows a top view of the shutter assembly 1000, FIG. 10B shows a bottom view of the shutter assembly 1000, and FIGS. 10C and 10D show cross sectional views of the shutter assembly 800. Specifically, FIG. 8C shows a cross-sectional view along line 10A-10A' shown in FIGS. 10A and 10B, and FIG. 10D shows a cross-sectional view along line 10B-10B', also shown in FIGS. 10A and 10B.

In contrast to the shutter assembly 800 shown in FIGS. 8A-8D, in the shutter assembly 1000, a set of load beams 1002 connects to a distal surface of a distal level 1004 of a shutter 1006, instead of to a proximal level 1008. Thus, during actuation, an edge 1005 of the proximal level 1008 is able to pass under portions of the actuator, such as the load beams 1002 and a set of drive beams 1010. As with the shutter assembly 800, in some implementations, a shutter assembly having a similar architecture as the shutter assembly 1000 can be fabricated to have two opposing actuators, instead of having just the single actuator formed by the load beams 1002 and the drive beams 1010. Similarly, in some implementations, the shutter assembly 1000 can include a shutter with one or more shutter apertures as shown in FIGS. 4A and 4B.

FIGS. 11A-11K show cross sectional views of example stages of fabrication of the shutter assembly 1000 shown in FIGS. 10A-10D. Referring to FIGS. 10A-10D and 11A-11K, FIG. 11A shows a state of fabrication of the shutter assembly 1000 similar to that shown in FIG. 9C. That is, a light blocking layer 1018 has been deposited on a transparent substrate 1102 and has been patterned to define apertures 1104 through the light blocking layer 1018. In addition, a first layer of sacrificial material 1120 has been deposited on top of the patterned light blocking layer 1018. The first layer of sacrificial material 1120 can be deposited to have substantially the same thickness and be made of, or can include, the same materials used to form the first layer of sacrificial material 920 shown in FIGS. 9C-9K. As with the shutter assembly 800 shown in FIG. 8, in some implementations, one or more metal and inter-metal dielectric layers forming a control matrix may have been deposited and patterned between the substrate 1102 and the light blocking layer 1018 or between the light blocking layer 1018 and first layer of sacrificial material 1120.

FIG. 11B shows the results of a patterning stage being applied to the first layer of sacrificial material 1120. The first layer of sacrificial material 1120 is patterned to form a recess 1122, which will serve as a mold for the base of a load anchor 1007, which will support the load beams 1002 and the shutter 1006 over the transparent substrate 1102. A second layer of sacrificial material 1124 is then deposited on top of the structure shown in FIG. 11B, yielding the structure shown in FIG. 11C. The second layer of sacrificial material 1124 is then patterned to yield the structure shown in FIG. 11D. More particularly, the second layer of sacrificial material 1124 is patterned to create a recess 1125 above the region where the recess 1122 had previously been formed and to create a mold for the shutter 1006.

A first layer of structural material 1126 is then deposited on top of structure shown in FIG. 11D, yielding the structure shown in FIG. 11E. The first layer of structural material 1126 can include one or more layers of any of the materials identified for use in the first layer of structural material 932, shown in FIGS. 9F-9L. An etch is then applied to yield the structure shown in FIG. 11F. Specifically, in some implementations, all of the material in the first layer of structural material 1126 is removed in the etch other than material that forms the shutter 1006. In some other implementations, structural material is also retained to form a middle and lower portion of the load anchor 1007. The etch process yielding the structure shown in 11F can be a two-phase etch process, including an anisotropic etch to remove undesired structural material on the exposed horizontal surfaces of the structure shown in FIG. 11E, followed by a isotropic etch to remove undesirable structural material on the vertical surfaces of the structure.

Figure 11G:
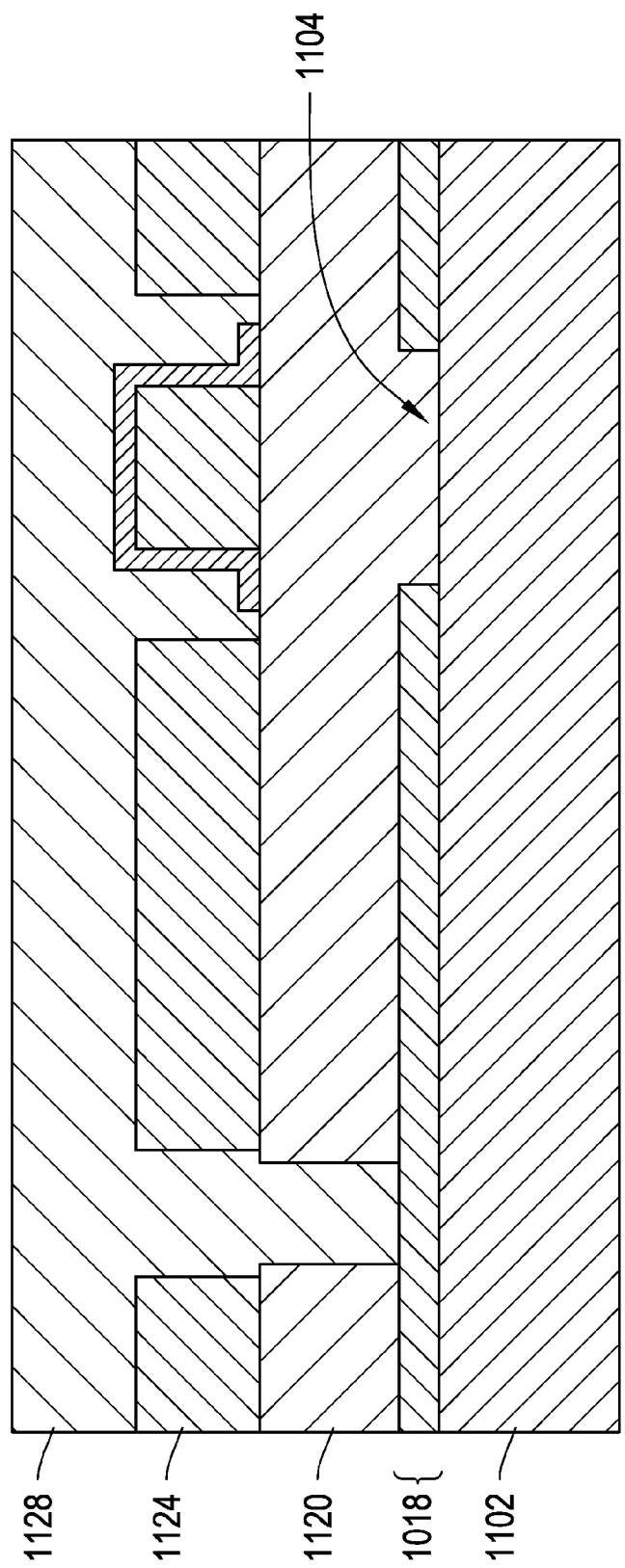
Figure 11H:
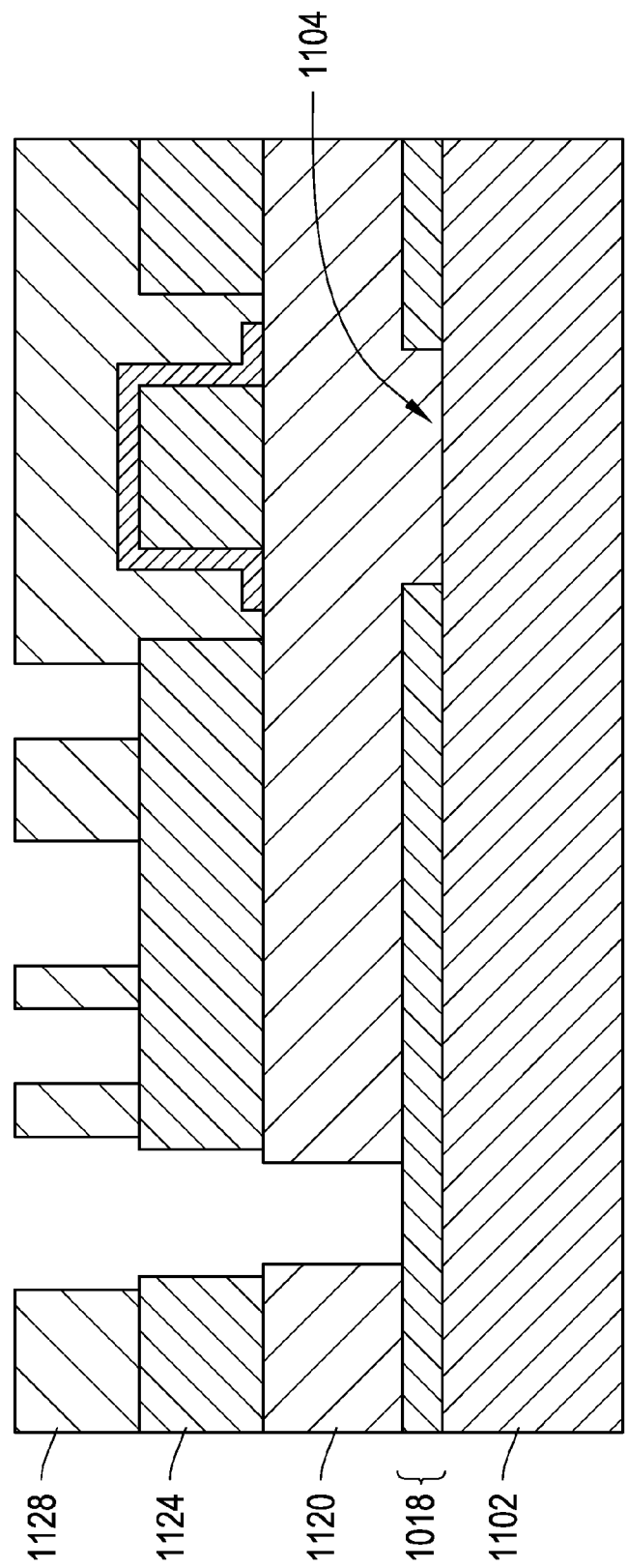
Figure 11I:
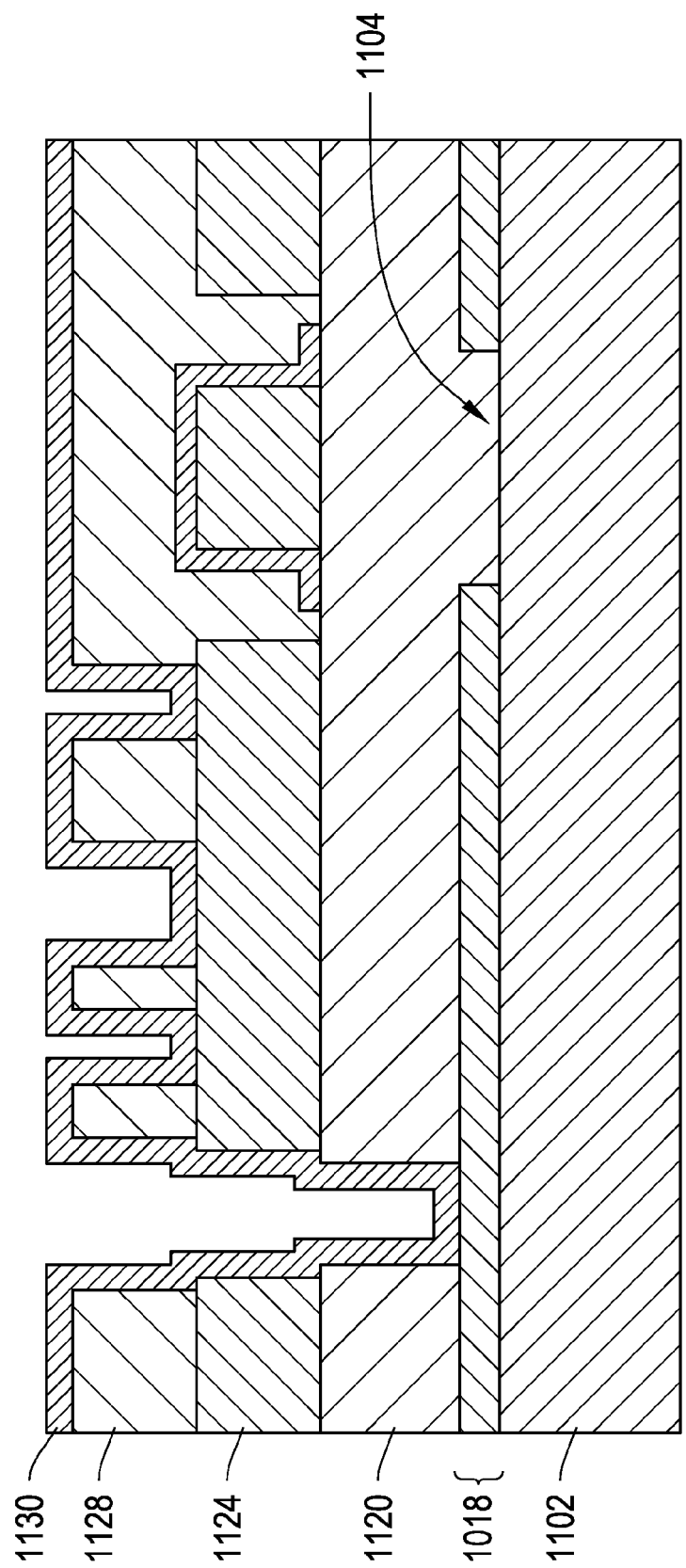
Figure 11J:
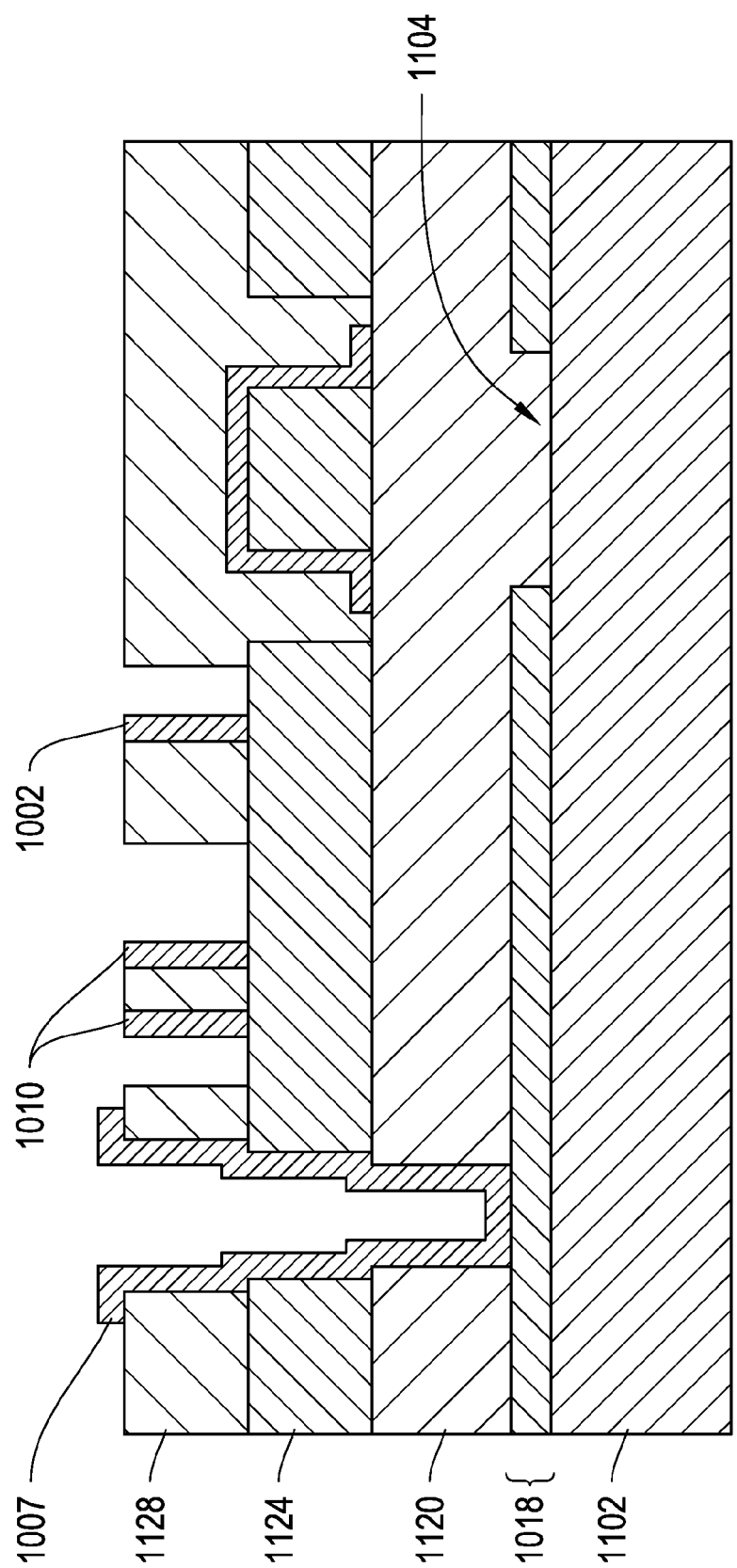
Figure 11K:
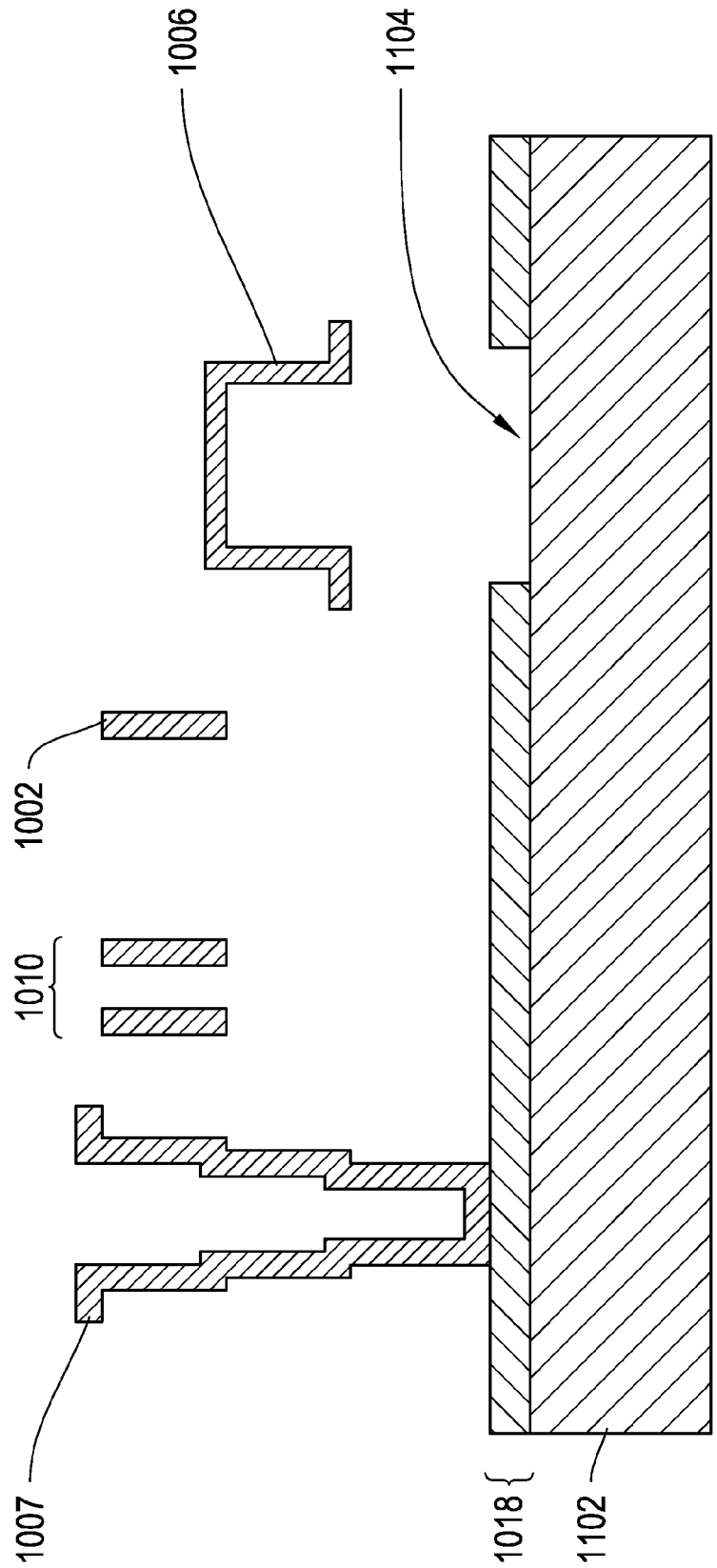

Subsequently, a third layer of sacrificial material 1128 is deposited on top of the remainder of the first layer of structural material 1120 and the first and second layers of sacrificial material 1124. This yields the structure shown in FIG. 11G. This structure is then etched to form a mold for the fabrication of the anchor 1007 and the load and drive beams 1002 and 1010 of the actuator, yielding the structure shown in FIG. 11H. A second layer of structural material 1130 is deposited on top, as shown in FIG. 11I. The second layer of structural material 1130 is then patterned to form the anchor 1007 and the actuator beams 1002 and 1010, as shown in FIG. 11J. A release agent is applied, removing the remainder of the first, second, and third layers of sacrificial material 1120, 1124, and 1128, yielding the shutter assembly 1000, as shown in FIG. 11K.

Figure 12A:
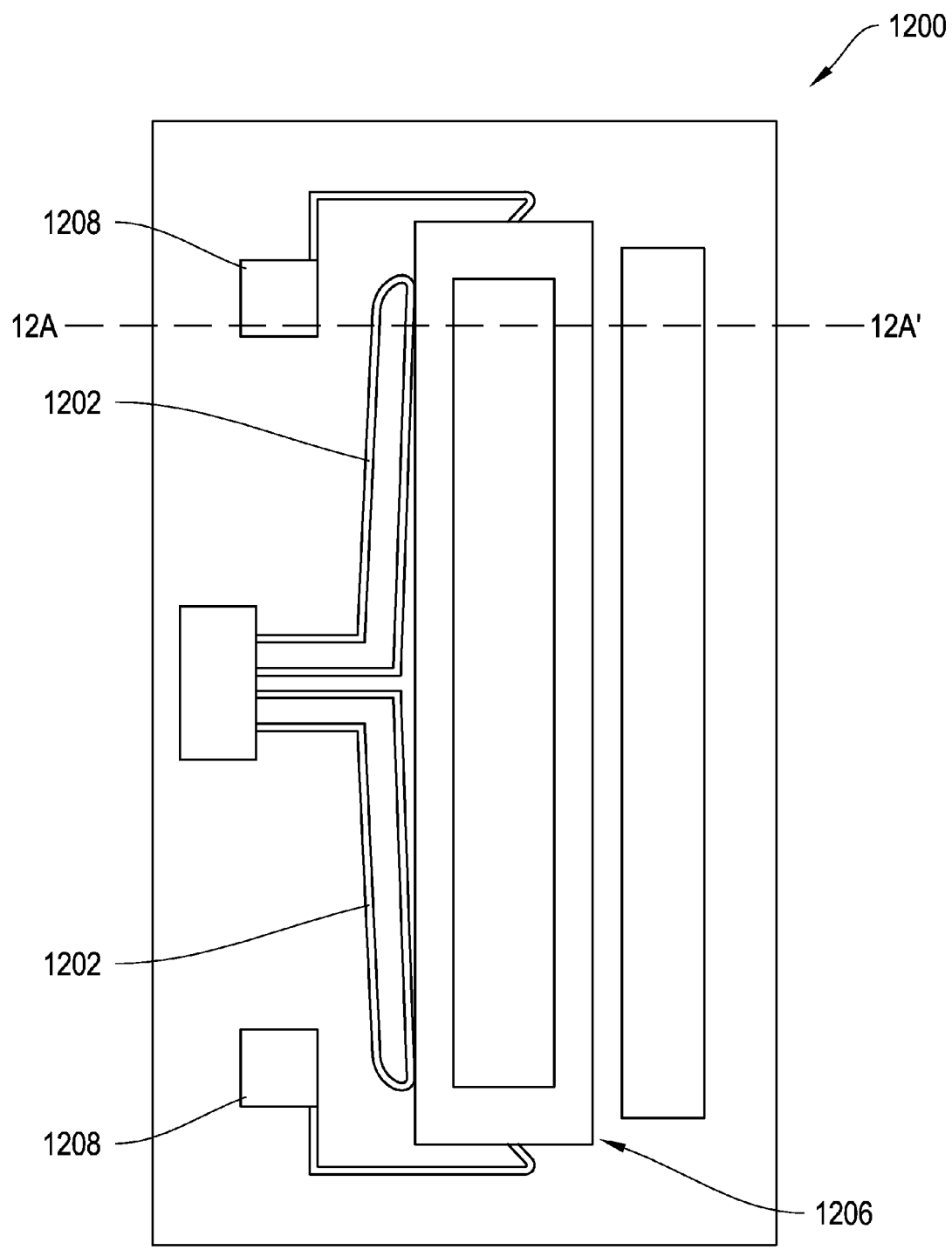
FIGS. 12A-12C show various views of another example shutter assembly.
Figure 12B:
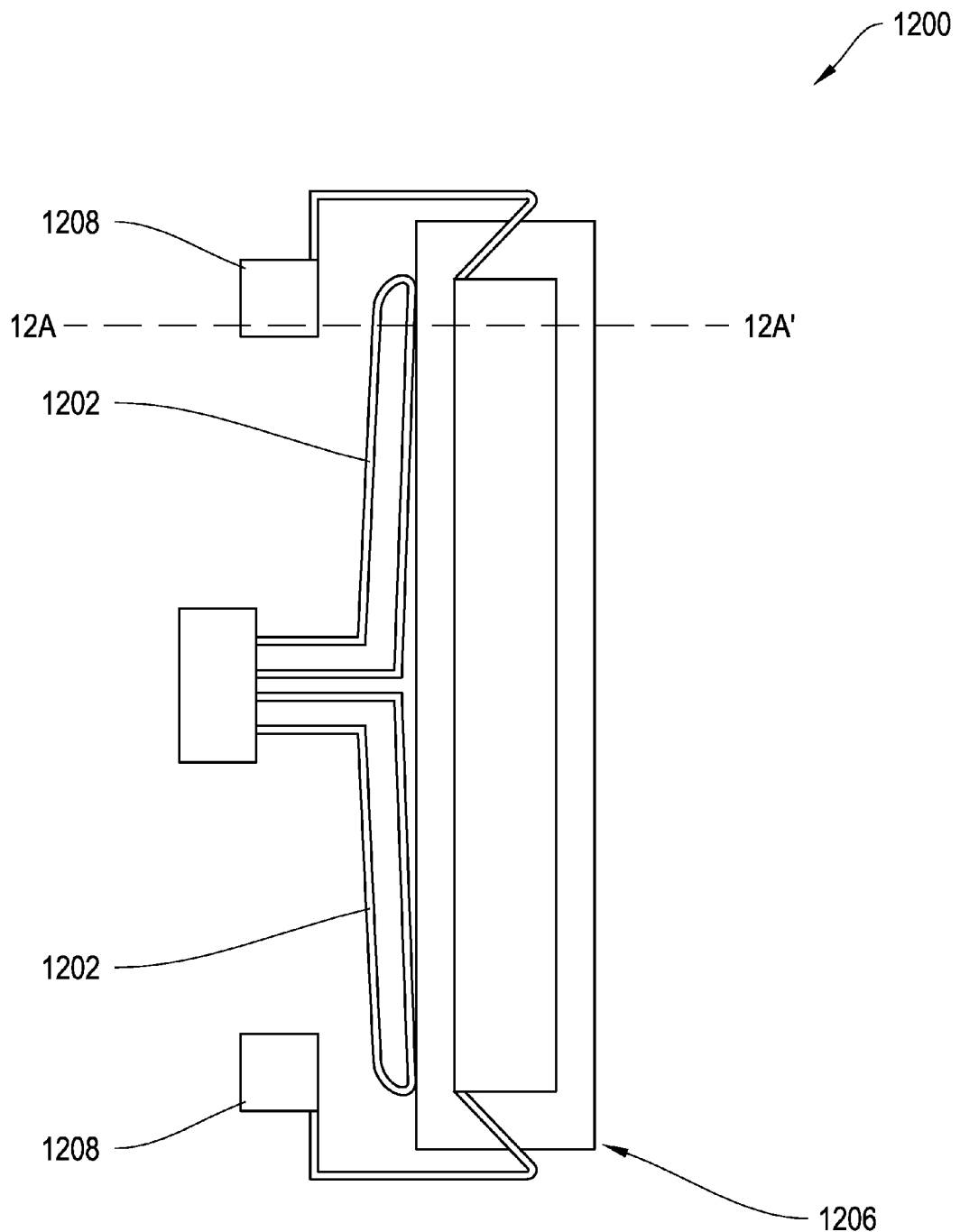
Figure 12C:
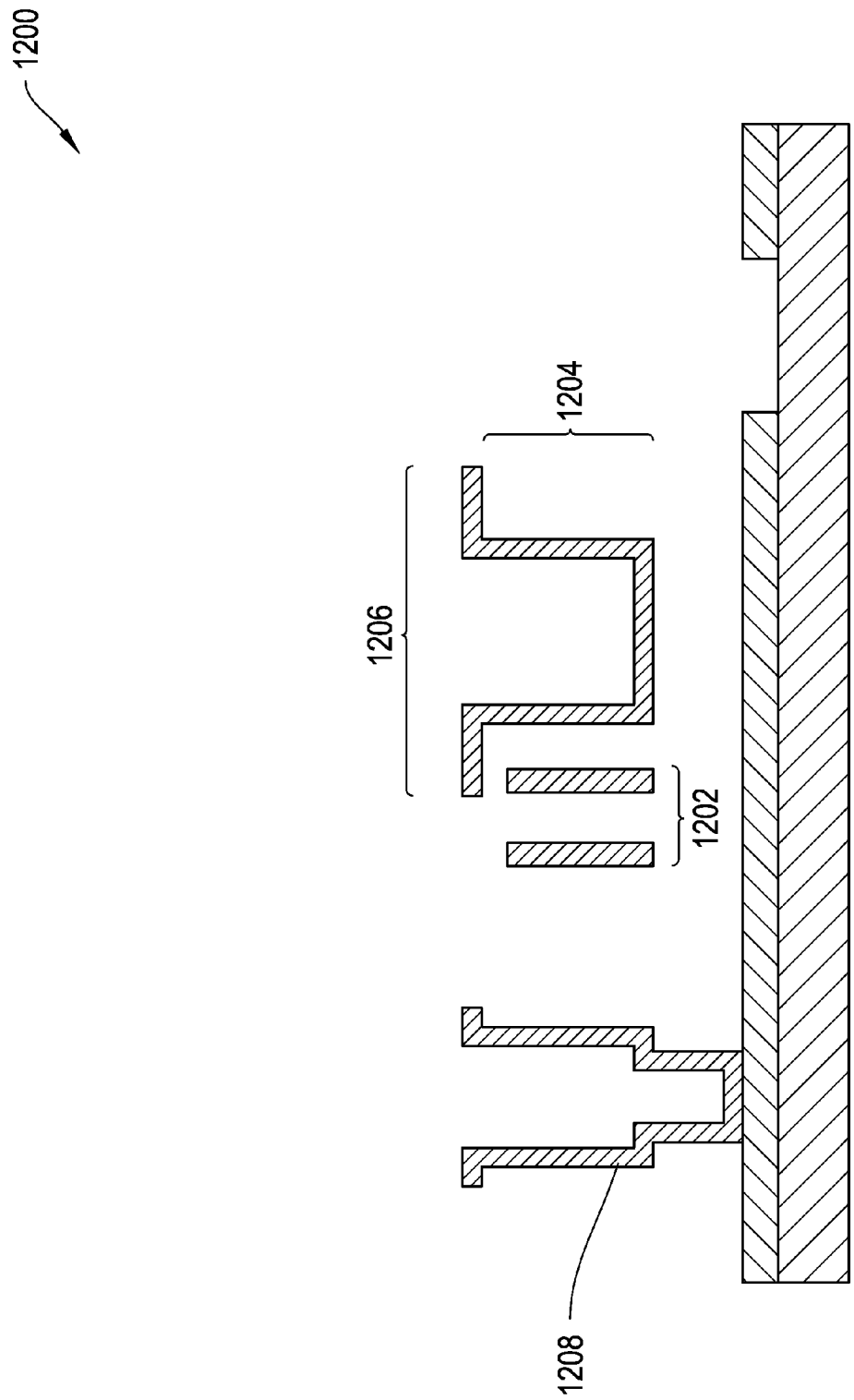

FIGS. 12A-12C show another example shutter assembly 1200. More particularly, FIGS. 12A and 12B are top and bottom views of the shutter assembly 1200, and FIG. 12C is a cross sectional view of the shutter assembly 1200 taken along line 12A-12A'.

In the shutter assembly 1200, a set of drive beams 1202 are opposed directly by a sidewall 1204 of a shutter 1206. The sidewall 1204 of the shutter 1206 thereby serves as a portion of a load electrode of an electrostatic actuator. In operation, when an actuation voltage is applied to the set of drive beams 1202, a potential difference is generated between the set of drive beams 1202 and the sidewall 1204, drawing the sidewall, and therefore the entire shutter 1206, towards the drive beams 1202. As can be seen in FIG. 12C, when actuated, an edge of the shutter 1206 is able to pass over a portion of the set of drive beams 1202, reducing the space needed to build the shutter assembly 1200. In some implementations, the shutter assembly 1200 can include a shutter with one or more shutter apertures as shown in FIGS. 4A and 4B.

Figure 13E:
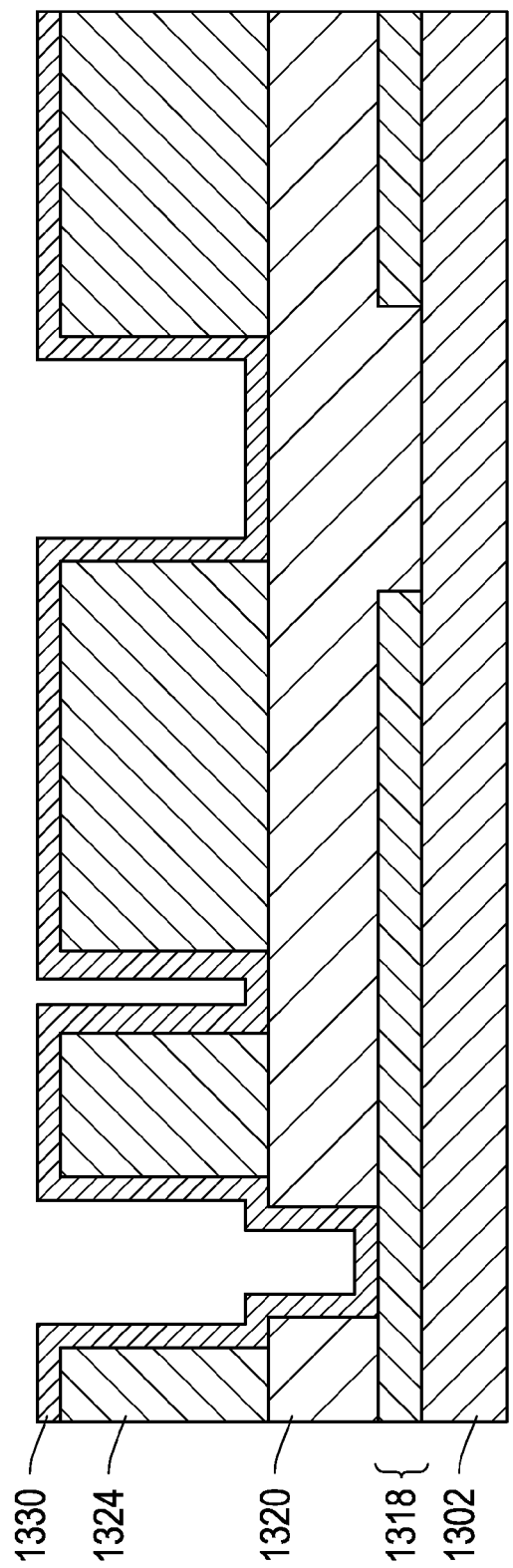

FIGS. 13A-13F show cross sectional views of example stages of fabrication of the shutter assembly 1200 shown in FIGS. 12A-12C. FIG. 13A shows a state of fabrication of the shutter assembly 1200 similar to that shown in FIG. 9C. That is, a light blocking layer 1318 has been deposited on a transparent substrate 1302 and has been patterned to define apertures 1304 through the light blocking layer 1318. In addition, a first layer of sacrificial material 1320 has been deposited on top of the patterned light blocking layer 1318. The first layer of sacrificial material 1320 can be deposited to the same thickness and be made of or can include the same materials used to form the first layer of sacrificial material 920 shown in FIGS. 9C-9K. As with the shutter assembly 800 shown in FIGS. 8A-8D, in some implementations, one or more metal and inter-metal dielectric layers forming a control matrix may have been deposited and patterned between the substrate 1302 and the light blocking layer 1318 or between the light blocking layer 1318 and first layer of sacrificial material 1320.

FIG. 13B shows the results of a patterning stage being applied to the first layer of sacrificial material 1320. The first layer of sacrificial material 1320 is patterned to form a recess 1322, which will serve as a mold for the base of a load anchor 1208. A second layer of sacrificial material 1324 is then deposited on top of the structure shown in FIG. 13B, yielding the structure shown in FIG. 13C. The second layer of sacrificial material 1324 is then patterned to yield the structure shown in FIG. 13D. More particularly, the second layer of sacrificial material 1324 is patterned to create a recess 1326 above the region where the recess 1322 had previously been formed to extend the mold for the anchor 1208. Two additional recesses 1328 and 1329 are formed to create a mold for the set of drive beams 1202 and the shutter 1206.

A layer of structural material 1330 is then deposited on top of the structure shown in FIG. 13D, yielding the structure shown in FIG. 13E. The layer of structural material 1330 can include one or more layers of any of the materials identified for use in the first layer of structural material 932, described in relation to FIG. 9F. An etch is then applied to yield the structure shown in FIG. 13F. The etch process yielding the structure shown in 13F can be a two-phase etch process, including an anisotropic etch to remove undesired structural material on the exposed horizontal surfaces of the structure shown in FIG. 13E, followed by a isotropic etch to remove undesirable structural material on the vertical sidewalls of the structure. In some other implementations, the etch process can be completed using a single anisotropic etch.

The anisotropic etch also removes a limited amount of structural material off of sidewalls of the structure shown in FIG. 13E where the structural material is not protected by resist during the etch. As such, after application of the anistropic edge, the structural material forming the drive beams 1202 of the shutter assembly 1200 no longer fully extends up to the upper surface of the second layer of sacrificial layer 1324. As a result, the drive beams 1202 are shorter than the sidewall 1204 of the shutter 1206. During actuation, an edge of the shutter 1206 therefore is able to pass over the drive beams 1202.

Figure 13F:
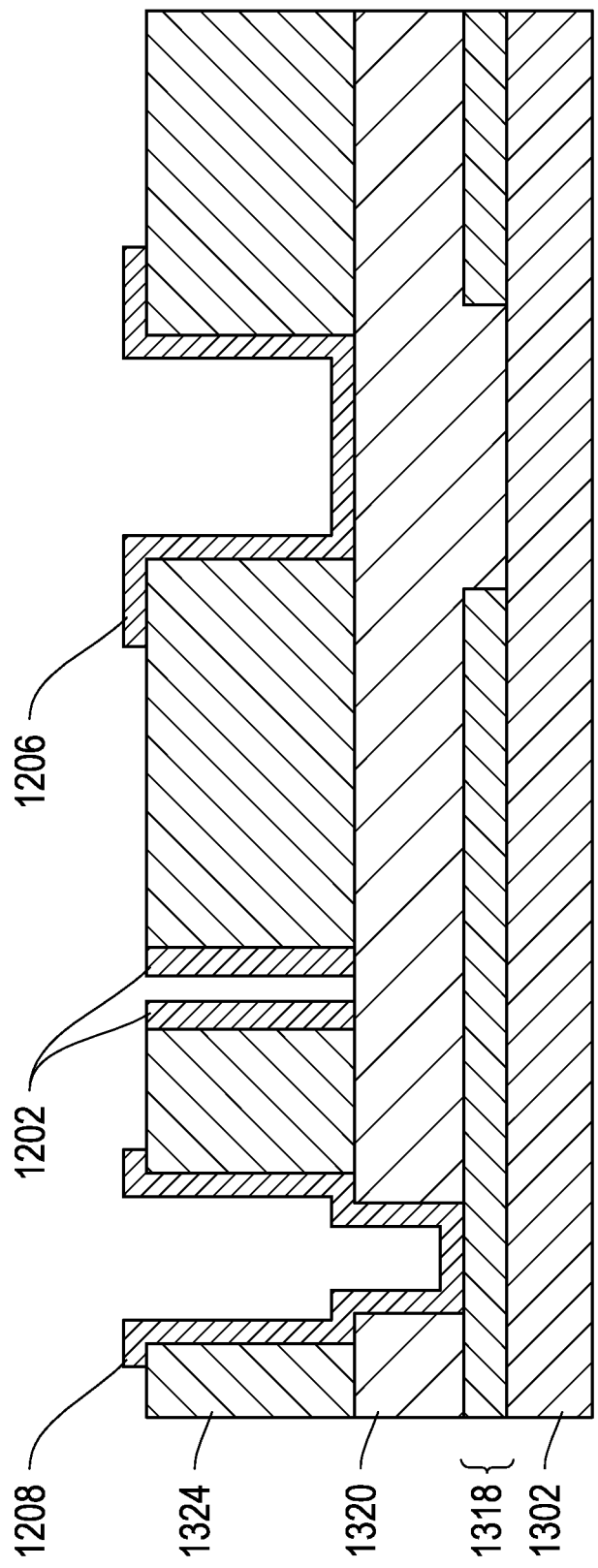

Subsequently, a release agent is applied to the structure shown in FIG. 13F, removing the first and second layers of sacrificial material 1320 and 1324. This release stage results in the shutter assembly 1200 shown in FIGS. 12A-12C.

Figure 14A:
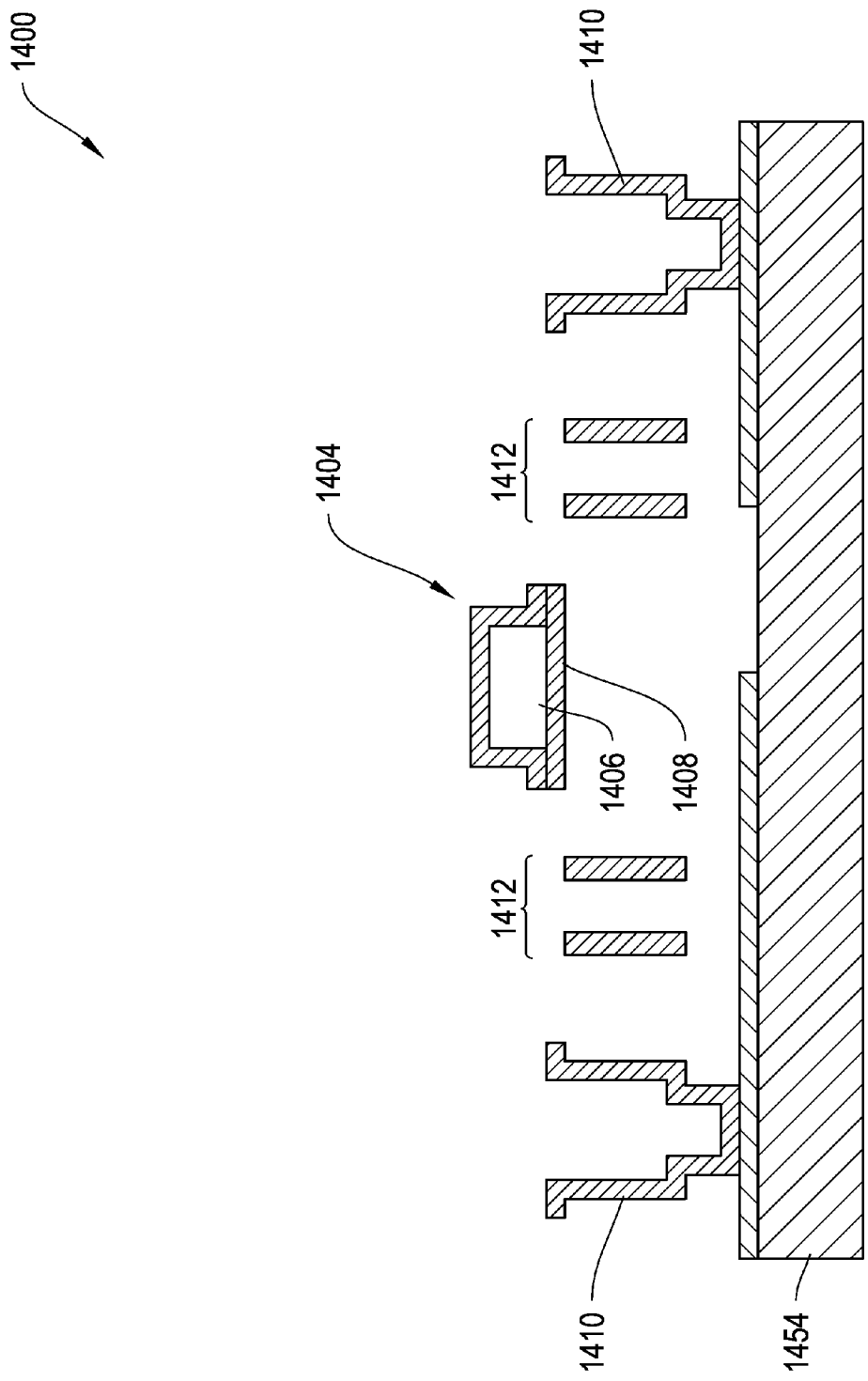
FIG. 14A shows a cross-sectional view of another example shutter assembly.
Figure 14B:
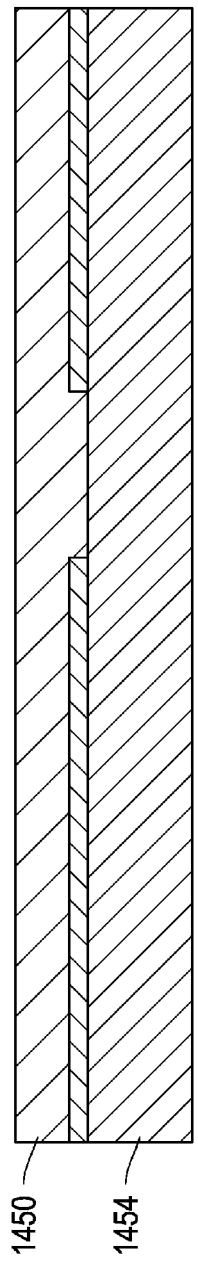
FIGS. 14B-14J show cross-sectional views of example stages of fabrication of the shutter assembly shown in FIG. 14A.
Figure 14C:
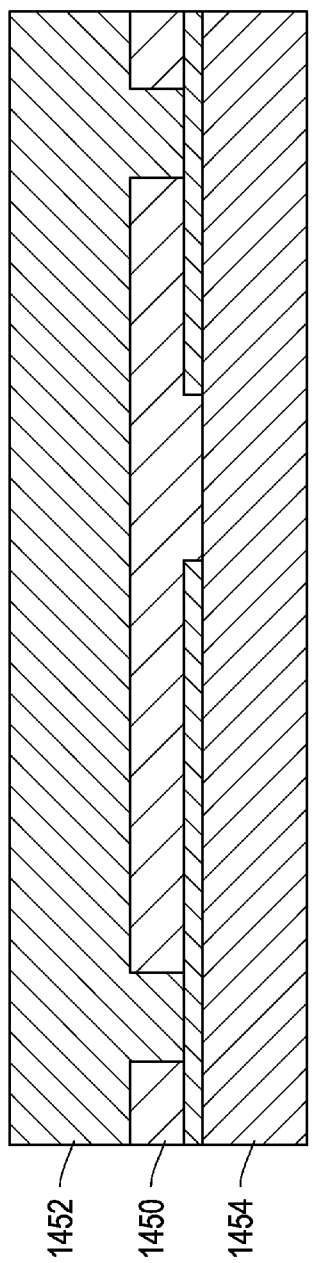
Figure 14D:
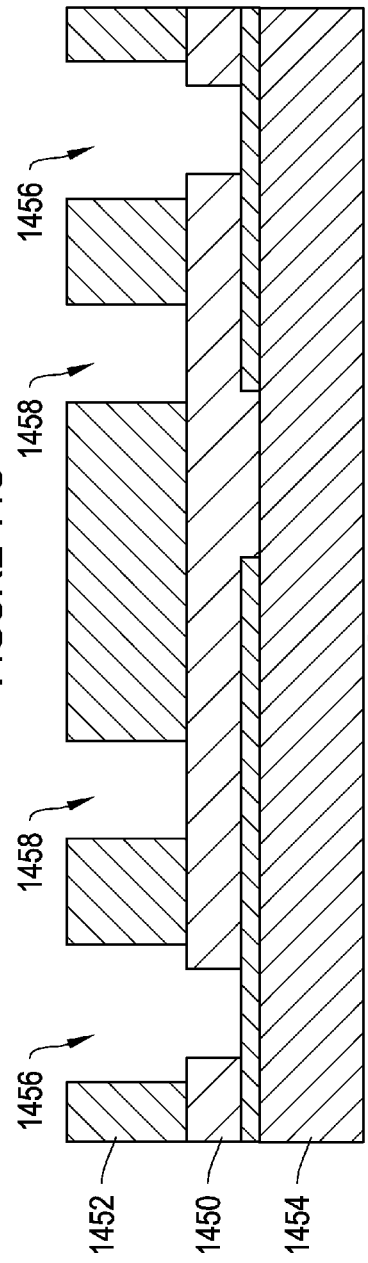

FIG. 14A shows a cross-sectional view of another example shutter assembly 1400. Like the shutter assemblies 800 and 1000 shown in FIGS. 8A-8D and 10A-10D, the shutter assembly 1400 is fabricated using a mold that includes three layers of sacrificial material as described further below. The shutter assembly 1400 differs from the above-described shutter assemblies 800 and 1000, in that it includes a capped shutter 1404. That is, the shutter assembly 1400 includes a shutter 1404 that includes a protrusion 1406 which is capped by an extra layer of structural material, referred to as the shutter cap 1408. By capping the protrusion 1406, the shutter 1404 is more aerodynamic. Particularly when incorporated into displays that surround the shutter assembly 1400 with a fluid (e.g., oil), capping the protrusion 1406 prevents vortices forming at the opening of the protrusion 1406, which could slow the movement of the shutter 1404.

FIGS. 14B-14J show cross-sectional views of example stages of fabrication of the shutter assembly 1400 shown in FIG. 14A. The process of fabricating the shutter assembly 1400 begins in a similar fashion to the process of fabricating the shutter assembly 900. More particularly, the process begins with the fabrication stages similar to those shown in FIGS. 9A-9F, in which first and second layers of sacrificial material 1450 and 1452 are deposited and patterned over a substrate 1454 (shown in FIGS. 14B-14D. The second layer of sacrificial material 1452 is patterned to form anchor mold recesses 1456 and actuator mold recesses 1458. The anchor mold recesses 1456 serve as molds for the anchors 1410 of the shutter assembly 1400. Likewise, the actuator mold recesses 1458 that serve as molds for the anchors 1412 of the shutter assembly 1400.

Figure 14E:
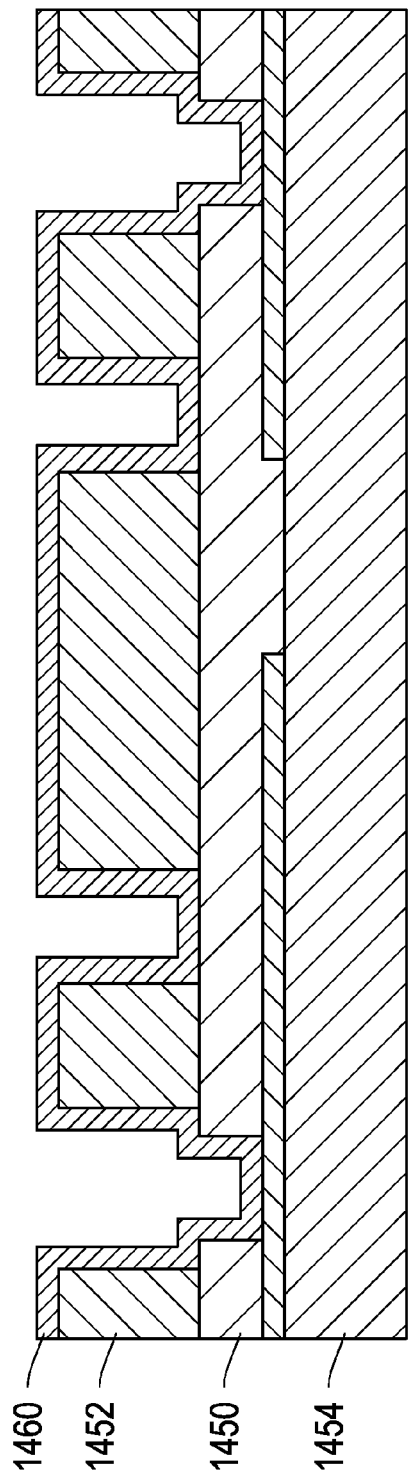

Subsequently, a first layer of structural material 1460 is deposited, as shown in FIG. 14E. The first layer of structural material 1460 can be or can include one or more layers of any of the materials described above as being suitable for use as a structural material. It can be deposited to a thickness of less than about 2.0 microns.

Figure 14F:
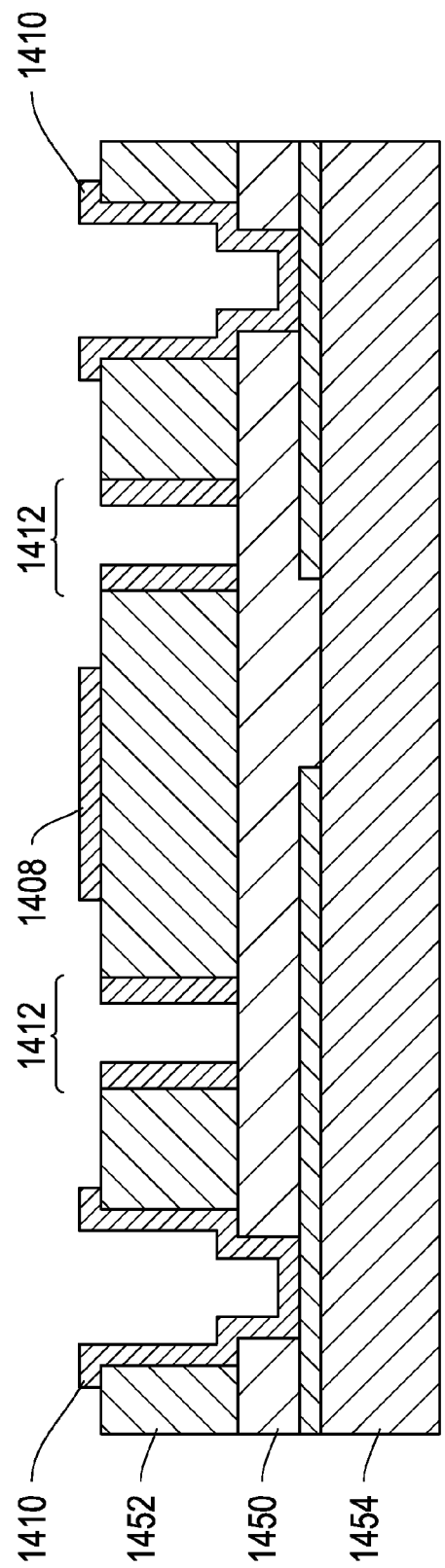

After deposition, the first layer of structural material 1460 is patterned to define the anchors 1410, the actuators 1412, and the shutter cap 1408. The first layer of structural material 1460 can be patterned using a combination of isotropic and anisotropic etches. The result of the patterning stage is shown in FIG. 14F.

Figure 14G:
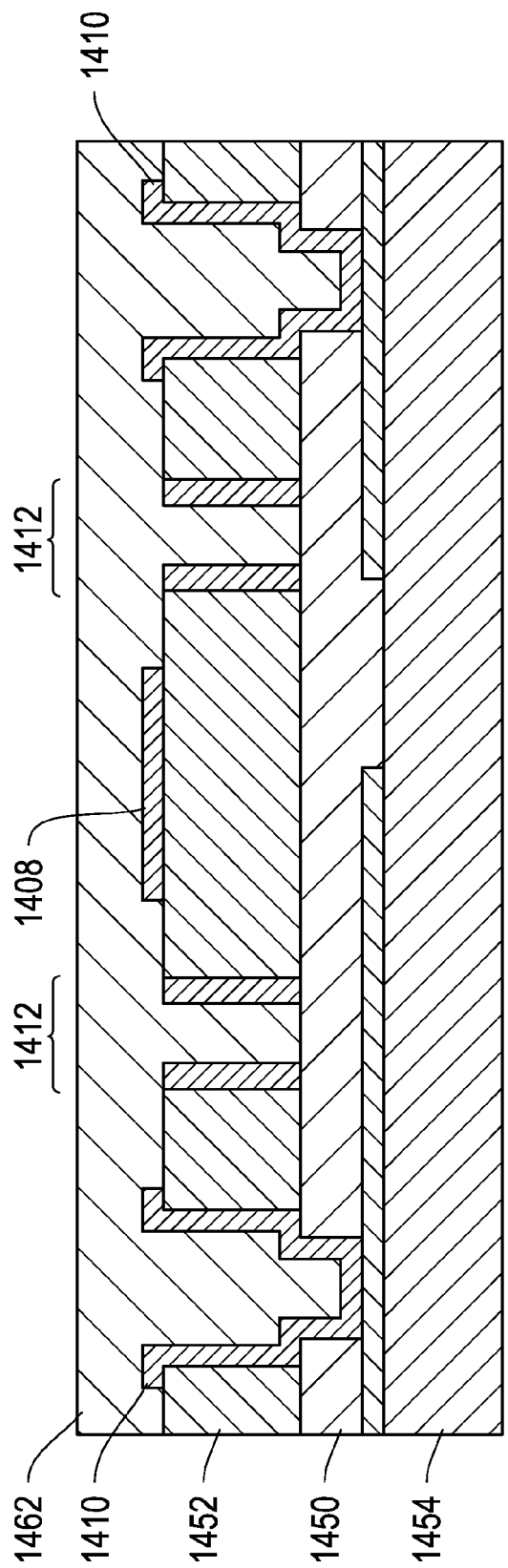
Figure 14H:
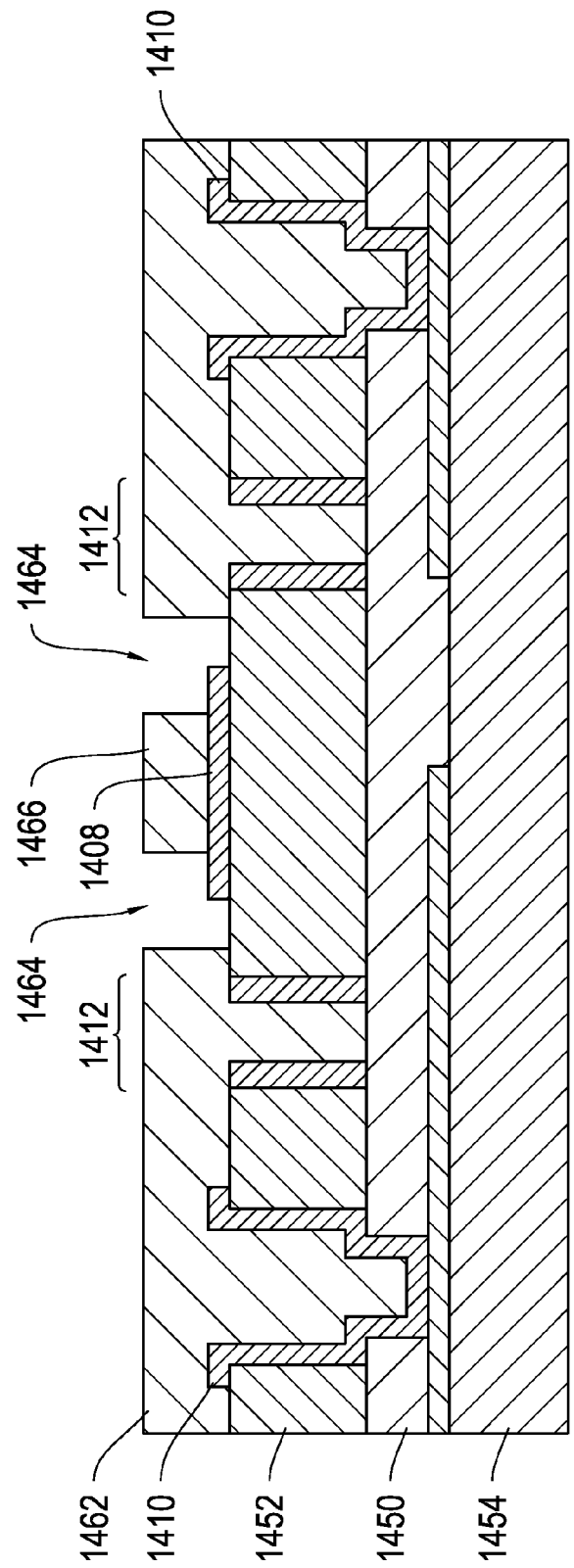

As shown in FIG. 14G, a third layer of sacrificial material 1462 is then deposited over the patterned first layer of structural material 1460, filling the recesses and protecting the anchors 1410 and actuators 1412 from further etching. The third layer of the sacrificial material 1462 is then patterned to form a mold for the remainder of the shutter 1404, as shown in FIG. 14H. More particularly, recesses 1464 are formed on either side of a mesa 1466, which is substantially centered on the shutter cap 1408.

Figure 14I:
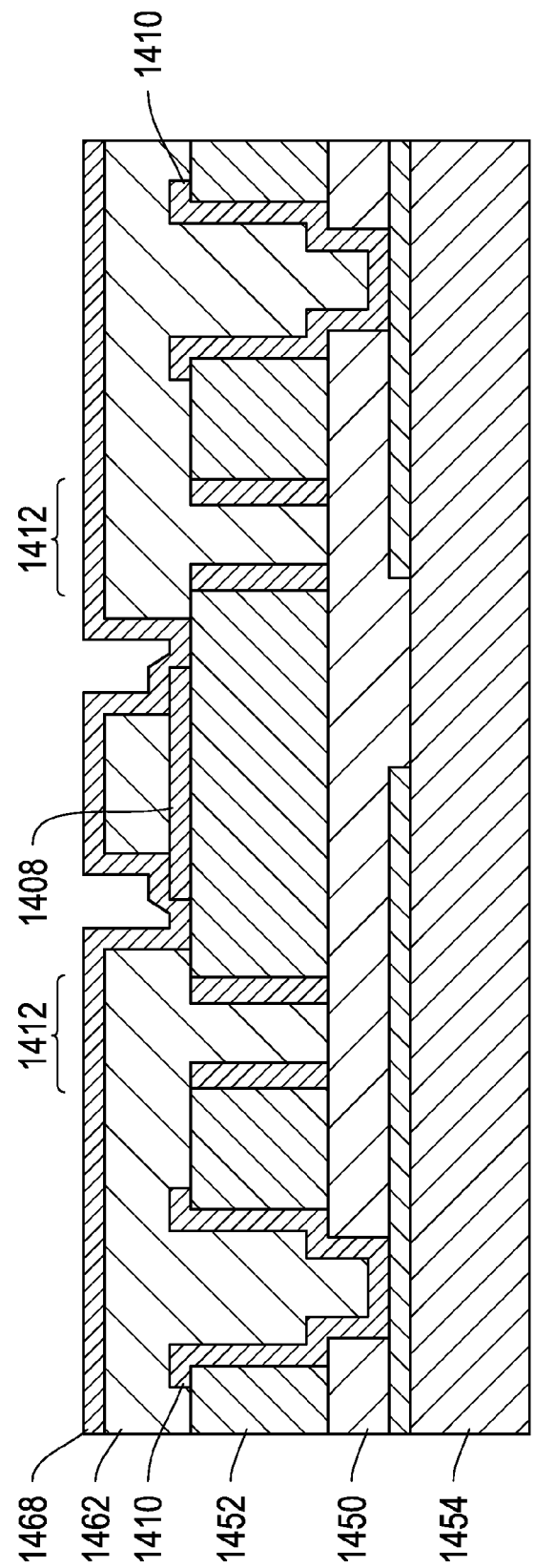
Figure 14J:
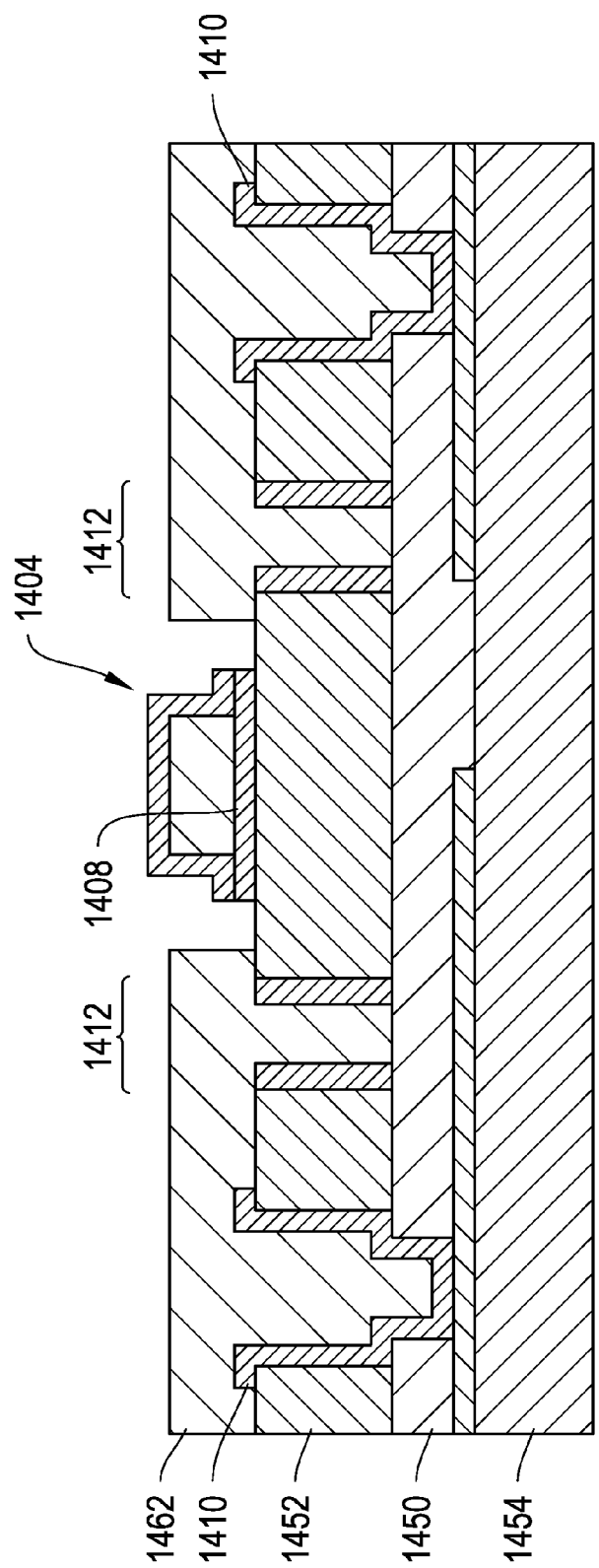

A second layer of structural material 1468 is then deposited over the structure shown in FIG. 14H, as shown in FIG. 14I. The second layer of structural material 1468, substantially conformally coats the exposed surfaces of the second and third layers of the sacrificial material 1452 and 1462 and the shutter cap 1408. The second layer of structural material 1468 is then patterned to remove excess structural material, leaving only the material coating the shutter cap 1408. In some implementations, a portion of the third layer of sacrificial material 1462, i.e., the material forming the mesa 1466, is fully encapsulated within the shutter 1404. In some other implementations, one or both ends (not shown) of the shutter protrusion 1406 are etched away, leaving the portion of the third layer of sacrificial material 1462 that formed the mesa 1466 exposed. The result of this patterning stage is shown in FIG. 14J. After this patterning stage is complete, a release stage can proceed, removing the remaining portions of the first, second, and third layers of sacrificial material 1450, 1452, 1462 (except for any material that may be encapsulated within the shutter as discussed above), yielding the shutter assembly 1400 shown in FIG. 14A.

Figure 15A:
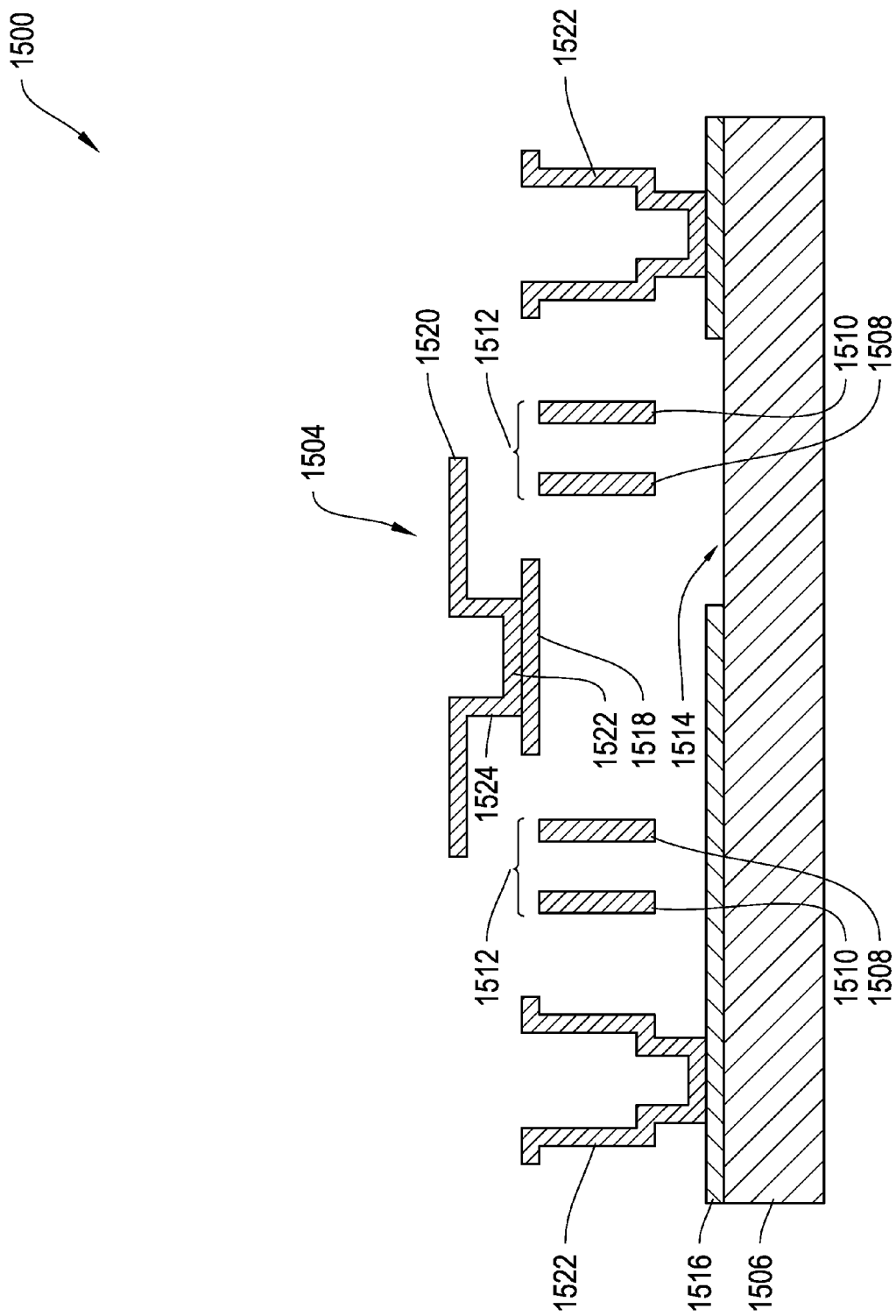
FIGS. 15A and 15B show cross-sectional views immediately before (FIG. 15A) and after (FIG. 15B) release of another example shutter assembly.
Figure 15B:
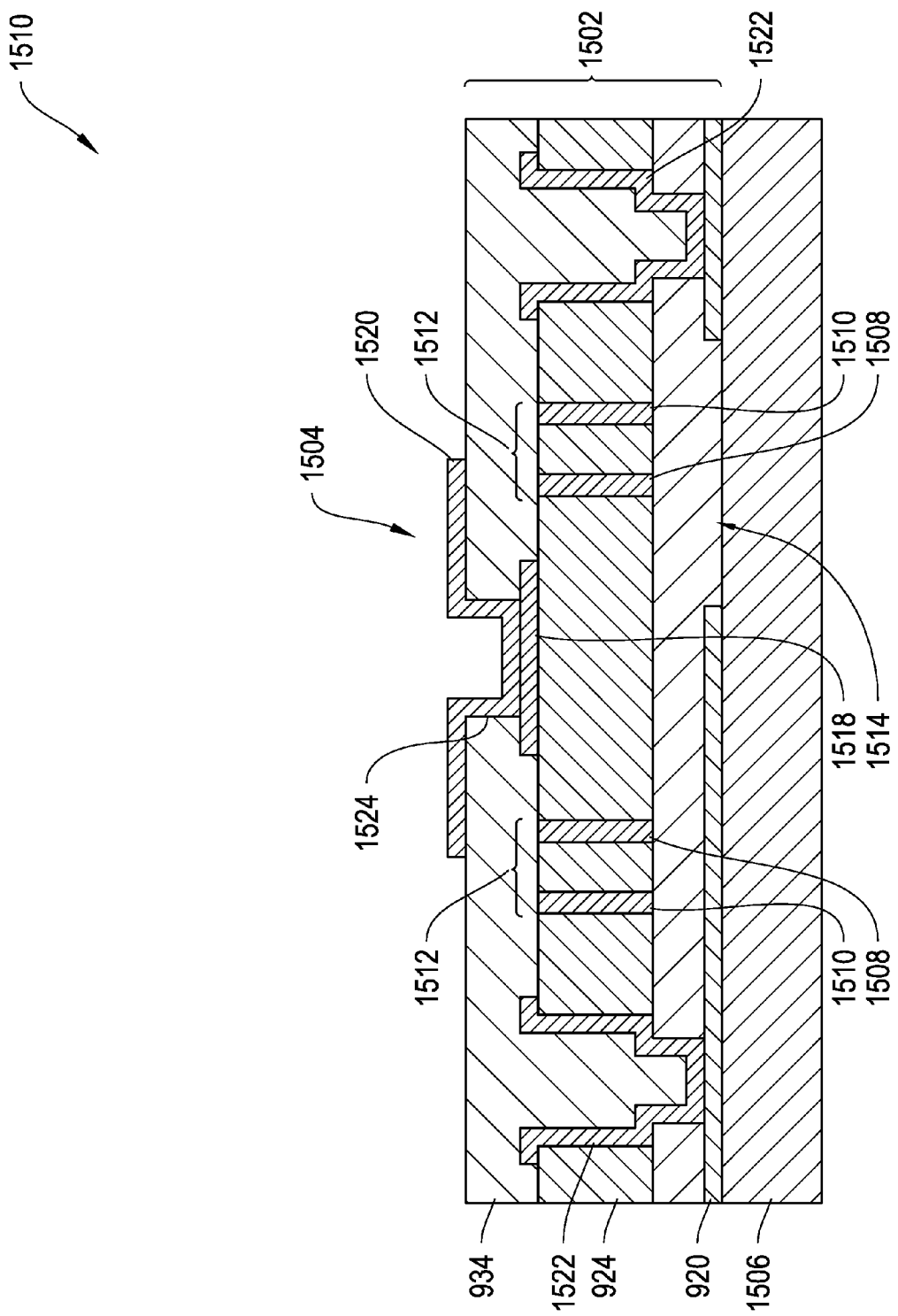

FIGS. 15A and 15B show cross-sectional views immediately before (FIG. 15A) and after (FIG. 15B) release of another example shutter assembly 1500. Like the shutter assemblies 800, 1000, and 1400 shown in FIGS. 8, 10 and 14A, respectively, the shutter assembly 1500 is fabricated using a mold 1502 that includes three layers of sacrificial material. The shutter assembly includes a shutter 1504 suspended over a substrate 1506 by load beams 1508. The load beams 1508, in conjunction with a set of opposing drive beams 1510, form electrostatic actuators 1512 for moving the shutter 1504 relative to an aperture 1514 defined in a layer of light blocking material 1516 deposited on the substrate 1506.

The shutter 1504 of the shutter assembly 1500 includes two light blocking levels, a proximal light blocking level 1518 and a distal light blocking level 1520. As used above, the terms "proximal" and "distal" are used herein with reference to the substrate 1506, on which the shutter assembly 1500 is fabricated. That is, the proximal light blocking level 1518 of the shutter 1504 is closer to the substrate 1506 than the distal level 1520. In addition, in contrast to the shutter assemblies 800, 1000, and 1200 shown in FIGS. 8, 10, and 12, the shutter assembly 1500 includes two, opposing actuators 1512. Thus, the shutter 1504 can be actively driven into its two states, instead of relying on a passive spring force to return the shutter 1504 to its neutral, unactuated position.

The shutter 1504 includes edges, specifically, edges of the distal light blocking level 1520, which pass over the top of a portion of a drive beam 1510 when the shutter is moved by an actuator 1512 into an actuated state. This allows for the shutter 1504 to take up less space on the substrate 1506. In some implementations, as shown in FIGS. 15A and 15B, portions of the distal light blocking level 1520 may be fabricated such that they extend over portions of the load beams 1508 even in a neutral, unactuated state.

The process of fabricating the shutter assembly 1500 is similar to the process of fabricating the shutter assembly 900 shown in FIGS. 9A-9L. More particularly, the process begins with processing stages similar to those in FIGS. 9A-9F, modified to account for the formation of two actuators 1512, instead of just one. Specifically, FIGS. 9A-9E show the formation of recesses 926, 928, and 930 in first and second layers of sacrificial material 920 and 924. The recesses 926, 928, and 930 provide sidewalls upon which anchors 1522 and actuators 1512 will be formed. To fabricate two actuators 1512, the recesses 926, 928, and 930 are mirrored on either side of the position on the mold 1502 at which the shutter 1504 will be fabricated.

A layer of structural material 932 is then deposited on top of the patterned first and second layers of sacrificial material 920 and 924 (similar to as shown in FIG. 9F). The layer of structural material 932 is then patterned, removing all of the structural material 932 except where such material forms anchors 1522, the actuators 1512, and the proximal light blocking layer 1518 of the shutter 1504.

The remainder of the fabrication process continues in a fashion similar to as shown in FIGS. 9H-9L. Specifically, a third layer of sacrificial material 934 is deposited on top of exposed surfaces of the first sacrificial layer 920, the second layer of sacrificial material 924 and the layer of structural material 932. The third layer of sacrificial material 934 is then patterned to form a recess extending down to the layer of structural material forming the proximal light blocking layer 1518. A second layer of structural material 938 is then deposited and patterned, forming the distal light blocking level 1520 of the shutter 1504 and the side walls 1524 that connect the proximal light blocking level 1518 to the distal light blocking level 1520. In addition, a portion of the second layer of structural material 938 fills the bottom of the recess, on top of a portion of the already existing proximal light blocking level 1518, increasing its thickness. The result of these processing stages is shown in FIG. 15B. Finally, the structure is released, yielding the shutter assembly 1500 shown in FIG. 15A.

Figure 16A:
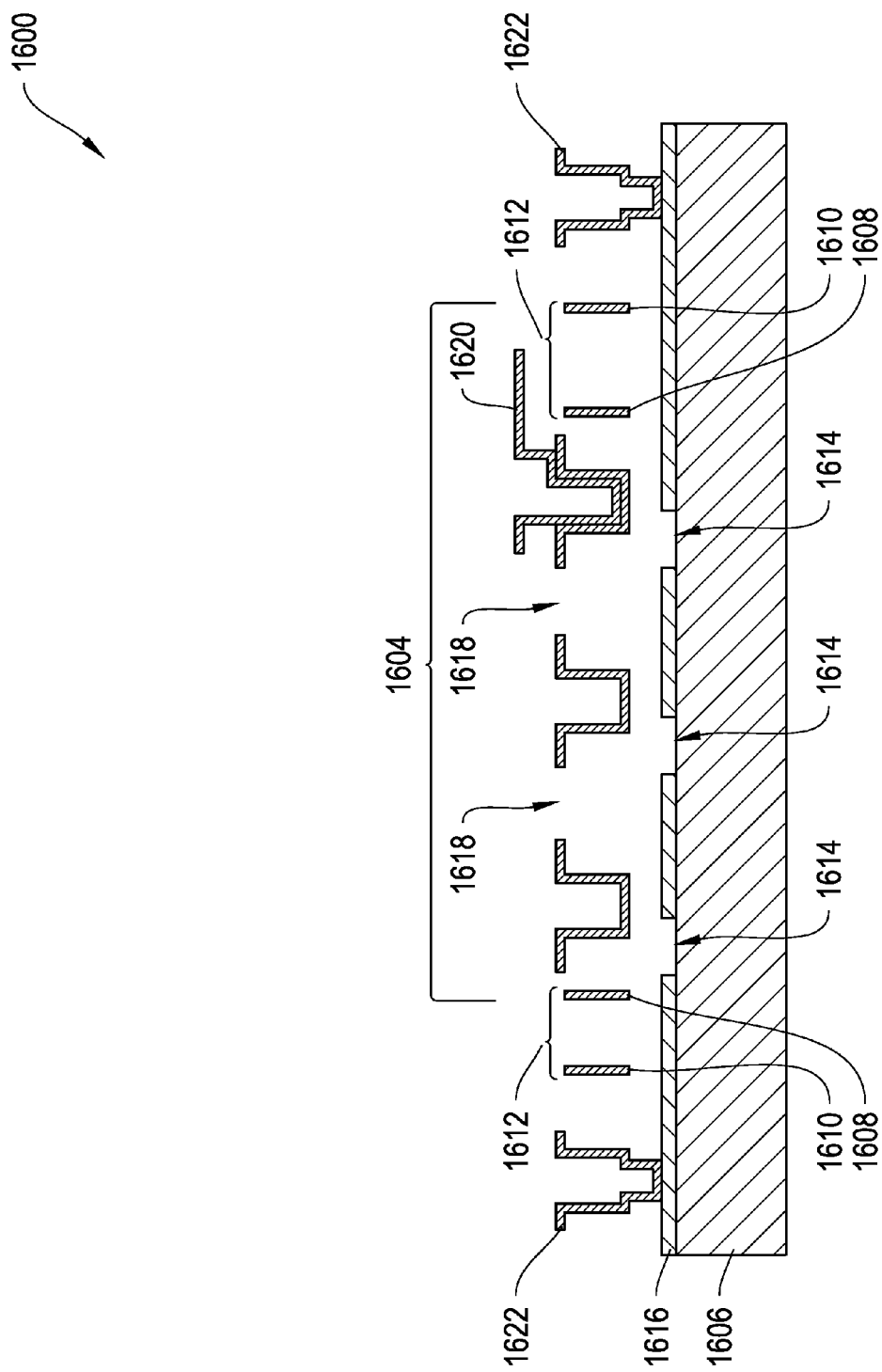
FIG. 16A shows a cross-sectional view of an example shutter assembly.

FIG. 16A shows a cross-sectional view of an example shutter assembly 1600. FIGS. 16B-16F show cross-sectional views of example stages of the fabrication of the shutter assembly 1600 shown in FIG. 16A. Like the shutter assemblies 800, 1000, 1400 and 1500, shown in FIGS. 8, 10, 14, and 15, respectively, the shutter assembly 1600 is fabricated using a mold that includes three layers of sacrificial material. The shutter assembly include a shutter 1604 suspended over a substrate 1606 by load beams 1608. The load beams 1608, in conjunction with a set of opposing drive beams 1610, form electrostatic actuators 1612 for moving the shutter 1604 relative to a set of apertures 1614 defined in a layer of light blocking material 1616 deposited on the substrate 1606. The shutter 1604 includes corresponding shutter apertures 1618 defined through its thickness.

When the shutter 1604 is moved into a light transmitting state, the shutter apertures 1614 substantially align with all but one of the apertures 1614 in the light blocking layer 1616, creating optical paths through the apertures 1614 and shutter apertures 1618. In the light transmitting state, the remaining aperture 1614 in the light blocking layer 1616 is positioned beyond the edge of the shutter 1604, and thus light passing through this aperture passes by the shutter 1604 without having to pass through a shutter aperture 1618. When the shutter 1604 is moved into a light blocking state, light blocking portions of the shutter 1604 align with the apertures 1614 in the light blocking layer 1616, blocking the aforementioned optical paths.

The shutter 1604 includes an upper light blocking layer 1620 that extends up and over one of the load beams 1608 that supports the shutter 1604 over the substrate 1606. In the light transmissive state, the upper light blocking layer 1620 may also extend over one of the drive beams 1610 as well at one or more anchors 1622 that support the load and/or drive beams 1608 and 1610. The upper light blocking layer 1620 provides extra light blocking in the direction the shutter 1604 travels to reach the open position (i.e., to the right in FIG. 16A). The upper light blocking layer 1620 helps mitigate light leakage when the shutter 1604 is in the light blocking state result from light that might bypass or rebound off of the light blocking portions of the shutter 1604. As shown in FIG. 16A, the opposite side of the shutter 1604 lacks an upper light blocking layer 1620. Inclusion of an upper light blocking layer on the opposite side of the shutter would require substantial additional shutter travel distance to unblock the last light blocking layer aperture 1614.

In some implementation, the shutter 1604 includes an equal number of shutter apertures 1618 and apertures 1614 formed in the light blocking layer 1616. In some such implementations, both sides of the shutter can include upper light blocking layers 1620, as such shutter assemblies do not rely upon the shutter 1604 fully clearing any apertures 1614 in the light blocking layer 1616 to provide a light transmissive state, thereby obviating the need for extra shutter travel distance that inclusion of a second upper light blocking layer might otherwise create.

Figure 16B:
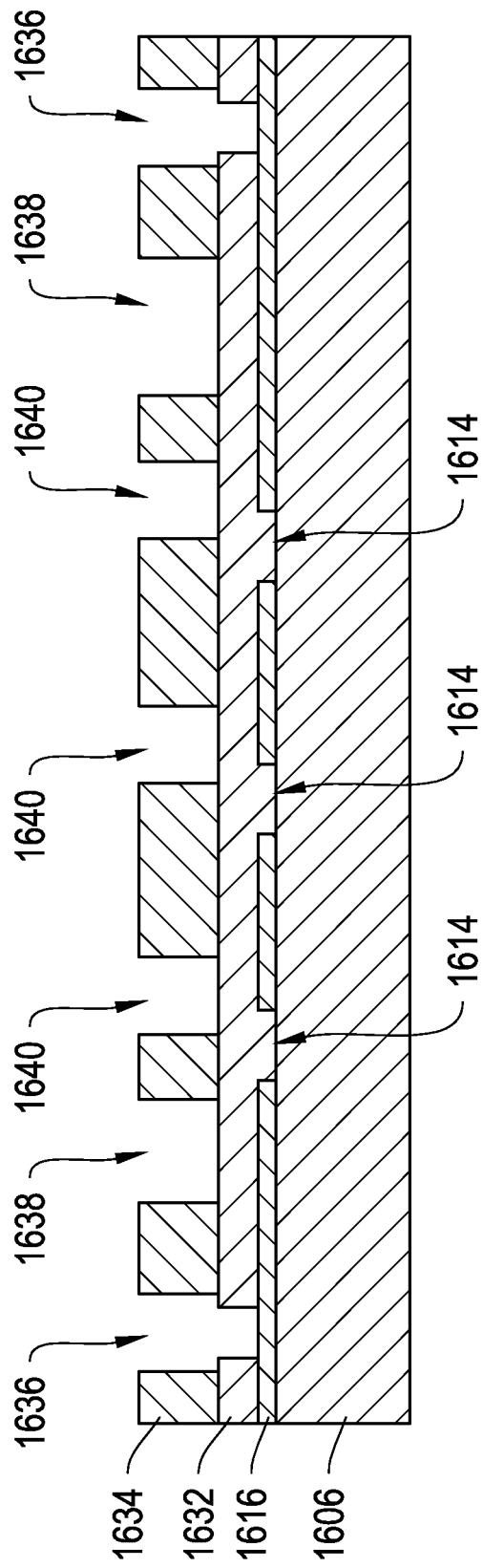
FIGS. 16B-16F show cross-sectional views of example stages of the fabrication of the shutter assembly shown in FIG. 16A.

Referring to FIGS. 16B-16F, the fabrication of the shutter assembly 1600 begins in a similar fashion to the fabrication of the other shutter assemblies discussed above. As shown in FIG. 16B, first and second layers of sacrificial material 1632 and 1634 are deposited and patterned, in sequence, on a patterned light blocking layer 1616. The light blocking layer 1616, in contrast to the light blocking layers 818, 1018, and 1318, shown in FIGS. 8, 10, and 12, defines multiple apertures 1614 for a given shutter assembly 1600. The first and second layers of sacrificial material 1632 and 1634 can be formed using any of the sacrificial materials described above, and may be deposited to similar thicknesses. The first and second layers of sacrificial material 1632 and 1634 are then patterned to form recesses 1636 that serve as molds for the shutter assembly anchors 1622, recesses 1638 that serve as molds for the shutter assembly actuator beams 1608 and 1610, and recesses 1640 that serve as molds for protrusions incorporated into the shutter 1604 of the shutter assembly 1600.

Figure 16C:
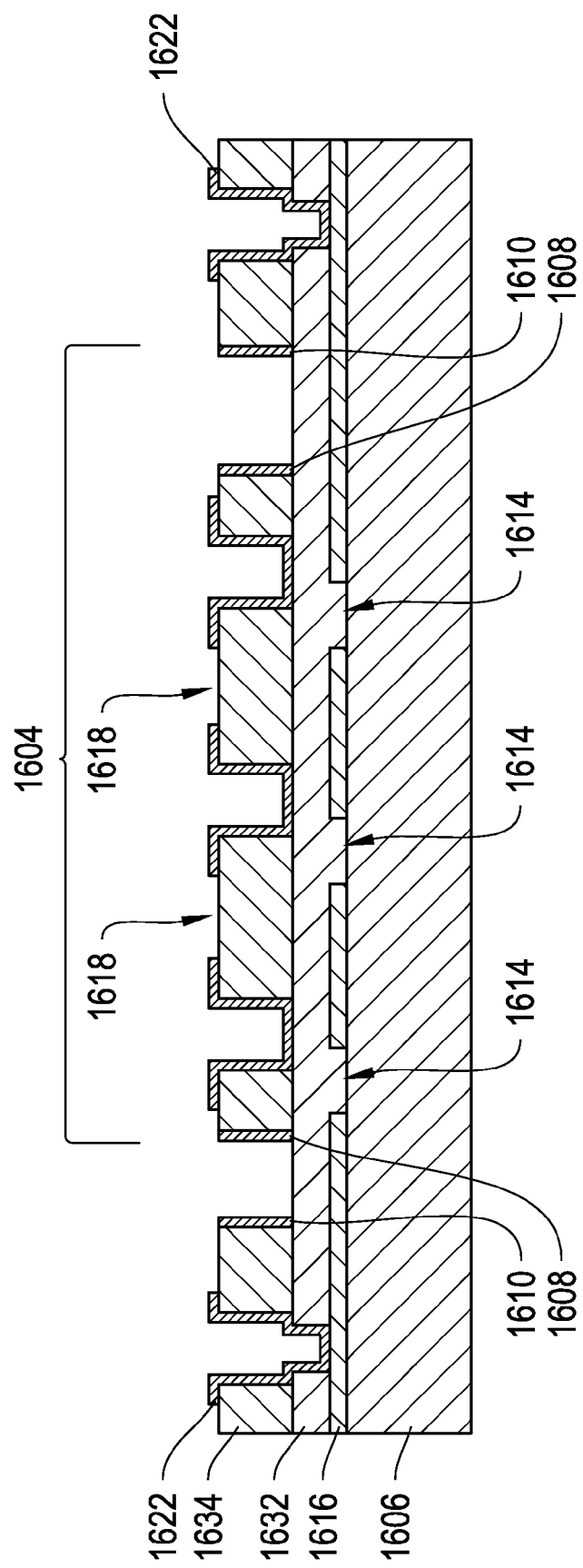

A layer of structural material is then deposited on top of the patterned first and second layers of sacrificial material 1632 and 1634. The layer of structural material can be formed from one or more of any of the materials set forth above for use as a structural material in the above-described shutter assemblies. The layer of structural material 1636 is patterned (as shown in FIG. 16C) using an anisotropic etch process to define the anchors 1622, actuator beams 1608 and 1610, the outer boundaries of the shutter 1604, and the shutter apertures 1618. In some implementations, one or more additional isotropic etches may be used in addition to the anisotropic etch to remove any undesired structural material on the sidewalls of the recesses 1638 used to form the actuator beams.

Figure 16D:
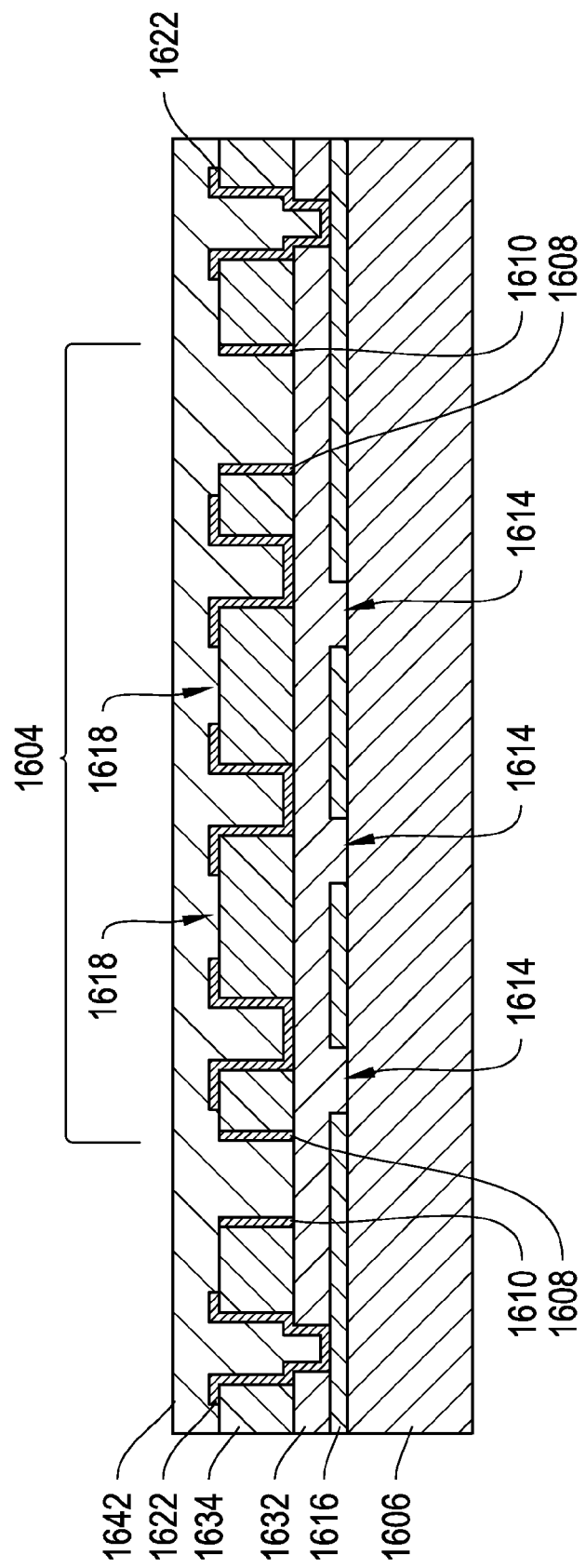
Figure 16E:
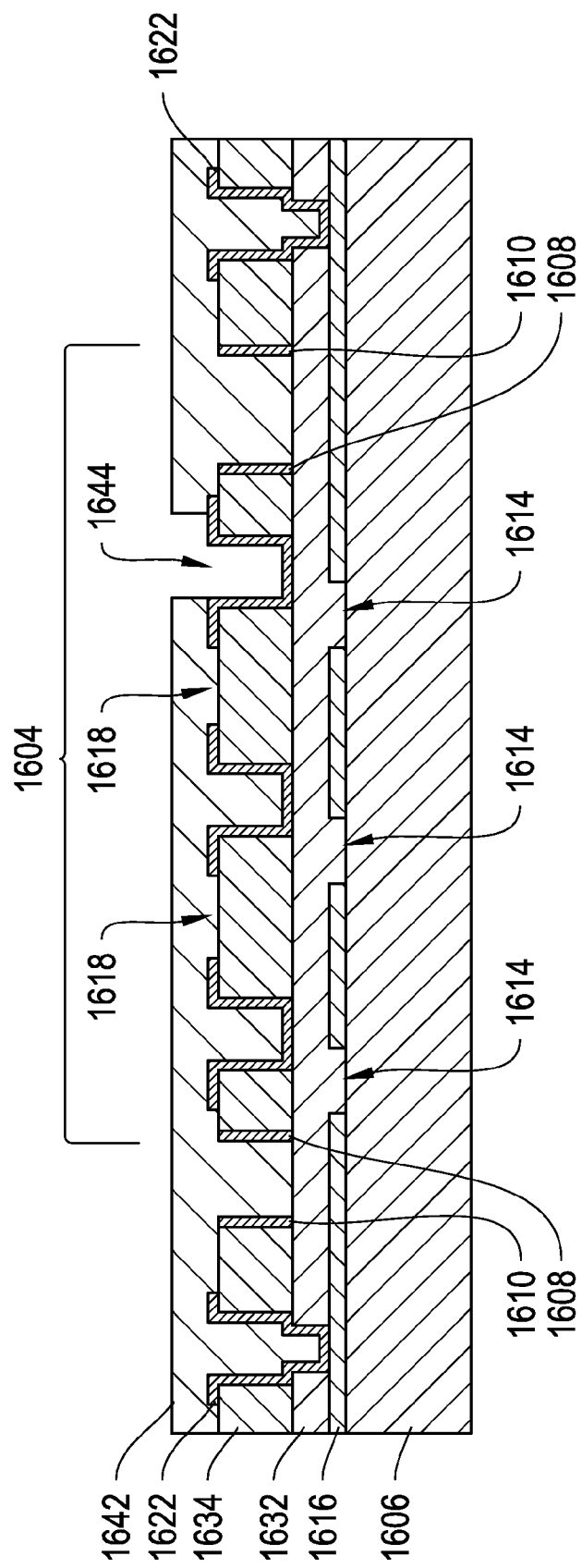
Figure 16F:
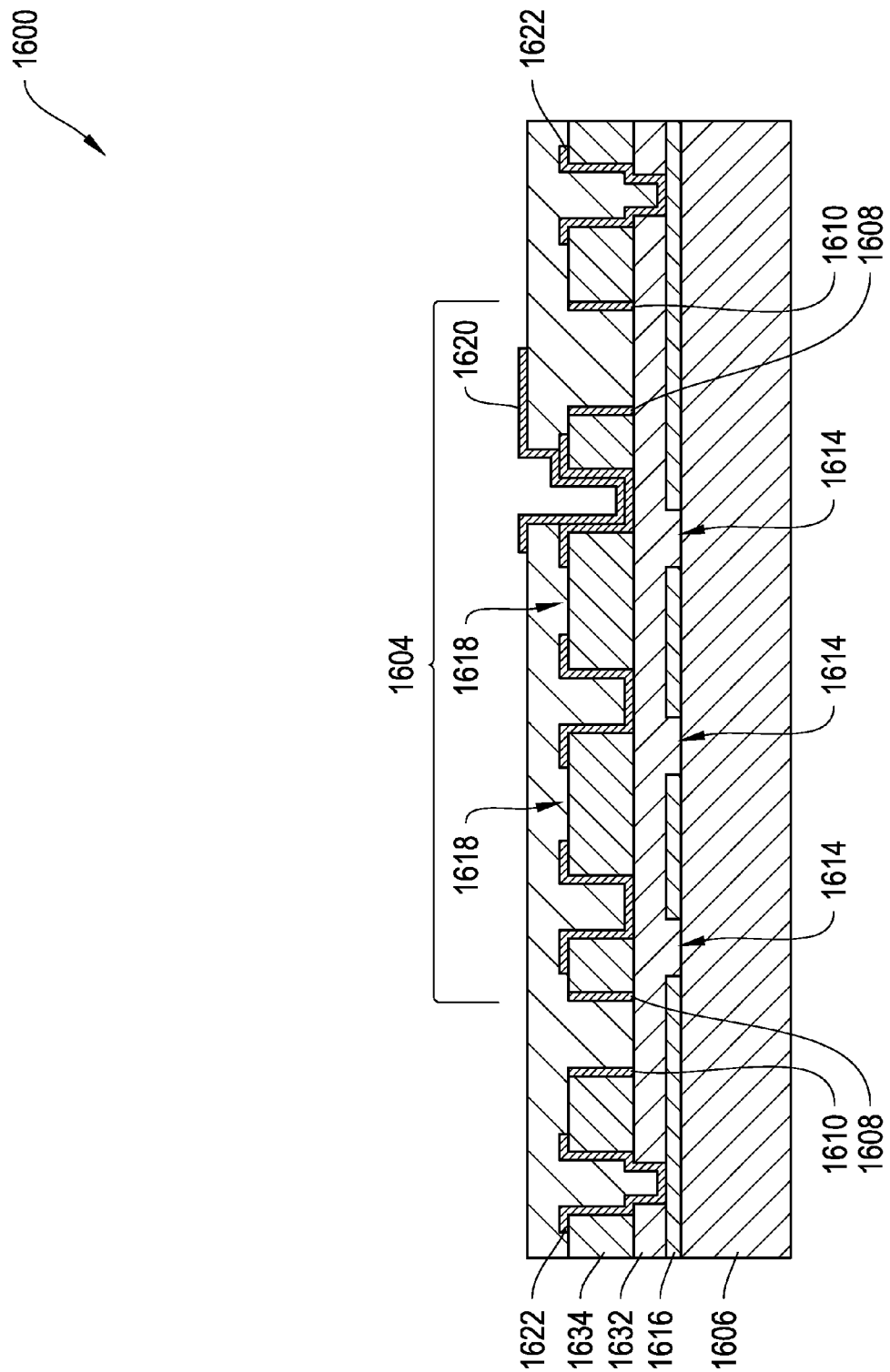

Subsequently, a third layer of sacrificial material 1642 is deposited on top of the structure shown in FIG. 16C, resulting in the structure shown in FIG. 16D. This third layer of sacrificial material 1642 can be formed from any of the materials set forth above as being suitable for use as a sacrificial material. In some implementations, the third layer of sacrificial material 1642 is deposited to a thickness of about 2 to about 4 microns. The third layer of sacrificial material 1642 is then patterned to form a recess 1644 (shown in FIG. 16E), which will serve as a mold for the upper light blocking layer 1620. A second layer of structural material is then deposited and patterned to form the upper light blocking layer 1620 of the final structure of the shutter assembly 1600, shown in FIG. 16F. The second layer of structural material can be formed from the same material as the first structural material, or any other compatible material set forth above as being suitable for a shutter assembly structural material. Finally, a release process can proceed to remove the three layers of sacrificial material 1632, 1634, and 1642 to yield the final structure of the shutter assembly 1600 shown in FIG. 16A.

Figure 17A:
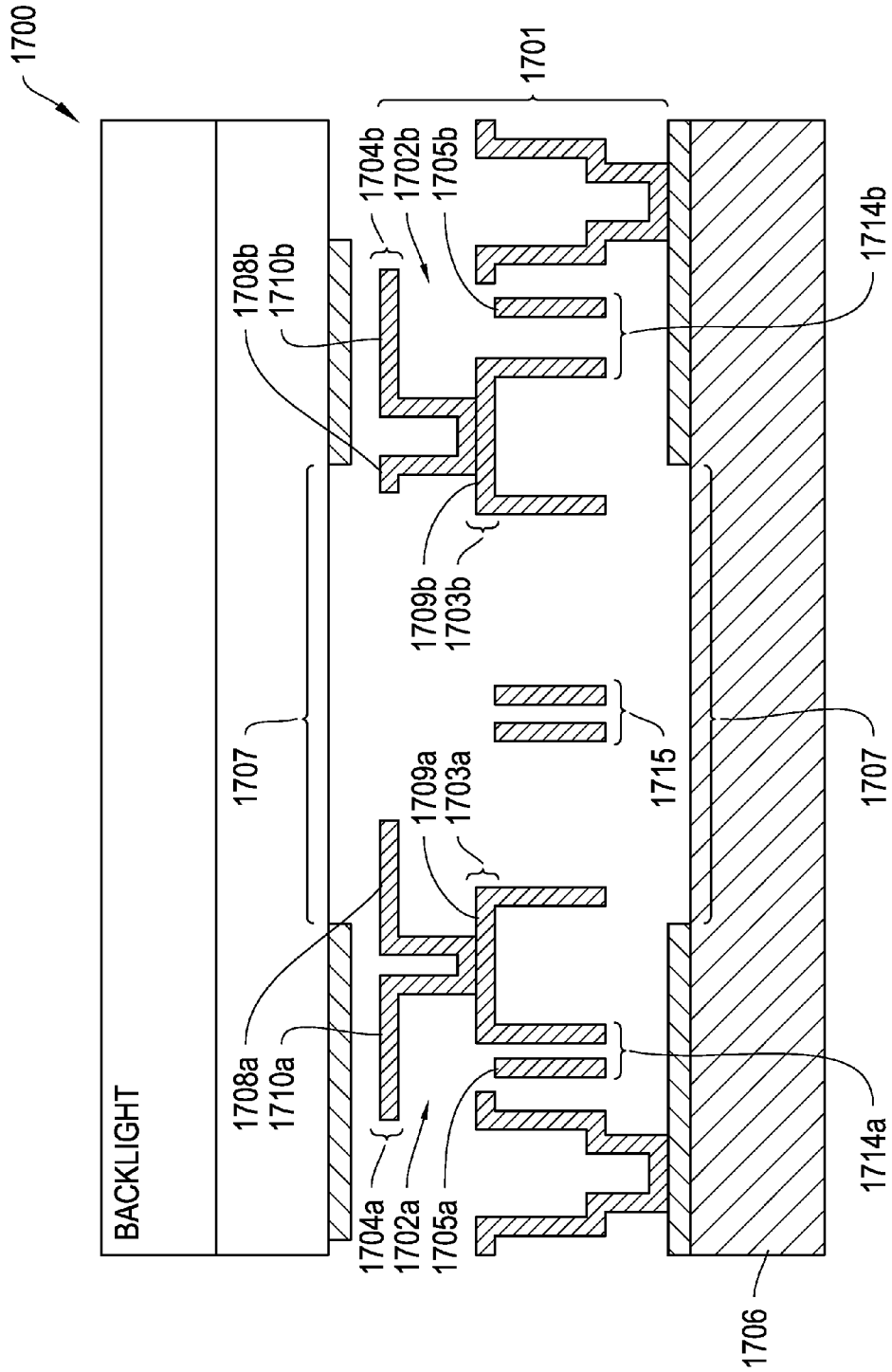
FIGS. 17A and 17B show cross sectional views of an example display apparatus including another example shutter assembly.
Figure 17B:
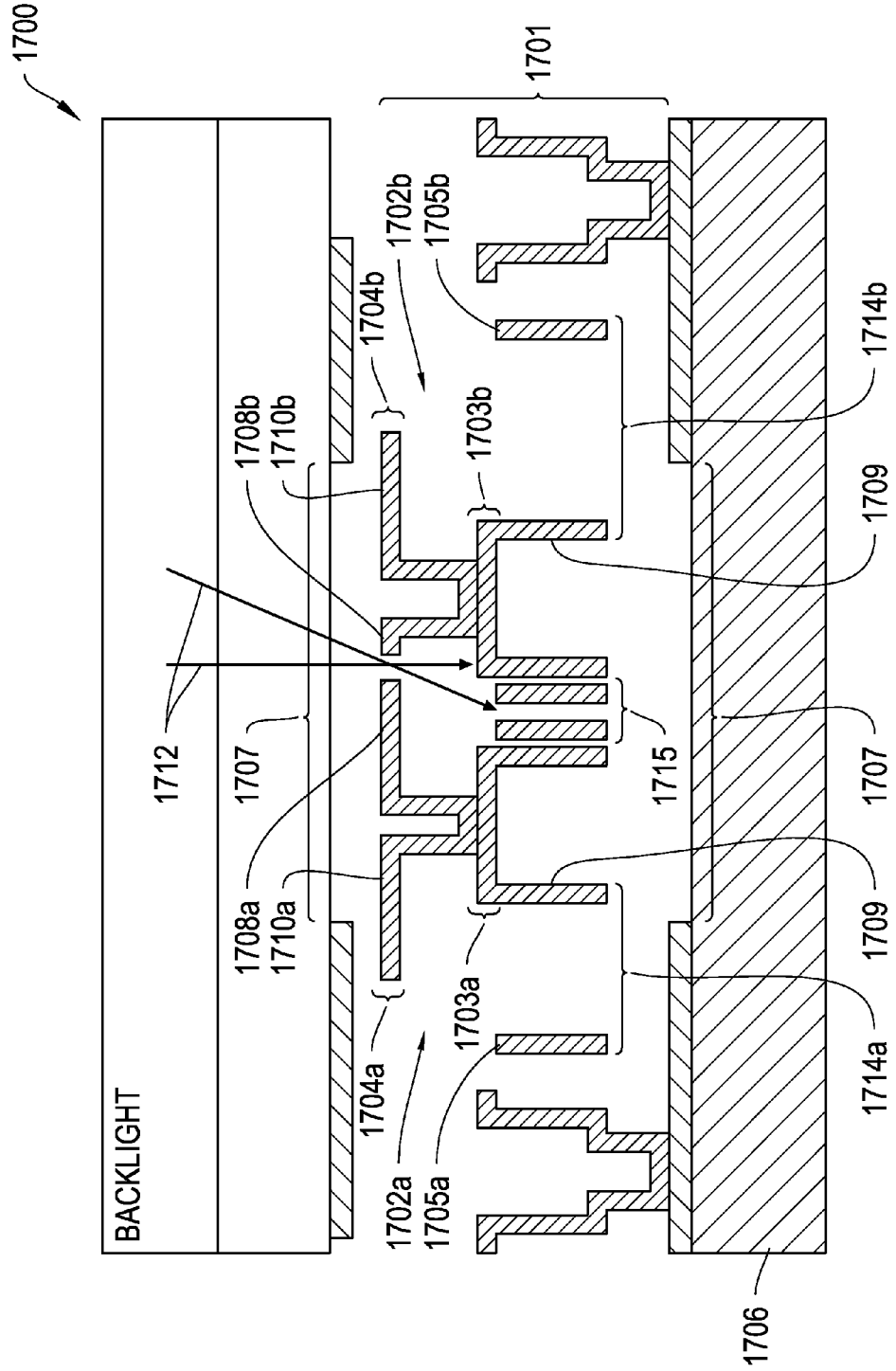

FIGS. 17A and 17B show cross-sectional views of portions of a example display apparatus 1700 including another example shutter assembly 1701. FIG. 17A shows the shutter assembly 1701 in an open, light-transmitting state. FIG. 17B shows the shutter assembly 1701 in a closed, light blocking state. In contrast to the shutter assemblies 800, 1000, 1200, 1400, 1500, and 1600 shown in FIGS. 8A-8D, 10A-10D, and 12A-12C, 14A, 15A, and 16A, respectively, the shutter assembly 1701 includes two shutters 1702a and 1702b. Each shutter 1702a and 1702b, however, like the shutters 802, 1006, and 1206, 1404, 1504, and 1604 of the shutter assemblies 800, 1000, 1200, 1400, 1500, and 1600, includes two light blocking levels, i.e., proximal levels 1703a and 1703b and distal levels 1704a and 1704b, respectively, that are substantially parallel to a substrate 1706 on which the shutter assembly 1701 is fabricated. The proximal levels 1703a and 1703b are spaced closer to the substrate 1706 than the distal levels 1704a and 1704b.

The distal levels 1704a and 1704b of the shutters 1702a and 1702b include inner light blocking portions 1708a and 1708b and outer light blocking portions 1710a and 1710b, respectively. The inner light blocking portion 1708a of the shutter 1702a is longer than the inner light blocking portion 1708b of the shutter 1702b. The inner light blocking portion 1708a of shutter 1702a is sufficiently long that it extends beyond the edge of the proximal level 1703a of the shutter 1702a that is closest to the shutter 1702b. In the closed state, i.e., when the shutters 1702a and 1702b obstruct an optical path through a pair of apertures 1707 (one located above the shutters 1702a and 1702b, and one located beneath the shutters 1702a and 1702b), the inner light blocking portion 1708a of shutter 1702a extends over the proximal level 1703b of the shutter 1702b. The inner light blocking portion 1708b of the shutter 1702b does not extend beyond the edge of the proximal layer 1703b of the shutter 1702b. In the closed state, the innermost edge of the inner light blocking portion 1708b of the shutter 1702b is immediately adjacent to, or in some implementations in contact with, the inner light blocking portion 1708a of the shutter 1702a.

As shown in FIG. 17B, in the closed state, this configuration of inner light blocking portions 1708a and 1708b makes it very difficult, if not impossible for light 1712 to pass between the two shutters 1702a and 1702b, even without the shutters 1702a and 1702b coming into contact.

The outer light blocking portions 1710a and 1710b of both shutters 1702a and 1702b are sufficiently long that they extend over portions of actuators 1714a and 1714b that pull the shutters into the open state shown in FIG. 17A.

Similar to the shutter assembly 1202, each shutter 1702a and 1702b is driven by a set of drive beams 1705a and 1705b which are opposed directly by sidewalls 1709a and 1709b of the respective shutters 1702a and 1702b. The sidewalls 1709a and 1709b of the shutters 1702a and 1702b serve as load electrodes of electrostatic actuators 1714a and 1714b. In operation, when an actuation voltage is applied to a given set of drive beams 1705a and/or 1705b, a potential difference is generated between the set of drive beams 1705a and/or 1705b and the sidewall 1709a and/or 1709b of the corresponding shutter 1702a or 1702b, drawing the sidewall 1707a and/or 1707b, and therefore the entire shutter 1702a or 1702b, towards the set of drive beams 1705a and/or 1705b.

In some implementations, center beams 1715 extend across the gap between the shutters 1702a and 1702b. In some of these implementations, these center beams 1715 serve merely as mechanical stops to prevent the shutters 1702a and 1702b from coming into contact with one another. In other implementations, the center beams 1715 serve as additional drive beams to assist in pulling the shutters 1702a and 1702b into the closed position. In such implementations, when closing the shutters 1702a and 1702b, a voltage is applied to the center beams 1715, creating a potential difference between the shutters 1702a and 1702b and the center beams 1715.

In some implementations the shutters 1702a and 1702b can be controlled independently to provide additional shutter states, beyond just open and closed. For example, in some implementations, depending on the data sent to the shutter assembly 1701, either one of the shutters 1702a or 1702b can be drawn closed, while the other is retained in an open position. As the lengths of the inner light blocking portions 1708a and 1708b are of different lengths, this type of independent shutter control can lead to four different shutter states, reducing the number of subframes needed to generate an image with a given number of possible gray scale values.

In some other implementations, the shutter assembly 1701 can be built without drive beams 1705. Instead, the shutters 1702a and 1702b are configured to selectively attract one another. For example, in some implementations, the shutter 1702a is maintained at a first low voltage, such as ground. The second shutter 1702b is switched between the first low voltage and a high voltage depending on the image data transmitted to the shutter assembly. If a high voltage is applied to the second shutter 1702b, a potential difference between the first and second shutters 1702a and 1702b draws them together over the aperture 1707. When the potential difference is removed, the beams supporting the respective shutters 1702a and 1702b, which deform when the shutters 1702a and 1702b are drawn together, draw the shutters 1702a and 1702b apart again such that they can return to their original, unstressed states.

The display apparatus 1700, as shown in FIGS. 17A and 17B, is fabricated in a MEMS-up configuration, as described in relation to FIG. 5. In some other implementations, the display apparatus 1700 can be fabricated in a MEMS-down configuration.

FIGS. 18A-18I show cross sectional views of example stages of fabrication of the shutter assembly 1701 shown in FIGS. 17A and 17B. The shutter assembly 1701 can be fabricated using similar processes and materials as used to form the shutter assemblies 800, 1000, 1200, 1400, 1500, and 1600 shown in FIGS. 8A-8D, 10A-10D, and 12A-12C, 14A, 15A, and 16A respectively.

Figure 18F:
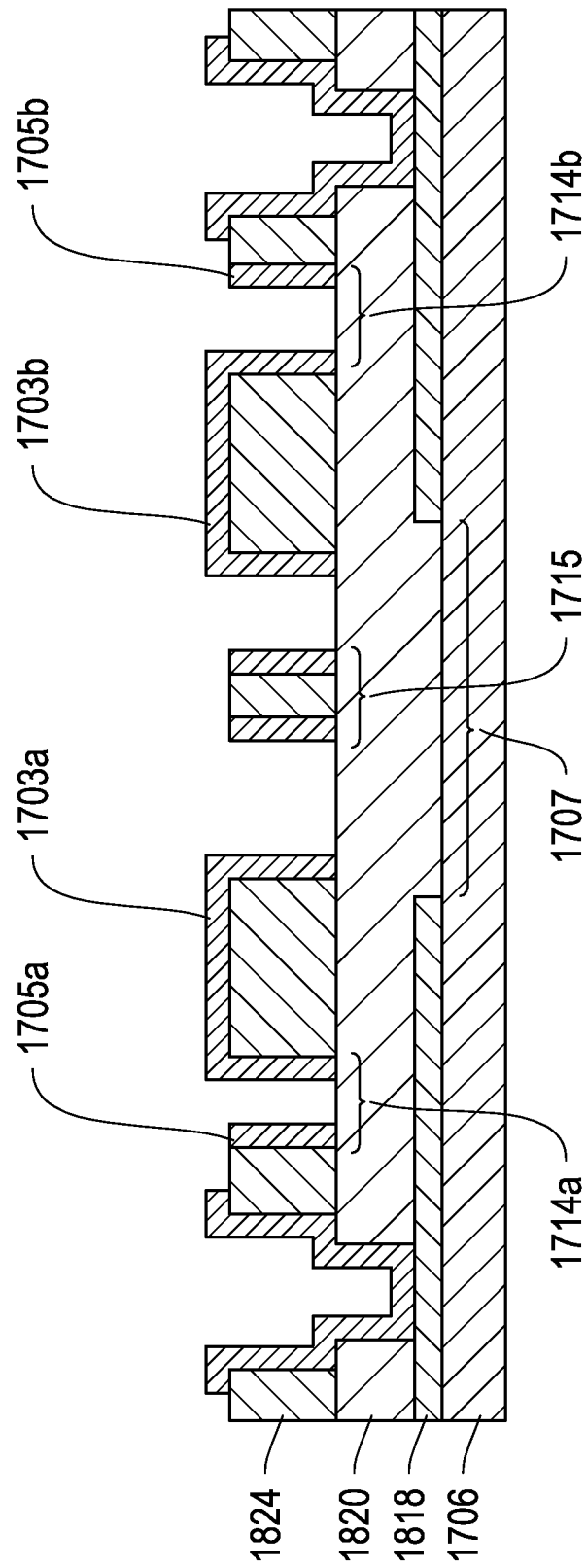
Figure 18G:
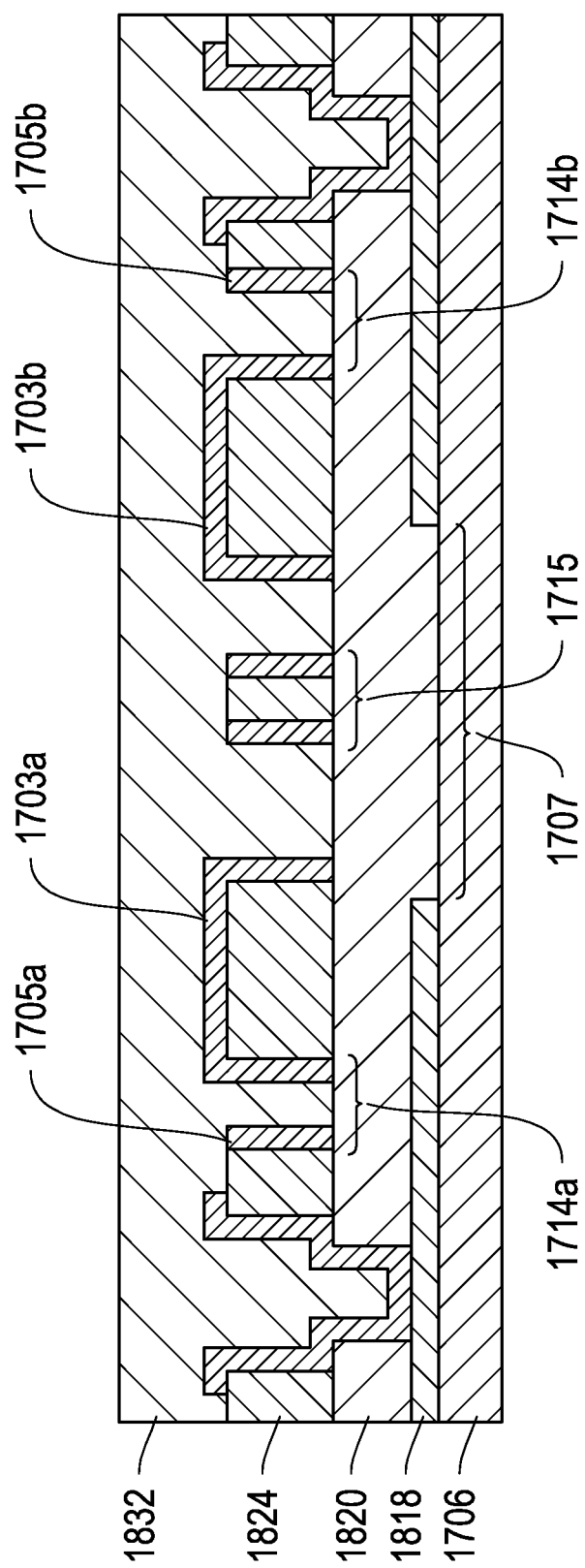

Referring to FIGS. 17A and 17B and 18A-18F, FIG. 18A shows an initial stage of fabrication of the shutter assembly 1700. Specifically, FIG. 18A shows a first layer of sacrificial material 1820 deposited on a patterned light blocking layer 1818 formed on the substrate 1706. The light blocking layer 1818 has been patterned to form an aperture 1707. The first layer of sacrificial material 1820 is then patterned to form recesses 1822a and 1822b, in which lower portions of anchors 1709a and 1709b will later be formed. The resulting structure is shown in FIG. 18B.

Subsequently, a second layer of sacrificial material 1824 is deposited on top of the structure shown in FIG. 18B, as shown in FIG. 18C. The second layer of sacrificial material 1824 is then patterned to form the structure shown in FIG. 18D. More particularly, the second layer of sacrificial material 1824 is patterned to open up recesses 1825 to create molds for the upper and lower portions of the anchors 1709a and 1709b. Additional recesses 1826, 1827, 1828, and 1829 are formed to create molds for the actuator beams and shutters 1702a and 1702b.

A first layer of structural material 1830 is then deposited on top of the structure shown in FIG. 18D, yielding the structure shown in FIG. 18E. The first layer of structural material 1830 can include one or more layers of any of the materials identified for use in the first layer of structural material 932, described in relation to FIG. 9F. An etch is then applied to yield the structure shown in FIG. 18F. The etch process yielding the structure shown in 18F can be a two-phase etch process, including an anisotropic etch to remove undesired structural material on the exposed horizontal surfaces of the structure shown in FIG. 18F, followed by a isotropic etch to remove undesired structural material on the vertical sidewalls of the structure. In some other implementations, the etch process can be completed using a single anisotropic etch. The structure shown in FIG. 18F includes the proximal levels 1703a and 1703b of the shutters 1702a and 1702b, as well as the actuators 1714a and 1714b.

Figure 18H:
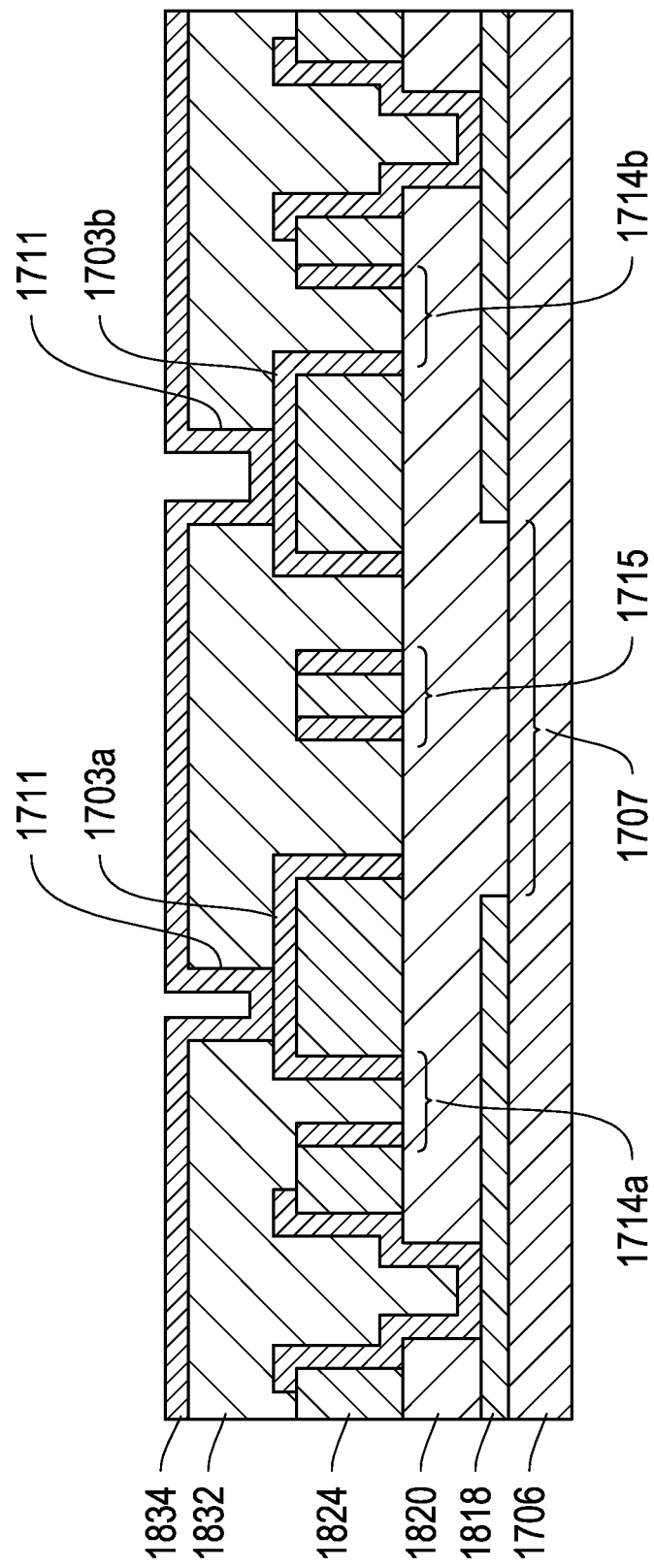
Figure 18I:
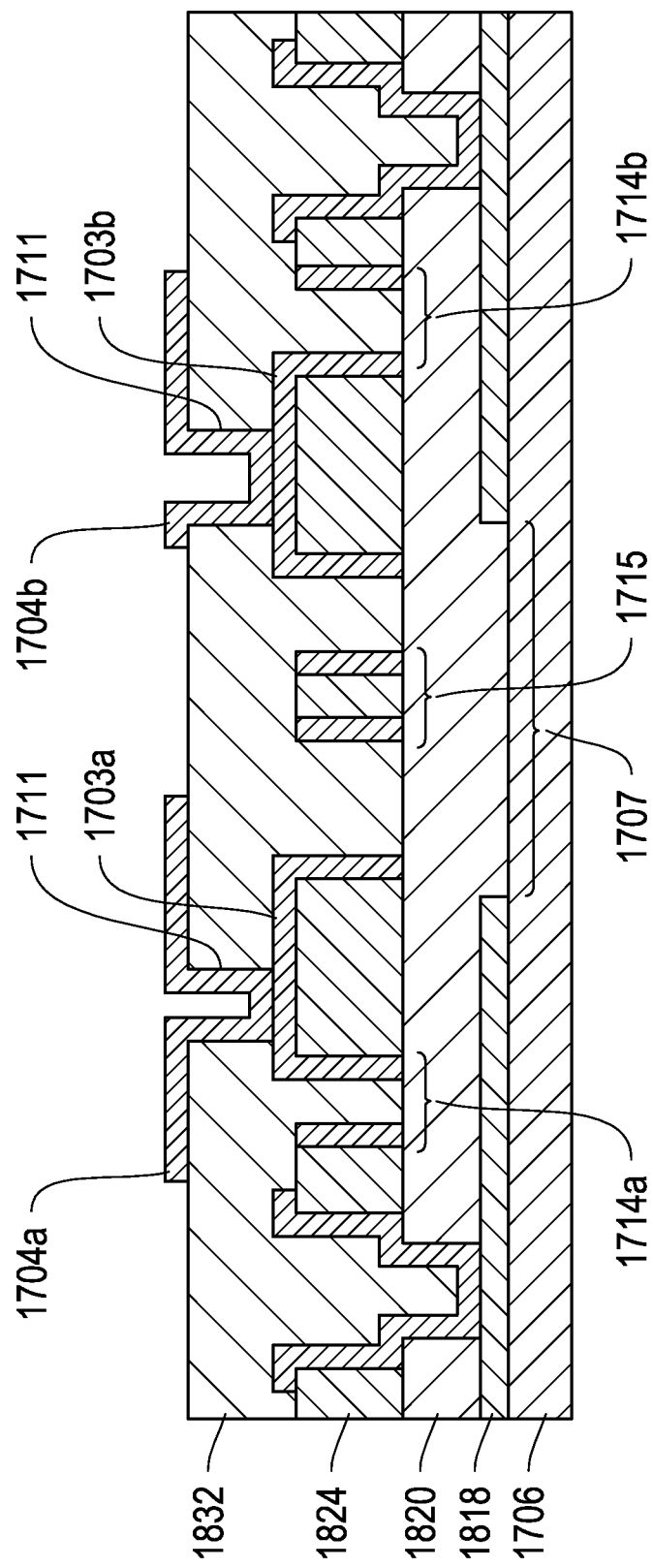

Subsequently, a third layer of sacrificial material 1832 is deposited on top of the remainder of the first layer of structural material 1830 and the first and second layers of sacrificial material 1820 and 1824. This yields the structure shown in FIG. 18G. This structure is then patterned to create a mold for the side walls 1711 that will connect the proximal levels 1703a and 1703b of the shutters 1702a and 1702b to the distal levels 1704a and 1704b of the shutters 1702a and 1702b. A second layer of structural material 1834 is deposited on top, as shown in FIG. 18H. The second layer of structural material 1834 is then patterned to form the distal levels 1704a and 1704b of the shutters 1702a and 1702b and the side walls 1711 that connect the distal levels 1704a and 1704b to the proximal levels 1703a and 1703b of the shutters 1702a and 1702b, as shown in FIG. 18I. In some implementations, this patterning process can be carried out using a single anistropic etch. A release agent is applied, removing the remainder of the first, second, and third layers of sacrificial material 1820, 1824, and 1832, yielding the shutter assembly 1700, as shown in FIGS. 17A and 17B.

Figure 19:
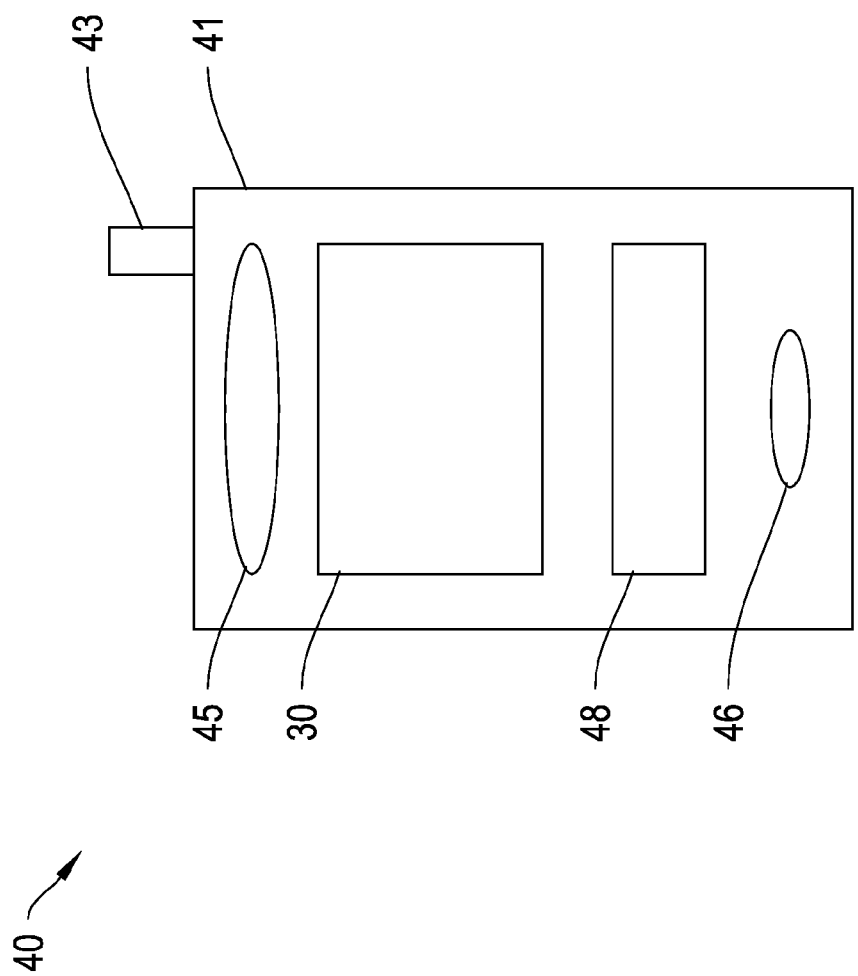
FIGS. 19 and 20 show system block diagrams of an example display device that includes a set of display elements.
Figure 20:
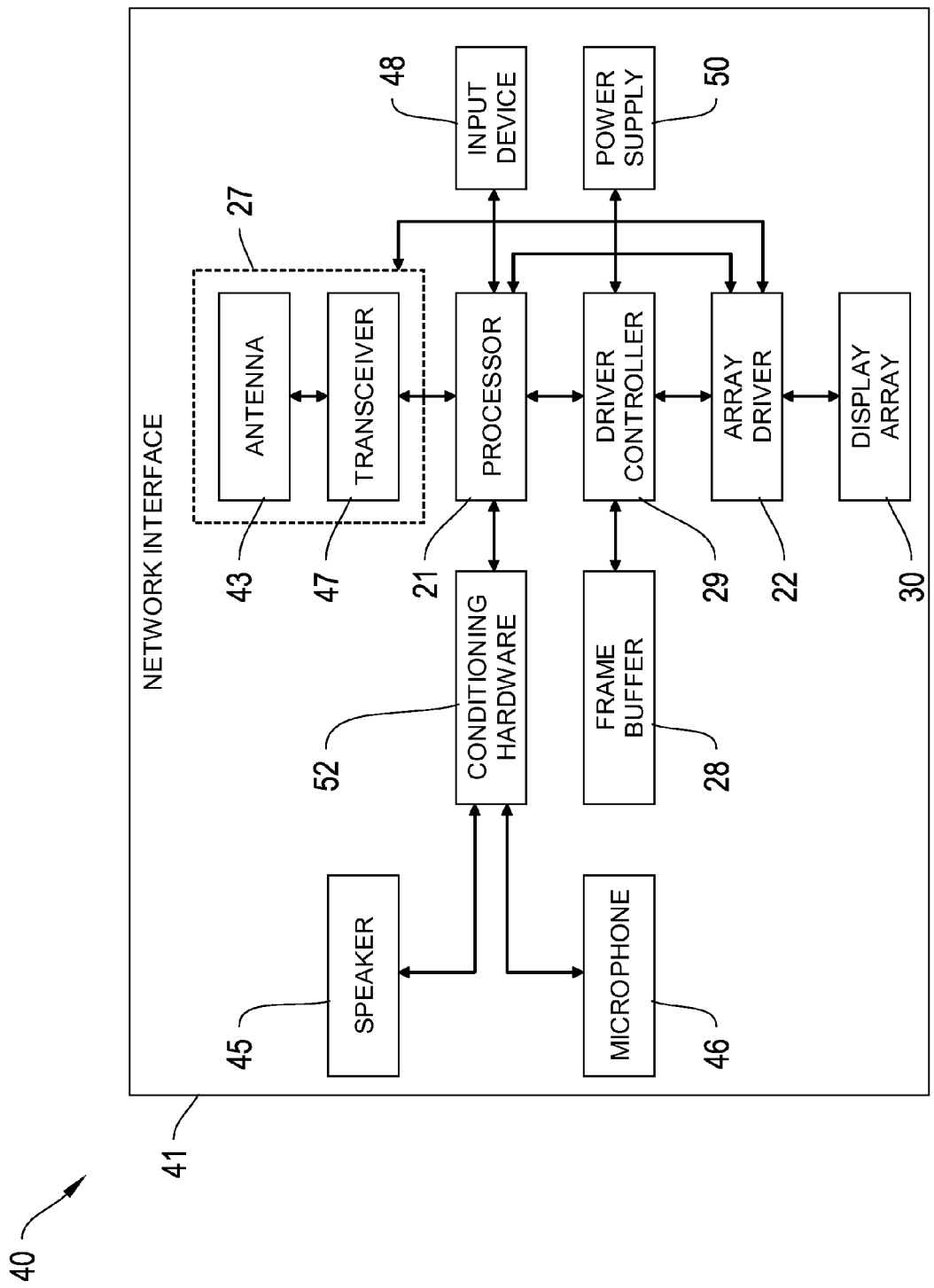

FIGS. 19 and 20 show system block diagrams of an example display device 40 that includes a set of display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, electroluminescent (EL) displays, OLED, super twisted nematic (STN) displays, LCD, or thin film transistors (TFT) LCD, or a non-flat-panel display, such as a cathode ray tube (CRT) or other tube device. In addition, the display 30 can include a mechanical light modulator-based display as described herein.

The components of the display device 40 are schematically illustrated in FIG. 19. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 19, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller. Additionally, the array driver 22 can be a conventional driver or a bi-stable display driver. Moreover, the display array 30 can be a conventional display array or a bi-stable display array. In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of any device as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus, comprising:
   a first light obstructing component configured to be moved with respect to an aperture to selectively obstruct passage of light through the aperture; and
   a second light obstructing component configured to be moved with respect to the same aperture as the first light blocking component to selectively obstruct the passage of light through the aperture;
   a first electrostatic actuator configured to selectively move the first light blocking component into a first open position; and
   a second electrostatic actuator configured to selectively move the second light blocking component into a second open position,
   wherein:
   when both the first and second light obstructing components are in a closed position, the first and second light obstructing components together block substantially all of the light passing through the aperture, and a first portion of the first light obstructing component extends over a first portion of the second light blocking component and substantially abuts a second portion of the second light blocking component, and wherein the first and second light blocking components include light blocking portions that extend over at least parts of their respective electrostatic actuators when the first and second light blocking components are in their respective open positions.

2. The apparatus of claim 1, further comprising a third actuator positioned between the first and second light blocking components configured to selectively move at least one of the first and second light blocking components into the closed position.

3. The apparatus of claim 1, wherein portions of the first and second light blocking components form opposing electrodes of a third actuator, such that when a potential difference is applied across the first and second light blocking components, the first and second light blocking components are drawn together into the closed position.

4. The apparatus of claim 1, wherein the first and second actuators are configured to operate independently of one another.

5. The apparatus of claim 1, wherein each of the first and second light blocking components includes a proximal light blocking level and a distal light blocking level.

6. The apparatus of claim 5, wherein the portion of the first light blocking component that extends over the first portion of the second light blocking component is a portion of the distal light blocking level of the first light blocking component, the first portion of the second light blocking component is a portion of the proximal light blocking level of the second light blocking component, and the second portion of the second light blocking component is a portion of the distal light blocking level of the second light blocking component.

7. The apparatus of claim 1, further comprising:
   a display including the EMS display element;
   a processor that is configured to communicate with the display, the processor being configured to process image data; and
   a memory device that is configured to communicate with the processor.

8. The apparatus of claim 7, further comprising:
   a driver circuit configured to send at least one signal to the display; and wherein
   the processor is further configured to send at least a portion of the image data to the driver circuit.

9. The apparatus of claim 7, further comprising:
   an image source module configured to send the image data to the processor, wherein the image source module comprises at least one of a receiver, transceiver, and transmitter.

10. The apparatus of claim 7, further comprising:
    an input device configured to receive input data and to communicate the input data to the processor.

* * * * *